US007659589B2

(12) United States Patent
Benjamin et al.

(10) Patent No.: US 7,659,589 B2
(45) Date of Patent: Feb. 9, 2010

(54) DEVICE WITH GATES CONFIGURED IN LOOP STRUCTURES

(75) Inventors: Trudy L. Benjamin, Portland, OR (US); James P Axtell, Portland, OR (US); Joseph M Torgerson, Philomath, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 28 days.

(21) Appl. No.: 11/840,574

(22) Filed: Aug. 17, 2007

(65) Prior Publication Data

US 2007/0290269 A1 Dec. 20, 2007

Related U.S. Application Data

(62) Division of application No. 10/827,045, filed on Apr. 19, 2004, now Pat. No. 7,278,715.

(51) Int. Cl.
*H01L 27/088* (2006.01)

(52) U.S. Cl. .................... 257/401; 257/E27.06; 347/59

(58) Field of Classification Search ................. 257/368, 257/401, E29.12, E28.128, E29.135, E29.136; 347/20, 57, 59
See application file for complete search history.

(56) References Cited

U.S. PATENT DOCUMENTS

| | | | | |
|---|---|---|---|---|
| 4,240,093 | A * | 12/1980 | Dingwall | 257/373 |
| 5,057,885 | A | 10/1991 | Matsumoto et al. | |
| 6,174,037 | B1 | 1/2001 | Donahue et al. | |
| 2002/0093551 | A1 | 7/2002 | Axtell et al. | |
| 2002/0130371 | A1 | 9/2002 | Bryant et al. | |
| 2003/0103106 | A1 | 6/2003 | Silverbrook | |

* cited by examiner

*Primary Examiner*—Minh-Loan T Tran
*Assistant Examiner*—Vongsavanh Sengdara

(57) ABSTRACT

A device includes a substrate, a first gate, a second gate, and a third gate. The substrate has a first active region and a second active region. The first gate is configured in a first loop structure around the first active region. The second gate is configured in a second loop structure around the second active region, and the third gate is configured in a third loop structure around the first gate and the second gate.

7 Claims, 16 Drawing Sheets

DEVICE WITH GATES CONFIGURED IN LOOP STRUCTURES

CROSS-REFERENCE TO RELATED APPLICATIONS

This patent application is a divisional of application Ser. No. 10/827,045, filed on Apr. 19, 2004 now U.S. Pat. No. 7,278,715, which is herein incorporated by reference.

BACKGROUND

An inkjet printing system, as one embodiment of a fluid ejection system, may include a printhead, an ink supply that supplies liquid ink to the printhead, and an electronic controller that controls the printhead. The printhead, as one embodiment of a fluid ejection device, ejects ink drops through a plurality of orifices or nozzles. The ink is projected toward a print medium, such as a sheet of paper, to print an image onto the print medium. The nozzles are typically arranged in one or more arrays, such that properly sequenced ejection of ink from the nozzles causes characters or other images to be printed on the print medium as the printhead and the print medium are moved relative to each other.

In a typical thermal inkjet printing system, the printhead ejects ink drops through nozzles by rapidly heating small volumes of ink located in vaporization chambers. The ink is heated with small electric heaters, such as thin film resistors referred to herein as firing resistors. Heating the ink causes the ink to vaporize and be ejected through the nozzles.

To eject one drop of ink, the electronic controller that controls the printhead activates an electrical current from a power supply external to the printhead. The electrical current is passed through a selected firing resistor to heat the ink in a corresponding selected vaporization chamber and eject the ink through a corresponding nozzle. Known drop generators include a firing resistor, a corresponding vaporization chamber, and a corresponding nozzle.

A fluid ejection system is one embodiment of a microelectromechanical system (MEMS) device or semiconductor device. Typically, the size of a MEMS device is determined by the mechanical requirements of the device. Any cost associated with integrating and accommodating electronic circuitry in a MEMS device is transferred to the final cost of the device. It is important to have a low cost process that can integrate increased functionality into a MEMS device. In a process for integrating electronic circuitry into a MEMS device, layout techniques are needed that reduce device sizes and achieve increased functionality.

For these and other reasons, there is a need for the present invention.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
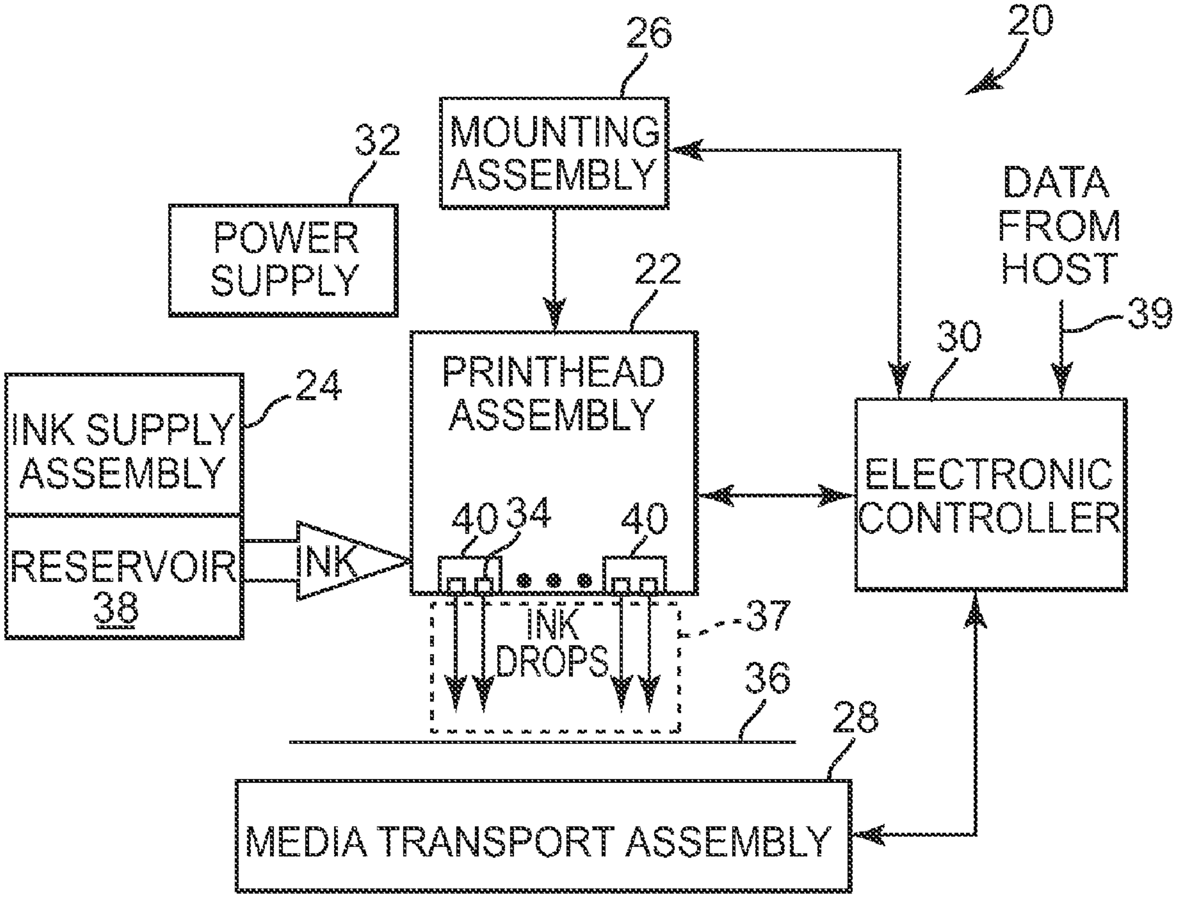
FIG. 1 illustrates one embodiment of an ink jet printing system.

FIG. 1 illustrates one embodiment of an inkjet printing system 20. Inkjet printing system 20 constitutes one embodiment of a fluid ejection system that includes a fluid ejection device, such as inkjet printhead assembly 22, and a fluid supply assembly, such as ink supply assembly 24. The inkjet printing system 20 also includes a mounting assembly 26, a media transport assembly 28, and an electronic controller 30. At least one power supply 32 provides power to the various electrical components of inkjet printing system 20.

In one embodiment, inkjet printhead assembly 22 includes at least one printhead or printhead die 40 that ejects drops of ink through a plurality of orifices or nozzles 34 toward a print medium 36 so as to print onto print medium 36. Printhead 40 is one embodiment of a fluid ejection device. Print medium 36 may be any type of suitable sheet material, such as paper, card stock, transparencies, Mylar, fabric, and the like. Typically, nozzles 34 are arranged in one or more columns or arrays such that properly sequenced ejection of ink from nozzles 34 causes characters, symbols, and/or other graphics or images to be printed upon print medium 36 as inkjet printhead assembly 22 and print medium 36 are moved relative to each other. While the following description refers to the ejection of ink from printhead assembly 22, it is understood that other liquids, fluids or flowable materials, including clear fluid, may be ejected from printhead assembly 22.

Ink supply assembly 24 as one embodiment of a fluid supply assembly provides ink to printhead assembly 22 and includes a reservoir 38 for storing ink. As such, ink flows from reservoir 38 to inkjet printhead assembly 22. Ink supply assembly 24 and inkjet printhead assembly 22 can form either a one-way ink delivery system or a recirculating ink delivery system. In a one-way ink delivery system, substantially all of the ink provided to inkjet printhead assembly 22 is consumed during printing. In a recirculating ink delivery system, only a portion of the ink provided to printhead assembly 22 is consumed during printing. As such, ink not consumed during printing is returned to ink supply assembly 24.

In one embodiment, inkjet printhead assembly 22 and ink supply assembly 24 are housed together in an inkjet cartridge or pen. The inkjet cartridge or pen is one embodiment of a fluid ejection device. In another embodiment, ink supply assembly 24 is separate from inkjet printhead assembly 22 and provides ink to inkjet printhead assembly 22 through an interface connection, such as a supply tube (not shown). In either embodiment, reservoir 38 of ink supply assembly 24 may be removed, replaced, and/or refilled. In one embodiment, where inkjet printhead assembly 22 and ink supply assembly 24 are housed together in an inkjet cartridge, reservoir 38 includes a local reservoir located within the cartridge and may also include a larger reservoir located separately from the cartridge. As such, the separate, larger reservoir serves to refill the local reservoir. Accordingly, the separate, larger reservoir and/or the local reservoir may be removed, replaced, and/or refilled.

Mounting assembly 26 positions inkjet printhead assembly 22 relative to media transport assembly 28 and media transport assembly 28 positions print medium 36 relative to inkjet printhead assembly 22. Thus, a print zone 37 is defined adjacent to nozzles 34 in an area between inkjet printhead assembly 22 and print medium 36. In one embodiment, inkjet printhead assembly 22 is a scanning type printhead assembly. As such, mounting assembly 26 includes a carriage (not shown) for moving inkjet printhead assembly 22 relative to media transport assembly 28 to scan print medium 36. In another embodiment, inkjet printhead assembly 22 is a non-scanning type printhead assembly. As such, mounting assembly 26 fixes inkjet printhead assembly 22 at a prescribed position relative to media transport assembly 28. Thus, media transport assembly 28 positions print medium 36 relative to inkjet printhead assembly 22.

Electronic controller or printer controller 30 typically includes a processor, firmware, and other electronics, or any combination thereof, for communicating with and controlling inkjet printhead assembly 22, mounting assembly 26, and media transport assembly 28. Electronic controller 30 receives data 39 from a host system, such as a computer, and usually includes memory for temporarily storing data 39. Typically, data 39 is sent to inkjet printing system 20 along an electronic, infrared, optical, or other information transfer path. Data 39 represents, for example, a document and/or file to be printed. As such, data 39 forms a print job for inkjet printing system 20 and includes one or more print job commands and/or command parameters.

In one embodiment, electronic controller 30 controls inkjet printhead assembly 22 for ejection of ink drops from nozzles 34. As such, electronic controller 30 defines a pattern of ejected ink drops that form characters, symbols, and/or other graphics or images on print medium 36. The pattern of ejected ink drops is determined by the print job commands and/or command parameters.

In one embodiment, inkjet printhead assembly 22 includes one printhead 40. In another embodiment, inkjet printhead assembly 22 is a wide-array or multi-head printhead assembly. In one wide-array embodiment, inkjet printhead assembly 22 includes a carrier, which carries printhead dies 40, provides electrical communication between printhead dies 40 and electronic controller 30, and provides fluidic communication between printhead dies 40 and ink supply assembly 24.

Figure 2:
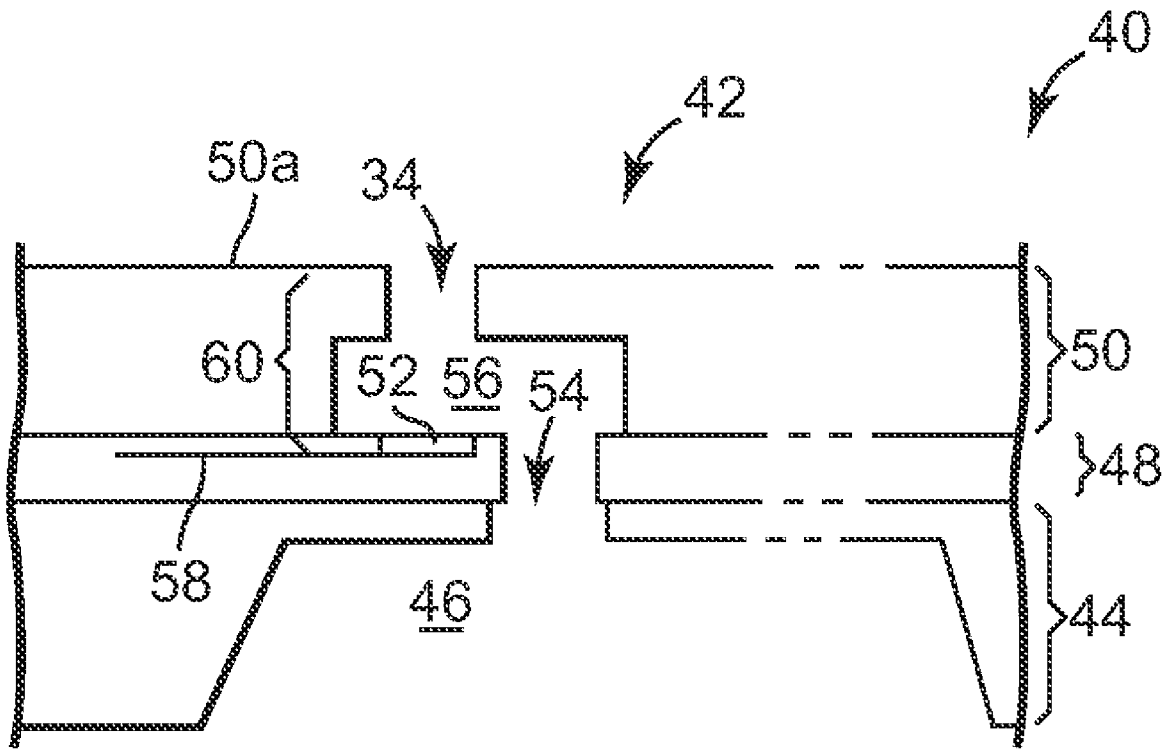
FIG. 2 is a diagram illustrating a portion of one embodiment of a die.

FIG. 2 is a diagram illustrating a portion of one embodiment of a printhead die 40. The printhead die 40 includes an array of printing or fluid ejecting elements 42. Printing elements 42 are formed on a substrate 44, which has an ink feed slot 46 formed therein. As such, ink feed slot 46 provides a supply of liquid ink to printing elements 42. Ink feed slot 46 is one embodiment of a fluid feed source. Other embodiments of fluid feed sources include but are not limited to corresponding individual ink feed holes feeding corresponding vaporization chambers and multiple shorter ink feed trenches that each feed corresponding groups of fluid ejecting elements. A thin-film structure 48 has an ink feed channel 54 formed therein which communicates with ink feed slot 46 formed in substrate 44. An orifice layer 50 has a front face 50*a* and a nozzle opening 34 formed in front face 50*a*. Orifice layer 50 also has a nozzle chamber or vaporization chamber 56 formed therein which communicates with nozzle opening 34 and ink feed channel 54 of thin-film structure 48. A firing resistor 52 is positioned within vaporization chamber 56 and leads 58 electrically couple firing resistor 52 to circuitry controlling the application of electrical current through selected firing resistors. A drop generator 60 as referred to herein includes firing resistor 52, nozzle chamber or vaporization chamber 56 and nozzle opening 34.

During printing, ink flows from ink feed slot 46 to vaporization chamber 56 via ink feed channel 54. Nozzle opening 34 is operatively associated with firing resistor 52 such that droplets of ink within vaporization chamber 56 are ejected through nozzle opening 34 (e.g., substantially normal to the plane of firing resistor 52) and toward print medium 36 upon energizing of firing resistor 52.

Example embodiments of printhead dies 40 include a thermal printhead, a piezoelectric printhead, an electrostatic printhead, or any other type of fluid ejection device known in the art that can be integrated into a multi-layer structure. Substrate 44 is formed, for example, of silicon, glass, ceramic, or a stable polymer and thin-film structure 48 is formed to include one or more passivation or insulation layers of silicon dioxide, silicon carbide, silicon nitride, tantalum, polysilicon glass, or other suitable material. Thin-film structure 48, also, includes at least one conductive layer, which defines firing resistor 52 and leads 58. In one embodiment, the conductive layer comprises, for example, aluminum, gold, tantalum, tantalum-aluminum, or other metal or metal alloy. In one embodiment, firing cell circuitry, such as described in detail below, is implemented in substrate and thin-film layers, such as substrate 44 and thin-film structure 48.

In one embodiment, orifice layer 50 comprises a photoimageable epoxy resin, for example, an epoxy referred to as SU8, marketed by Micro-Chem, Newton, Mass. Exemplary techniques for fabricating orifice layer 50 with SU8 or other polymers are described in detail in U.S. Pat. No. 6,162,589, which is herein incorporated by reference. In one embodiment, orifice layer 50 is formed of two separate layers referred to as a barrier layer (e.g., a dry film photo resist barrier layer) and a metal orifice layer (e.g., a nickel, copper, iron/nickel alloys, palladium, gold, or rhodium layer) formed over the barrier layer. Other suitable materials, however, can be employed to form orifice layer 50.

Figure 3:
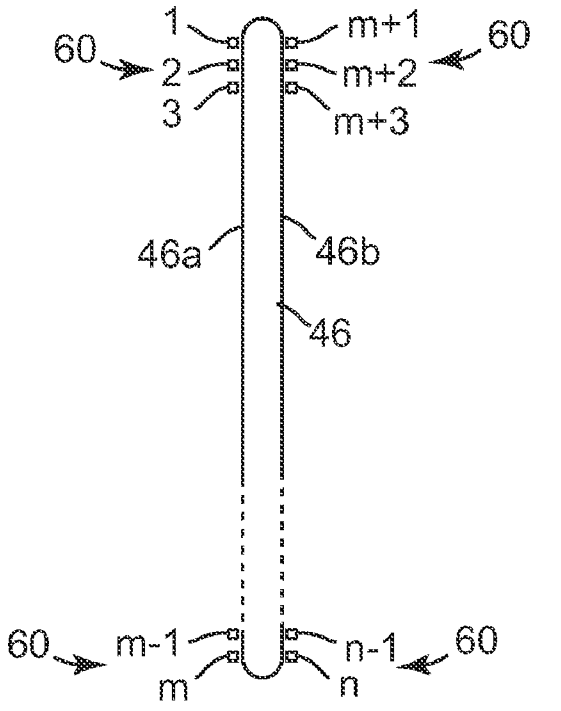
FIG. 3 is a diagram illustrating a layout of drop generators located along an ink feed slot in one embodiment of a die.

FIG. 3 is a diagram illustrating drop generators 60 located along ink feed slot 46 in one embodiment of printhead die 40. Ink feed slot 46 includes opposing ink feed slot sides 46*a* and 46*b*. Drop generators 60 are disposed along each of the opposing ink feed slot sides 46*a* and 46*b*. A total of n drop generators 60 are located along ink feed slot 46, with m drop generators 60 located along ink feed slot side 46*a* , and n-m drop generators 60 located along ink feed slot side 46*b*. In one embodiment, n equals 200 drop generators 60 located along ink feed slot 46 and m equals 100 drop generators 60 located along each of the opposing ink feed slot sides 46*a* and 46*b*. In other embodiments, any suitable number of drop generators 60 can be disposed along ink feed slot 46.

Ink feed slot 46 provides ink to each of the n drop generators 60 disposed along ink feed slot 46. Each of the n drop generators 60 includes a firing resistor 52, a vaporization chamber 56 and a nozzle 34. Each of the n vaporization chambers 56 is fluidically coupled to ink feed slot 46 through at least one ink feed channel 54. The firing resistors 52 of drop generators 60 are energized in a controlled sequence to eject fluid from vaporization chambers 56 and through nozzles 34 to print an image on print medium 36.

Figure 4:
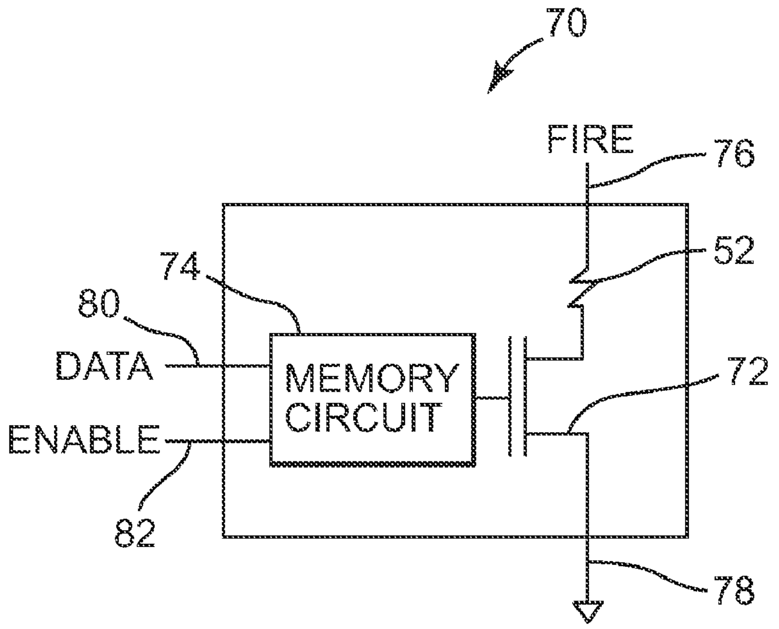
FIG. 4 is a diagram illustrating one embodiment of a firing cell employed in one embodiment of a die.

FIG. 4 is a diagram illustrating one embodiment of a firing cell 70 employed in one embodiment of printhead die 40. Firing cell 70 includes a firing resistor 52, a resistor drive switch 72, and a memory circuit 74. Firing resistor 52 is part of a drop generator 60. Drive switch 72 and memory circuit 74 are part of the circuitry that controls the application of electrical current through firing resistor 52. Firing cell 70 is formed in thin-film structure 48 and on substrate 44.

In one embodiment, firing resistor 52 is a thin-film resistor and drive switch 72 is a field effect transistor (FET). Firing resistor 52 is electrically coupled to a fire line 76 and the drain-source path of drive switch 72. The drain-source path of drive switch 72 is also electrically coupled to a reference line 78 that is coupled to a reference voltage, such as ground. The gate of drive switch 72 is electrically coupled to memory circuit 74 that controls the state of drive switch 72.

Memory circuit 74 is electrically coupled to a data line 80 and enable lines 82. Data line 80 receives a data signal that represents part of an image and enable lines 82 receive enable signals to control operation of memory circuit 74. Memory circuit 74 stores one bit of data as it is enabled by the enable signals. The logic level of the stored data bit sets the state (e.g., on or off, conducting or non-conducting) of drive switch 72. The enable signals can include one or more select signals and one or more address signals.

Fire line 76 receives an energy signal comprising energy pulses and provides an energy pulse to firing resistor 52. In one embodiment, the energy pulses are provided by electronic controller 30 to have timed starting times and timed duration to provide a proper amount of energy to heat and vaporize fluid in the vaporization chamber 56 of a drop generator 60. If drive switch 72 is on (conducting), the energy pulse heats firing resistor 52 to heat and eject fluid from drop generator 60. If drive switch 72 is off (non-conducting), the energy pulse does not heat firing resistor 52 and the fluid remains in drop generator 60.

Figure 5:
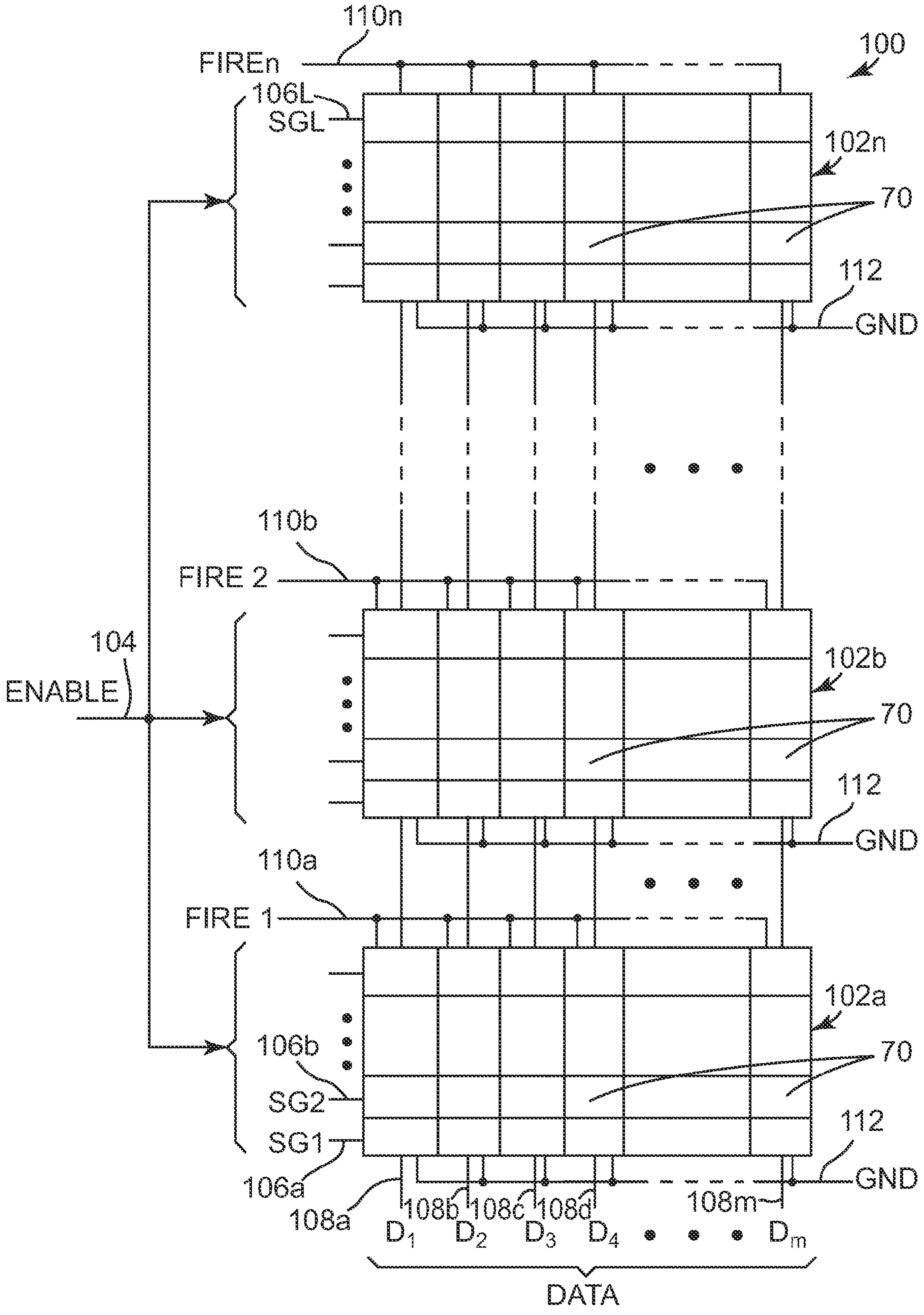
FIG. 5 is a schematic diagram illustrating one embodiment of an ink jet printhead firing cell array.

FIG. 5 is a schematic diagram illustrating one embodiment of an inkjet printhead firing cell array, indicated at 100. Firing cell array 100 includes a plurality of firing cells 70 arranged into n fire groups 102*a*-102*n*. In one embodiment, firing cells 70 are arranged into six fire groups 102*a*-102*n*. In other embodiments, firing cells 70 can be arranged into any suitable number of fire groups 102*a*-102*n*, such as four or more fire groups 102*a*-102*n*.

The firing cells 70 in array 100 are schematically arranged into L rows and m columns. The L rows of firing cells 70 are electrically coupled to enable lines 104 that receive enable signals. Each row of firing cells 70, referred to herein as a row subgroup or subgroup of firing cells 70, is electrically coupled to one set of subgroup enable lines 106*a*-106L. The subgroup enable lines 106*a*-106L receive subgroup enable signals SG1, SG2, . . . $SG_L$ that enable the corresponding subgroup of firing cells 70.

The m columns are electrically coupled to m data lines 108*a*-108*m* that receive data signals D1, D2 . . . Dm, respectively. Each of the m columns includes firing cells 70 in each of the n fire groups 102*a*-102*n* and each column of firing cells 70, referred to herein as a data line group or data group, is electrically coupled to one of the data lines 108*a*-108*m*. In other words, each of the data lines 108*a*-108*m* is electrically coupled to each of the firing cells 70 in one column, including firing cells 70 in each of the fire groups 102*a*-102*n*. For example, data line 108*a* is electrically coupled to each of the firing cells 70 in the far left column, including firing cells 70 in each of the fire groups 102*a*-102*n*. Data line 108*b* is electrically coupled to each of the firing cells 70 in the adjacent column and so on, over to and including data line 108*m* that is electrically coupled to each of the firing cells 70 in the far right column, including firing cells 70 in each of the fire groups 102*a*-102*n*.

In one embodiment, array 100 is arranged into six fire groups 102*a*-102*n* and each of the six fire groups 102*a*-102*n* includes 13 subgroups and eight data line groups. In other embodiments, array 100 can be arranged into any suitable number of fire groups 102*a*-102*n* and into any suitable number of subgroups and data line groups. In any embodiment, fire groups 102*a*-102*n* are not limited to having the same number of subgroups and data line groups. Instead, each of the fire groups 102*a*-102*n* can have a different number of subgroups and/or data line groups as compared to any other fire group 102*a*-102*n*. In addition, each subgroup can have a different number of firing cells 70 as compared to any other subgroup, and each data line group can have a different number of firing cells 70 as compared to any other data line group.

The firing cells 70 in each of the fire groups 102*a*-102*n* are electrically coupled to one of the fire lines 110*a*-110*n*. In fire group 102*a*, each of the firing cells 70 is electrically coupled to fire line 110*a* that receives fire signal or energy signal FIRE1. In fire group 102*b*, each of the firing cells 70 is electrically coupled to fire line 110*b* that receives fire signal or energy signal FIRE2 and so on, up to and including fire group 102*n* wherein each of the firing cells 70 is electrically coupled to fire line 110*n* that receives fire signal or energy signal FIREn. In addition, each of the firing cells 70 in each of the fire groups 102*a*-102*n* is electrically coupled to a common reference line 112 that is tied to ground.

In operation, subgroup enable signals SG1, SG2, . . . $SG_L$ are provided on subgroup enable lines 106*a*-106L to enable one subgroup of firing cells 70. The enabled firing cells 70 store data signals D1, D2 . . . Dm provided on data lines 108*a*-108*m*. The data signals D1, D2 . . . Dm are stored in memory circuits 74 of enabled firing cells 70. Each of the stored data signals D1, D2 . . . Dm sets the state of drive switch 72 in one of the enabled firing cells 70. The drive switch 72 is set to conduct or not conduct based on the stored data signal value.

After the states of the selected drive switches 72 are set, an energy signal FIRE1-FIREn is provided on the fire line 110*a*-

110*n* corresponding to the fire group 102*a*-102*n* that includes the selected subgroup of firing cells 70. The energy signal FIRE1-FIREn includes an energy pulse. The energy pulse is provided on the selected fire line 110*a*-110*n* to energize firing resistors 52 in firing cells 70 that have conducting drive switches 72. The energized firing resistors 52 heat and eject ink onto print medium 36 to print an image represented by data signals D1, D2 . . . Dm. The process of enabling a subgroup of firing cells 70, storing data signals D1, D2 . . . Dm in the enabled subgroup and providing an energy signal FIRE1-FIREn to energize firing resistors 52 in the enabled subgroup continues until printing stops.

In one embodiment, as an energy signal FIRE1-FIREn is provided to a selected fire group 102*a*-102*n*, subgroup enable signals SG1, SG2, . . . $SG_L$ change to select and enable another subgroup in a different fire group 102*a*-102*n*. The newly enabled subgroup stores data signals D1, D2 . . . Dm provided on data lines 108*a*-108*m* and an energy signal FIRE1-FIREn is provided on one of the fire lines 110*a*-110*n* to energize firing resistors 52 in the newly enabled firing cells 70. At any one time, only one subgroup of firing cells 70 is enabled by subgroup enable signals SG1, SG2, . . . $SG_L$ to store data signals D1, D2 . . . Dm provided on data lines 108*a*-108*m*. In this aspect, data signals D1, D2 . . . Dm on data lines 108*a*-108*m* are timed division multiplexed data signals. Also, only one subgroup in a selected fire group 102*a*-102*n* includes drive switches 72 that are set to conduct while an energy signal FIRE1-FIREn is provided to the selected fire group 102*a*-102*n*. However, energy signals FIRE1-FIREn provided to different fire groups 102*a*-102*n* can and do overlap.

Figure 6:
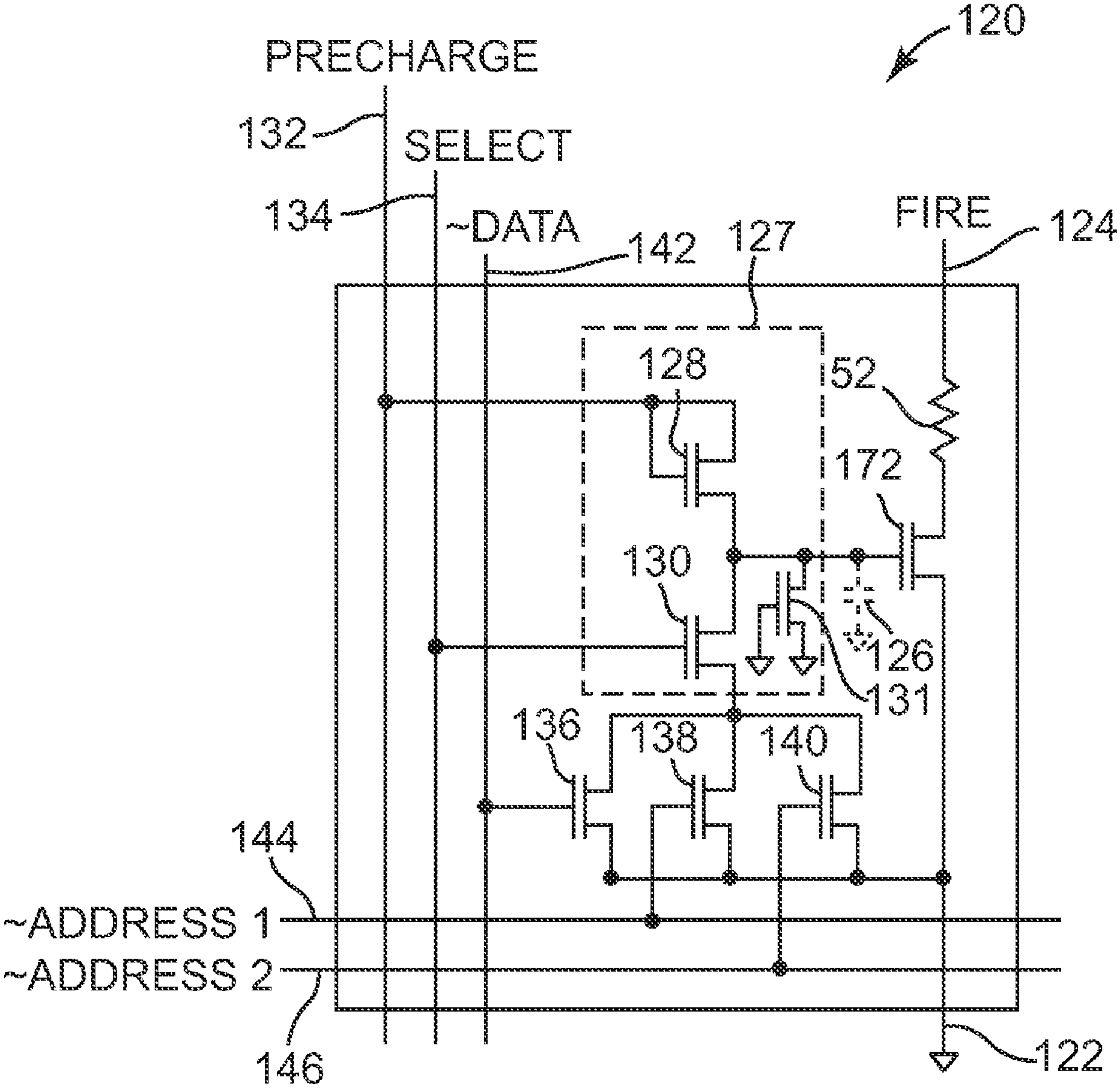
FIG. 6 is a schematic diagram illustrating one embodiment of a pre-charged firing cell.

FIG. 6 is a schematic diagram illustrating one embodiment of a pre-charged firing cell 120. Pre-charged firing cell 120 is one embodiment of firing cell 70. The pre-charged firing cell 120 includes a drive switch 172 electrically coupled to a firing resistor 52. In one embodiment, drive switch 172 is a FET including a drain-source path electrically coupled at one end to one terminal of firing resistor 52 and at the other end to a reference line 122. The reference line 122 is tied to a reference voltage, such as ground. The other terminal of firing resistor 52 is electrically coupled to a fire line 124 that receives a fire signal or energy signal FIRE including energy pulses. The energy pulses energize firing resistor 52 if drive switch 172 is on (conducting).

The gate of drive switch 172 forms a storage node capacitance 126 that functions as a memory element to store data pursuant to the sequential activation of a pre-charge transistor 128 and a select transistor 130. The drain-source path and gate of pre-charge transistor 128 are electrically coupled to a pre-charge line 132 that receives a pre-charge signal. The gate of drive switch 172 is electrically coupled to the drain-source path of pre-charge transistor 128 and the drain-source path of select transistor 130. The gate of select transistor 130 is electrically coupled to a select line 134 that receives a select signal. The storage node capacitance 126 is shown in dashed lines, as it is part of drive switch 172. Alternatively, a capacitor separate from drive switch 172 can be used as a memory element.

A data transistor 136, a first address transistor 138 and a second address transistor 140 include drain-source paths that are electrically coupled in parallel. The parallel combination of data transistor 136, first address transistor 138 and second address transistor 140 is electrically coupled between the drain-source path of select transistor 130 and reference line 122. The serial circuit including select transistor 130 coupled to the parallel combination of data transistor 136, first address transistor 138 and second address transistor 140 is electrically coupled across node capacitance 126 of drive switch 172. The gate of data transistor 136 is electrically coupled to data line 142 that receives data signals ~DATA. The gate of first address transistor 138 is electrically coupled to an address line 144 that receives address signals ~ADDRESS1 and the gate of second address transistor 140 is electrically coupled to a second address line 146 that receives address signals ~ADDRESS2. The data signals ~DATA and address signals ~ADDRESS1 and ~ADDRESS2 are active when low as indicated by the tilda (~) at the beginning of the signal name. The node capacitance 126, pre-charge transistor 128, select transistor 130, data transistor 136 and address transistors 138 and 140 form a memory cell.

In operation, node capacitance 126 is pre-charged through pre-charge transistor 128 by providing a high level voltage pulse on pre-charge line 132. In one embodiment, after the high level voltage pulse on pre-charge line 132, a data signal ~DATA is provided on data line 142 to set the state of data transistor 136 and address signals ~ADDRESS1 and ~ADDRESS2 are provided on address lines 144 and 146 to set the states of first address transistor 138 and second address transistor 140. A voltage pulse of sufficient magnitude is provided on select line 134 to turn on select transistor 130 and node capacitance 126 discharges if data transistor 136, first address transistor 138 and/or second address transistor 140 is on. Alternatively, node capacitance 126 remains charged if data transistor 136, first address transistor 138 and second address transistor 140 are all off.

Pre-charged firing cell 120 is an addressed firing cell if both address signals ~ADDRESS1 and ~ADDRESS2 are low and node capacitance 126 either discharges if data signal ~DATA is high or remains charged if data signal ~DATA is low. Pre-charged firing cell 120 is not an addressed firing cell if at least one of the address signals ~ADDRESS1 and ~ADDRESS2 is high and node capacitance 126 discharges regardless of the data signal ~DATA voltage level. The first and second address transistors 136 and 138 comprise an address decoder, and data transistor 136 controls the voltage level on node capacitance 126 if pre-charged firing cell 120 is addressed.

Pre-charged firing cell 120 may utilize any number of other topologies or arrangements, as long as the operational relationships described above are maintained. For example, an OR gate may be coupled to address lines 144 and 146, the output of which is coupled to a single transistor.

Figure 7:
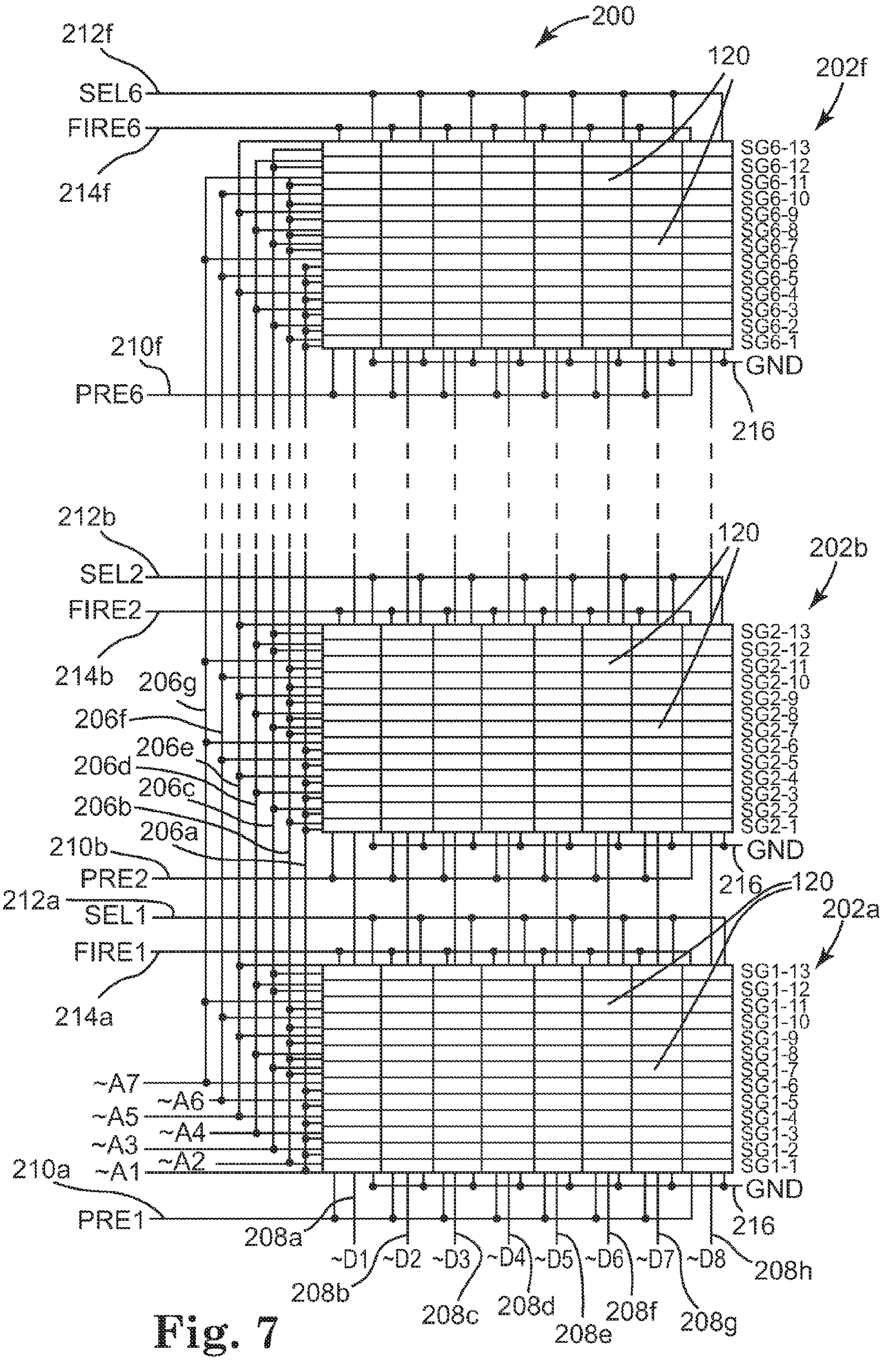
FIG. 7 is a schematic diagram illustrating one embodiment of an ink jet printhead firing cell array.

FIG. 7 is a schematic diagram illustrating one embodiment of an inkjet printhead firing cell array 200. Firing cell array 200 includes a plurality of pre-charged firing cells 120 arranged into six-fire groups 202*a*-202*f*. The pre-charged firing cells 120 in each fire group 202*a*-202*f* are schematically arranged into 13 rows and eight columns. The fire groups 202*a*-202*f* and pre-charged firing cells 120 in array 200 are schematically arranged into 78 rows and eight columns, although the number of pre-charged firing cells and their layout may vary as desired.

The eight columns of pre-charged firing cells 120 are electrically coupled to eight data lines 208*a*-208*h* that receive data signals ~D1, ~D2 . . . ~D8, respectively. Each of the eight columns, referred to herein as a data line group or data group, includes pre-charged firing cells 120 in each of the six fire groups 202*a*-202*f*. Each of the firing cells 120 in each column of pre-charged firing cells 120 is electrically coupled to one of the data lines 208*a*-208*h*. All pre-charged firing cells 120 in a data line group are electrically coupled to the same data line 208*a*-208*h* that is electrically coupled to the gates of the data transistors 136 in the pre-charged firing cells 120 in the column.

Data line 208*a* is electrically coupled to each of the pre-charged firing cells 120 in the far left column, including pre-charged firing cells in each of the fire groups 202*a*-202*f*. Data line 208*b* is electrically coupled to each of the pre-charged firing cells 120 in the adjacent column and so on, over to and including data line 208*h* that is electrically coupled to each of the pre-charged firing cells 120 in the far right column, including pre-charged firing cells 120 in each of the fire groups 202*a*-202*f*.

The rows of pre-charged firing cells 120 are electrically coupled to address lines 206*a*-206*g* that receive address signals ~A1, ~A2 . . . ~A7, respectively. Each pre-charged firing cell 120 in a row of pre-charged firing cells 120, referred to herein as a row subgroup or subgroup of pre-charged firing cells 120, is electrically coupled to two of the address lines 206*a*-206*g*. All pre-charged firing cells 120 in a row subgroup are electrically coupled to the same two address lines 206*a*-206*g*.

The subgroups of the fire groups 202*a*-202*f* are identified as subgroups SG1-1 through SG1-13 in fire group one (FG1) 202*a*, subgroups SG2-1 through SG2-13 in fire group two (FG2) 202*b* and so on, up to and including subgroups SG6-1 through SG6-13 in fire group six (FG6) 202*f*. In other embodiments, each fire group 202*a*-202*f* can include any suitable number of subgroups, such as 14 or more subgroups.

Each subgroup of pre-charged firing cells 120 is electrically coupled to two address lines 206*a*-206*g*. The two address lines 206*a*-206*g* corresponding to a subgroup are electrically coupled to the first and second address transistors 138 and 140 in all pre-charged firing cells 120 of the subgroup. One address line 206*a*-206*g* is electrically coupled to the gate of one of the first and second address transistors 138 and 140 and the other address line 206*a*-206*g* is electrically coupled to the gate of the other one of the first and second address transistors 138 and 140. The address lines 206*a*-206*g* receive address signals ~A1, ~A2 . . . ~A7 and are coupled to provide the address signals ~A1, ~A2 . . . ~A7 to the subgroups of the array 200 as follows:

| Row Subgroup Address Signals | Row Subgroups |
|---|---|
| ~A1, ~A2 | SG1-1, SG2-1 . . . SG6-1 |
| ~A1, ~A3 | SG1-2, SG2-2 . . . SG6-2 |
| ~A1, ~A4 | SG1-3, SG2-3 . . . SG6-3 |
| ~A1, ~A5 | SG1-4, SG2-4 . . . SG6-4 |
| ~A1, ~A6 | SG1-5, SG2-5 . . . SG6-5 |
| ~A1, ~A7 | SG1-6, SG2-6 . . . SG6-6 |
| ~A2, ~A3 | SG1-7, SG2-7 . . . SG6-7 |
| ~A2, ~A4 | SG1-8, SG2-8 . . . SG6-8 |
| ~A2, ~A5 | SG1-9, SG2-9 . . . SG6-9 |
| ~A2, ~A6 | SG1-10, SG2-10 . . . SG6-10 |
| ~A2, ~A7 | SG1-11, SG2-11 . . . SG6-11 |
| ~A3, ~A4 | SG1-12, SG2-12 . . . SG6-12 |
| ~A3, ~A5 | SG1-13, SG2-13 . . . SG6-13 |

Subgroups of pre-charged firing cells 120 are addressed by providing address signals ~A1, ~A2 . . . ~A7 on address lines 206*a*-206*g*. In one embodiment, the address lines 206*a*-206*g* are electrically coupled to one or more address generators provided on printhead die 40.

Pre-charge lines 210*a*-210*f* receive pre-charge signals PRE1, PRE2 . . . PRE6 and provide the pre-charge signals PRE1, PRE2 . . . PRE6 to corresponding fire groups 202*a*-202*f*. Pre-charge line 210*a* is electrically coupled to all of the pre-charged firing cells 120 in FG1 202*a*. Pre-charge line 210*b* is electrically coupled to all pre-charged firing cells 120 in FG2 202*b* and so on, up to and including pre-charge line 210*f* that is electrically coupled to all pre-charged firing cells 120 in FG6 202*f*. Each of the pre-charge lines 210*a*-210*f* is electrically coupled to the gate and drain-source path of all of the pre-charge transistors 128 in the corresponding fire group 202*a*-202*f*, and all pre-charged firing cells 120 in a fire group 202*a*-202*f* are electrically coupled to only one pre-charge line 210*a*-210*f*. Thus, the node capacitances 126 of all pre-charged firing cells 120 in a fire group 202*a*-202*f* are charged by providing the corresponding pre-charge signal PRE1, PRE2 . . . PRE6 to the corresponding pre-charge line 210*a*-210*f*.

Select lines 212*a*-212*f* receive select signals SEL1, SEL2 . . . SEL6 and provide the select signals SEL1, SEL2 . . . SEL6 to corresponding fire groups 202*a*-202*f*. Select line 212*a* is electrically coupled to all pre-charged firing cells 120 in FG1 202*a*. Select line 212*b* is electrically coupled to all pre-charged firing cells 120 in FG2 202*b* and so on, up to and including select line 212*f* that is electrically coupled to all pre-charged firing cells 120 in FG6 202*f*. Each of the select lines 212*a*-212*f* is electrically coupled to the gate of all of the select transistors 130 in the corresponding fire group 202*a*-202*f*, and all pre-charged firing cells 120 in a fire group 202*a*-202*f* are electrically coupled to only one select line 212*a*-212*f*.

Fire lines 214*a*-214*f* receive fire signals or energy signals FIRE1, FIRE2 . . . FIRE6 and provide the energy signals FIRE1, FIRE2 . . . FIRE6 to corresponding fire groups 202*a*-202*f*. Fire line 214*a* is electrically coupled to all pre-charged firing cells 120 in FG1 202*a*. Fire line 214*b* is electrically coupled to all pre-charged firing cells 120 in FG2 202*b* and so on, up to and including fire line 214*f* that is electrically coupled to all pre-charged firing cells 120 in FG6 202*f*. Each of the fire lines 214*a*-214*f* is electrically coupled to all of the firing resistors 52 in the corresponding fire group 202*a*-202*f*, and all pre-charged firing cells 120 in a fire group 202*a*-202*f* are electrically coupled to only one fire line 214*a*-214*f*. The fire lines 214*a*-214*f* are electrically coupled to external supply circuitry by appropriate interface pads. (See, FIG. 25). All pre-charged firing cells 120 in array 200 are electrically coupled to a reference line 216 that is tied to a reference voltage, such as ground. Thus, the pre-charged firing cells 120 in a row subgroup of pre-charged firing cells 120 are electrically coupled to the same address lines 206*a*-206*g*, pre-charge line 210*a*-210*f*, select line 212*a*-212*f* and fire line 214*a*-214*f*.

In operation, in one embodiment fire groups 202*a*-202*f* are selected to fire in succession. FG1 202*a* is selected before FG2 202*b*, which is selected before FG3 and so on, up to FG6 202*f*. After FG6 202*f*, the fire group cycle starts over with FG1 202*a*. However, other sequences, and non-sequential selections may be utilized.

The address signals ~A1, ~A2 . . . ~A7 cycle through the 13 row subgroup addresses before repeating a row subgroup address. The address signals ~A1, ~A2 . . . ~A7 provided on address lines 206*a*-206*g* are set to one row subgroup address during each cycle through the fire groups 202*a*-202*f*. The address signals ~A1 ~A2 . . . ~A7 select one row subgroup in each of the fire groups 202*a*-202*f* for one cycle through the fire groups 202*a*-202*f*. For the next cycle through fire groups 202*a*-202*f*, the address signals ~A1, ~A2 . . . ~A7 are changed to select another row subgroup in each of the fire groups 202*a*-202*f*. This continues up to the address signals ~A1, ~A2 . . . ~A7 selecting the last row subgroup in fire groups 202*a*-202*f*. After the last row subgroup, address signals ~A1, ~A2 . . . ~A7 select the first row subgroup to begin the address cycle over again.

In another aspect of operation, one of the fire groups 202*a*-202*f* is operated by providing a pre-charge signal PRE1, PRE2 . . . PRE6 on the pre-charge line 210*a*-210*f* of the one fire group 202*a*-202*f*. The pre-charge signal PRE1, PRE2 . . . PRE6 defines a pre-charge time interval or period during which time the node capacitance 126 on each drive switch 172 in the one fire group 202*a*-202*f* is charged to a high voltage level, to pre-charge the one fire group 202*a*-202*f*.

Address signals ~A1, ~A2 . . . ~A7 are provided on address lines 206*a*-206*g* to address one row subgroup in each of the fire groups 202*a*-202*f*, including one row subgroup in the pre-charged fire group 202*a*-202*f*. Data signals ~D1, ~D2 . . . ~D8 are provided on data lines 208*a*-208*h* to provide data to all fire groups 202*a*-202*f*, including the addressed row subgroup in the pre-charged fire group 202*a*-202*f*.

Next, a select signal SEL1, SEL2 . . . SEL6 is provided on the select line 212*a*-212*f* of the pre-charged fire group 202*a*-202*f* to select the pre-charged fire group 202*a*-202*f*. The select signal SEL1, SEL2 . . . SEL6 defines a discharge time interval for discharging the node capacitance 126 on each drive switch 172 in a pre-charged firing cell 120 that is either not in the addressed row subgroup in the selected fire group 202*a*-202*f* or addressed in the selected fire group 202*a*-202*f* and receiving a high level data signal ~D1, ~D2 . . . ~D8. The node capacitance 126 does not discharge in pre-charged firing cells 120 that are addressed in the selected fire group 202*a*-202*f* and receiving a low level data signal ~D1, ~D2 . . . ~D8. A high voltage level on the node capacitance 126 turns the drive switch 172 on (conducting).

After drive switches 172 in the selected fire group 202*a*-202*f* are set to conduct or not conduct, an energy pulse or voltage pulse is provided on the fire line 214*a*-214*f* of the selected fire group 202*a*-202*f*. Pre-charged firing cells 120 that have conducting drive switches 172, conduct current through the firing resistor 52 to heat ink and eject ink from the corresponding drop generator 60.

With fire groups 202*a*-202*f* operated in succession, the select signal SEL1, SEL2 . . . SEL6 for one fire group 202*a*-202*f* is used as the pre-charge signal PRE1, PRE2 . . . PRE6 for the next fire group 202*a*-202*f*. The pre-charge signal PRE1, PRE2 . . . PRE6 for one fire group 202*a*-202*f* precedes the select signal SEL1, SEL2 . . . SEL6 and energy signal FIRE1, FIRE2 . . . FIRE6 for the one fire group 202*a*-202*f*. After the pre-charge signal PRE1, PRE2 . . . PRE6, data signals ~D1, ~D2 . . . ~D8 are multiplexed in time and stored in the addressed row subgroup of the one fire group 202*a*-202*f* by the select signal SEL1, SEL2 . . . SEL6. The select signal SEL1, SEL2 . . . SEL6 for the selected fire group 202*a*-202*f* is also the pre-charge signal PRE1, PRE2 . . . PRE6 for the next fire group 202*a*-202*f*. After the select signal SEL1, SEL2 . . . SEL6 for the selected fire group 202*a*-202*f* is complete, the select signal SEL1, SEL2 . . . SEL6 for the next fire group 202*a*-202*f* is provided. Pre-charged firing cells 120 in the selected subgroup fire or heat ink based on the stored data signal ~D1, ~D2 . . . ~D8 as the energy signal FIRE1, FIRE2 . . . FIRE6, including an energy pulse, is provided to the selected fire group 202*a*-202*f*.

Figure 8:
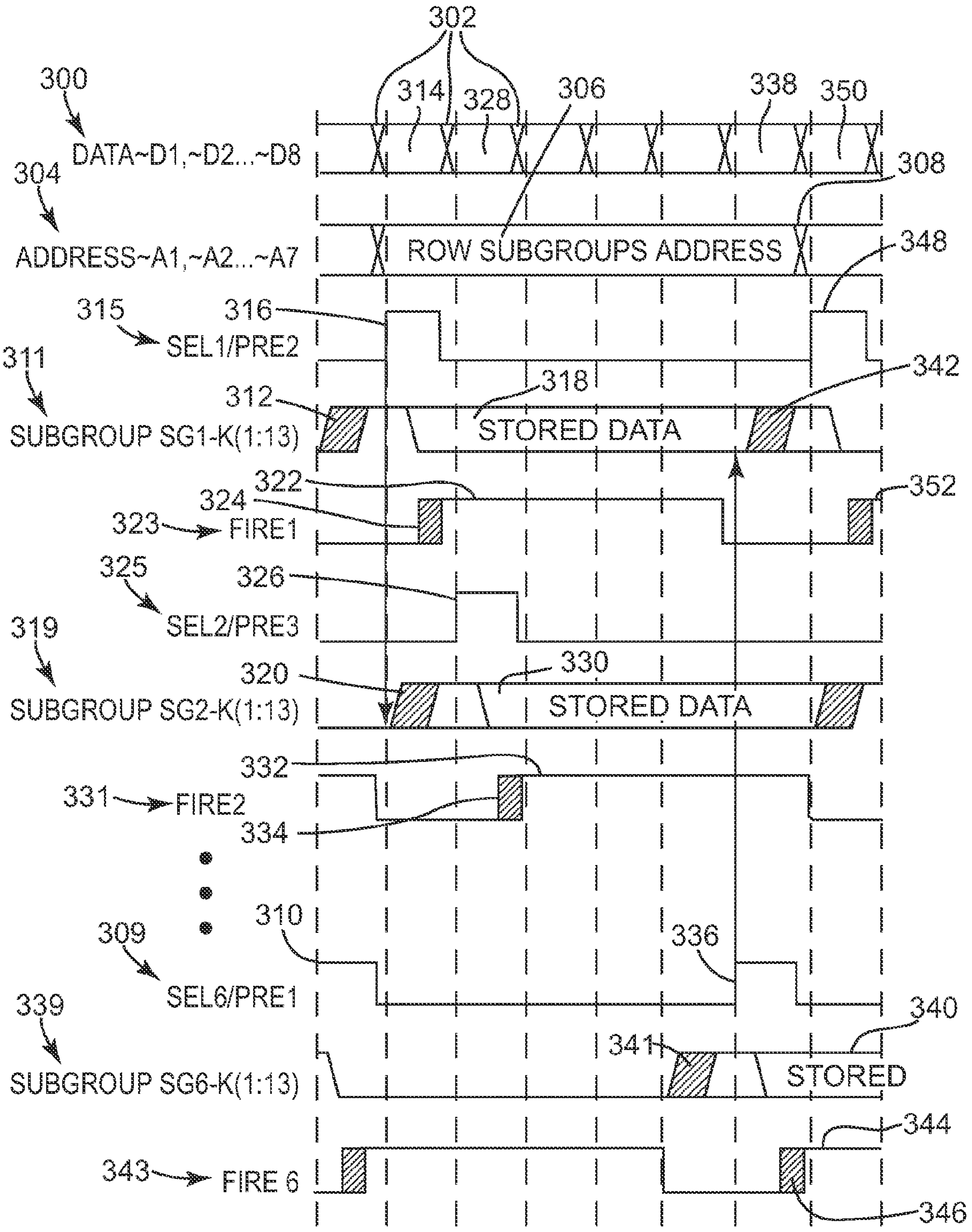
FIG. 8 is a timing diagram illustrating the operation of one embodiment of a firing cell array.

FIG. 8 is a timing diagram illustrating the operation of one embodiment of firing cell array 200. Fire groups 202*a*-202*f* are selected in succession to energize pre-charged firing cells 120 based on data signals ~D1, ~D2 . . . ~D8, indicated at 300. The data signals ~D1, ~D2 . . . ~D8 at 300 are changed depending on the nozzles that are to eject fluid, indicated at 302, for each row subgroup address and fire group 202*a*-202*f* combination. Address signals ~A1, ~A2 . . . ~A7 at 304 are provided on address lines 206*a*-206*g* to address one row subgroup from each of the fire groups 202*a*-202*f*. The address signals ~A1, ~A2 . . . A7 at 304 are set to one address, indicated at 306, for one cycle through fire groups 202*a*-202*f*. After the cycle is complete, the address signals ~A1, ~A2 . . . ~A7 at 304 are changed at 308 to address a different row subgroup from each of the fire groups 202*a*-202*f*. The address signals ~A1, ~A2 . . . ~A7 at 304 increment through the row subgroups to address the row subgroups in sequential order from one to 13 and back to one. In other embodiments, address signals ~A1, ~A2 . . . ~A7 at 304 can be set to address row subgroups in any suitable order.

During a cycle through fire groups 202*a*-202*f*, select line 212*f* coupled to FG6 202*f* and pre-charge line 210*a* coupled to FG1 202*a* receive SEL6/PRE1 signal 309, including SEL6/PRE1 signal pulse 310. In one embodiment, the select line 212*f* and pre-charge line 210*a* are electrically coupled together to receive the same signal. In another embodiment, the select line 212*f* and pre-charge line 210*a* are not electrically coupled together, but receive similar signals.

The SEL6/PRE1 signal pulse at 310 on pre-charge line 210*a*, pre-charges all firing cells 120 in FG1 202*a*. The node capacitance 126 for each of the pre-charged firing cells 120 in FG1 202*a* is charged to a high voltage level. The node capacitances 126 for pre-charged firing cells 120 in one row subgroup SG1-K, indicated at 311, are pre-charged to a high voltage level at 312. The row subgroup address at 306 selects subgroup SG1-K, and a data signal set at 314 is provided to data transistors 136 in all pre-charged firing cells 120 of all fire groups 202*a*-202*f*, including the address selected row subgroup SG1-K.

The select line 212*a* for FG1 202*a* and pre-charge line 210*b* for FG2 202*b* receive the SEL1/PRE2 signal 315, including the SEL1/PRE2 signal pulse 316. The SEL1/PRE2 signal pulse 316 on select line 212*a* turns on the select transistor 130 in each of the pre-charged firing cells 120 in FG1 202*a*. The node capacitance 126 is discharged in all pre-charged firing cells 120 in FG1 202*a* that are not in the address selected row subgroup SG1-K. In the address selected row subgroup SG1-K, data at 314 are stored, indicated at 318, in the node capacitances 126 of the drive switches 172 in row subgroup SG1-K to either turn the drive switch on (conducting) or off (non-conducting).

The SEL1/PRE2 signal pulse at 316 on pre-charge line 210*b*, pre-charges all firing cells 120 in FG2 202*b*. The node capacitance 126 for each of the pre-charged firing cells 120 in FG2 202*b* is charged to a high voltage level. The node capacitances 126 for pre-charged firing cells 120 in one row subgroup SG2-K, indicated at 319, are pre-charged to a high voltage level at 320. The row subgroup address at 306 selects subgroup SG2-K, and a data signal set at 328 is provided to data transistors 136 in all pre-charged firing cells 120 of all fire groups 202*a*-202*f*, including the address selected row subgroup SG2-K.

The fire line 214*a* receives energy signal FIRE1, indicated at 323, including an energy pulse at 322 to energize firing resistors 52 in pre-charged firing cells 120 that have conductive drive switches 172 in FG1 202*a*. The FIRE1 energy pulse 322 goes high while the SEL1/PRE2 signal pulse 316 is high and while the node capacitance 126 on non-conducting drive switches 172 are being actively pulled low, indicated on energy signal FIRE1 323 at 324. Switching the energy pulse 322 high while the node capacitances 126 are actively pulled low, prevents the node capacitances 126 from being inadvertently charged through the drive switch 172 as the energy pulse 322 goes high. The SEL1/PRE2 signal 315 goes low and the energy pulse 322 is provided to FG1 202*a* for a predetermined time to heat ink and eject the ink through nozzles 34 corresponding to the conducting pre-charged firing cells 120.

The select line 212*b* for FG2 202*b* and pre-charge line 210*c* for FG3 202*c* receive SEL2/PRE3 signal 325, including SEL2/PRE3 signal pulse 326. After the SEL1/PRE2 signal pulse 316 goes low and while the energy pulse 322 is high, the SEL2/PRE3 signal pulse 326 on select line 212*b* turns on select transistor 130 in each of the pre-charged firing cells 120 in FG2 202*b*. The node capacitance 126 is discharged on all pre-charged firing cells 120 in FG2 202*b* that are not in the address selected row subgroup SG2-K. Data signal set 328 for subgroup SG2-K is stored in the pre-charged firing cells 120 of subgroup SG2-K, indicated at 330, to either turn the drive switches 172 on (conducting) or off (non-conducting). The SEL2/PRE3 signal pulse on pre-charge line 210*c* pre-charges all pre-charged firing cells 120 in FG3 202*c*.

Fire line 214*b* receives energy signal FIRE2, indicated at 331, including energy pulse 332, to energize firing resistors 52 in pre-charged firing cells 120 of FG2 202*b* that have conducting drive switches 172. The FIRE2 energy pulse 332 goes high while the SEL2/PRE3 signal pulse 326 is high, indicated at 334. The SEL2/PRE3 signal pulse 326 goes low and the FIRE2 energy pulse 332 remains high to heat and eject ink from the corresponding drop generator 60.

After the SEL2/PRE3 signal pulse 326 goes low and while the energy pulse 332 is high, a SEL3/PRE4 signal is provided to select FG3 202*c* and pre-charge FG4 202*d*. The process of pre-charging, selecting and providing an energy signal, including an energy pulse, continues up to and including FG6 202*f*.

The SEL5/PRE6 signal pulse on pre-charge line 210*f*, pre-charges all firing cells 120 in FG6 202*f*. The node capacitance 126 for each of the pre-charged firing cells 120 in FG6 202*f* is charged to a high voltage level. The node capacitances 126 for pre-charged firing cells 120 in one row subgroup SG6-K, indicated at 339, are pre-charged to a high voltage level at 341. The row subgroup address at 306 selects subgroup SG6-K, and data signal set 338 is provided to data transistors 136 in all pre-charged firing cells 120 of all fire groups 202*a*-202*f*, including the address selected row subgroup SG6-K.

The select line 212*f* for FG6 202*f* and pre-charge line 210*a* for FG1 202*a* receive a second SEL6/PRE1 signal pulse at 336. The second SEL6/PRE1 signal pulse 336 on select line 212*f* turns on the select transistor 130 in each of the pre-charged firing cells 120 in FG6 202*f*. The node capacitance 126 is discharged in all pre-charged firing cells 120 in FG6 202*f* that are not in the address selected row subgroup SG6-K. In the address selected row subgroup SG6-K, data 338 are stored at 340 in the node capacitances 126 of each drive switch 172 to either turn the drive switch on or off.

The SEL6/PRE1 signal on pre-charge line 210*a*, pre-charges node capacitances 126 in all firing cells 120 in FG1 202*a*, including firing cells 120 in row subgroup SG1-K, indicated at 342, to a high voltage level. The firing cells 120 in FG1 202*a* are pre-charged while the address signals ~A1, ~A2 . . . ~A7 304 select row subgroups SG1-K, SG2-K and on, up to row subgroup SG6-K.

The fire line 214*f* receives energy signal FIRE6, indicated at 343, including an energy pulse at 344 to energize fire resistors 52 in pre-charged firing cells 120 that have conductive drive switches 172 in FG6 202*f*. The energy pulse 344 goes high while the SEL6/PRE1 signal pulse 336 is high and node capacitances 126 on non-conducting drive switches 172 are being actively pulled low, indicated at 346. Switching the energy pulse 344 high while the node capacitances 126 are actively pulled low, prevents the node capacitances 126 from being inadvertently charged through drive switch 172 as the energy pulse 344 goes high. The SEL6/PRE1 signal pulse 336 goes low and the energy pulse 344 is maintained high for a predetermined time to heat ink and eject ink through nozzles 34 corresponding to the conducting pre-charged firing cells 120.

After the SEL6/PRE1 signal pulse 336 goes low and while the energy pulse 344 is high, address signals ~A1, ~A2 . . . ~A7 304 are changed at 308 to select another set of subgroups SG1-K+1, SG2-K+1 and so on, up to SG6-K+1. The select line 212*a* for FG1 202*a* and pre-charge line 210*b* for FG2 202*b* receive a SEL1/PRE2 signal pulse, indicated at 348. The SEL1/PRE2 signal pulse 348 on select line 212*a* turns on the select transistor 130 in each of the pre-charged firing cells 120 in FG1 202*a*. The node capacitance 126 is discharged in all pre-charged firing cells 120 in FG1 202*a* that are not in the address selected subgroup SG1-K+1. Data signal set 350 for row subgroup SG1-K+1 is stored in the pre-charged firing cells 120 of subgroup SG1-K+1 to either turn drive switches 172 on or off. The SEL1/PRE2 signal pulse 348 on pre-charge line 210*b* pre-charges all firing cells 120 in FG2 202*b*.

The fire line 214*a* receives energy pulse 352 to energize firing resistors 52 and pre-charged firing cells 120 of FG1 202*a* that have conducting drive switches 172. The energy pulse 352 goes high while the SEL1/PRE2 signal pulse at 348 is high. The SEL1/PRE2 signal pulse 348 goes low and the energy pulse 352 remains high to heat and eject ink from corresponding drop generators 60. The process continues until printing is complete.

Figure 9:
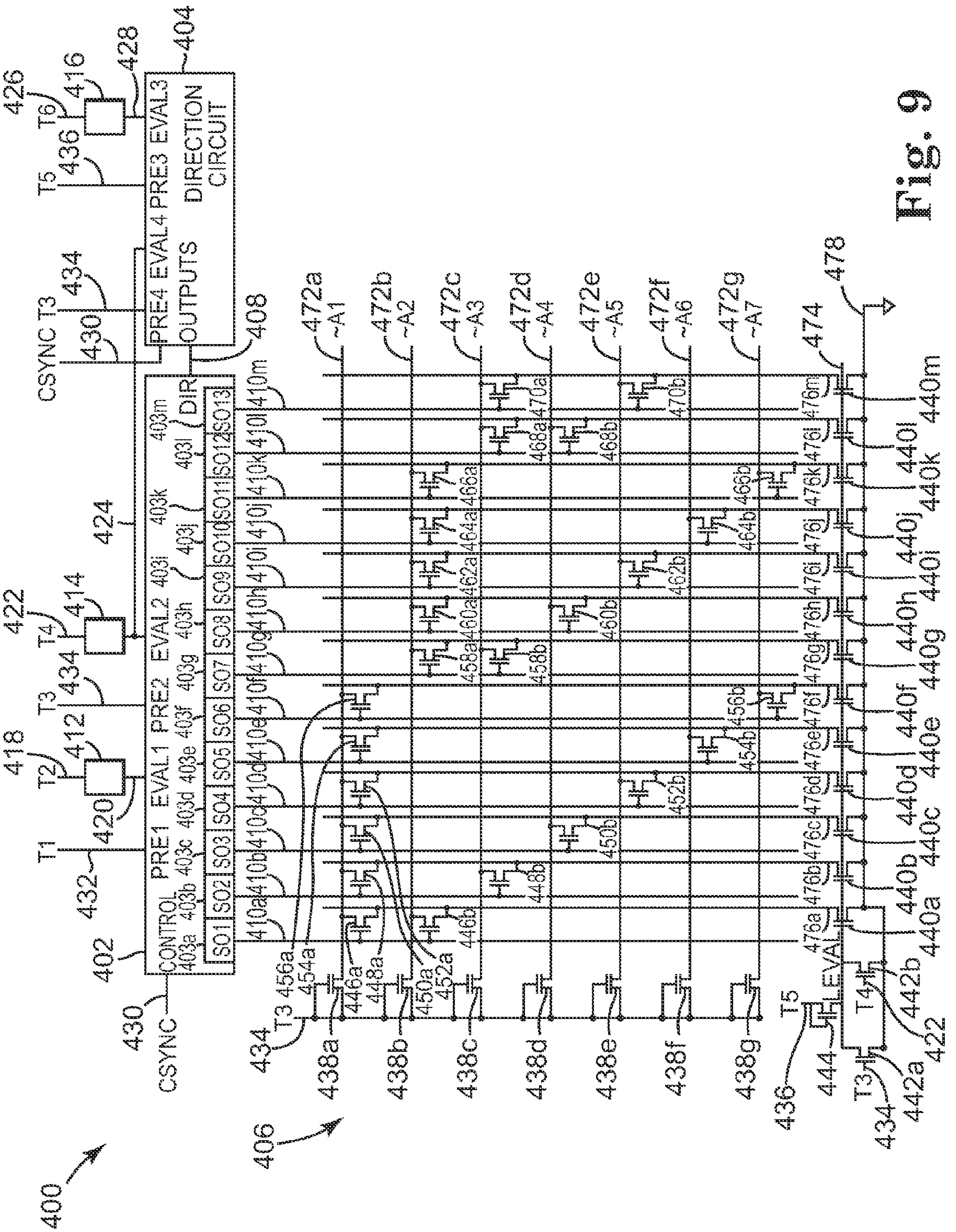
FIG. 9 is a diagram illustrating one embodiment of an address generator in a die.

FIG. 9 is a diagram illustrating one embodiment of an address generator 400 in printhead die 40. The address generator 400 includes a shift register 402, a direction circuit 404 and a logic array 406. The shift register 402 is electrically coupled to direction circuit 404 through direction control lines 408. Also, shift register 402 is electrically coupled to logic array 406 through shift register output lines 410*a*-410*m*.

In the embodiments described below, address generator 400 provides address signals to firing cells 120. In one embodiment, the address generator 400 receives external signals, see FIG. 25, including a control signal CSYNC and six timing signals T1-T6, and in response provides seven address signals ~A1, ~A2, . . . ~A7. The address signals ~A1, ~A2, . . . ~A7 are active when they are in the low voltage level, as indicated by the preceding tilda on each signal name. In one embodiment, timing signals T1-T6 are provided on select lines (e.g., select lines 212*a*-212*f* shown in FIG. 7). Address generator 400 is one embodiment of a control circuit configured to respond to a control signal (e.g., CSYNC) to initiate a sequence (e.g., a sequence of addresses ~A1, ~A2 . . . ~A7 in forward or reverse order) to enable the firing cells 120 for activation.

The address generator 400 includes resistor divide networks 412, 414 and 416 that receive timing signals T2, T4 and T6. Resistor divide network 412 receives timing signal T2 through timing signal line 418 and divides down the voltage level of timing signal T2 to provide a reduced voltage level T2 timing signal on first evaluation signal line 420. Resistor divide network 414 receives timing signal T4 though timing signal line 422 and divides down the voltage level of timing signal T4 to provide a reduced voltage level T4 timing signal on second evaluation signal line 424. Resistor divide network 416 receives timing signal T6 through timing signal line 426 and divides down the voltage level of timing signal T6 to provide a reduced voltage level T6 timing signal on third evaluation signal line 428.

The shift register 402 receives control signal CSYNC through control signal line 430 and direction signals through direction signal lines 408. Also, shift register 402 receives timing signal T1 through timing signal line 432 as first pre-charge signal PRE1. The reduced voltage level T2 timing signal is received through first evaluation signal line 420 as first evaluation signal EVAL1. Timing signal T3 is received through timing signal line 434 as second pre-charge signal PRE2, and the reduced voltage level T4 timing signal is received through second evaluation signal line 424 as second evaluation signal EVAL2. The shift register 402 provides shift register output signals SO1-SO13 on shift register output lines 410*a*-410*m*.

Shift register 402 includes thirteen shift register cells 403*a*-403*m* that provide the thirteen shift register output signals SO1-SO13. Each shift register cell 403*a*-403*m* provides one of the shift register output signals SO1-SO13. The thirteen shift register cells 403*a*-403*m* are electrically coupled in series to provide shifting in the forward direction and the reverse direction. In other embodiments, shift register 402 can include any suitable number of shift register cells 403 to provide any suitable number of shift register output signals, to provide any number of desired address signals.

Shift register cell 403*a* provides shift register output signal SO1 on shift register output line 410*a*. Shift register cell 403*b* provides shift register output signal SO2 on shift register output line 410*b*. Shift register cell 403*c* provides shift register output signal SO3 on shift register output line 410*c*. Shift register cell 403*d* provides shift register output signal SO4 on shift register output line 410*d*. Shift register cell 403*e* provides shift register output signal SO5 on shift register output line 410*e*. Shift register cell 403*f* provides shift register output signal SO6 on shift register output line 410*f*. Shift register cell 403*g* provides shift register output signal SO7 on shift register output line 410*g*. Shift register cell 403*h* provides shift register output signal SO8 on shift register output line 410*h*. Shift register cell 403*i* provides shift register output signal SO9 on shift register output line 410*i*. Shift register cell 403*j* provides shift register output signal SO10 on shift register output line 410*j*. Shift register cell 403*k* provides shift register output signal SO11 on shift register output line 410*k*. Shift register cell 403*l* provides shift register output signal SO12 on shift register output line 410*l* and shift register cell 403*m* provides shift register output signal SO13 on shift register output line 410*m*.

The direction circuit 404 receives control signal CSYNC on control signal line 430. Timing signal T3 is received on timing signal line 434 as fourth pre-charge signal PRE4. The reduced voltage level T4 timing signal is received on evaluation signal line 424 as fourth evaluation signal EVAL4. Timing signal T5 is received on timing signal line 436 as third pre-charge signal PRE3, and the reduced voltage level T6 timing signal is received on evaluation signal line 428 as third evaluation signal EVAL3. The direction circuit 404 provides direction signals to shift register 402 through direction signal lines 408.

The logic array 406 includes address line pre-charge transistors 438*a*-438*g*, address evaluation transistors 440*a*-440*m*, evaluation prevention transistors 442*a* and 442*b*, and logic evaluation pre-charge transistor 444. Also, logic array 406 includes address transistor pairs 446, 448, . . . 470 that decode shift register output signals SO1-SO13 on shift register output lines 410*a*-410*m* to provide address signals ~A1, ~A2, . . . ~A7. The logic array 406 includes address one transistors 446*a* and 446*b*, address two transistors 448*a* and 448*b*, address three transistors 450*a* and 450*b*, address four transistors 452*a* and 452*b*, address five transistors 454*a* and 454*b*, address six transistors 456*a* and 456*b*, address seven transistors 458*a* and 458*b*, address eight transistors 460*a* and 460*b*, address nine transistors 462*a* and 462*b*, address ten transistors 464*a* and 464*b*, address eleven transistors 466*a* and 466*b*, address twelve transistors 468*a* and 468*b* and address thirteen transistors 470*a* and 470*b*.

The address line pre-charge transistors 438*a*-438*g* are electrically coupled to T3 signal line 434 and address lines 472*a*-472*g*. The gate and one side of the drain-source path of address line pre-charge transistor 438*a* are electrically coupled to T3 signal line 434. The other side of the drain-source path of address line pre-charge transistor 438*a* is electrically coupled to address line 472*a*. The gate and one side of the drain-source path of address line pre-charge transistor 438*b* are electrically coupled to T3 signal line 434. The other side of the drain-source path of address line pre-charge transistor 438*b* is electrically coupled to address line 472*b*. The gate and one side of the drain-source path of address line pre-charge transistor 438*c* are electrically coupled to T3 signal line 434. The other side of the drain-source path of address line pre-charge transistor 438*c* is electrically coupled to address line 472*c*. The gate and one side of the drain-source path of address line pre-charge transistor 438*d* are electrically coupled to T3 signal line 434. The other side of the drain-source path of address line pre-charge transistor 438*d* is electrically coupled to address line 472*d*. The gate and one side of the drain-source path of address line pre-charge transistor 438*e* are electrically coupled to T3 signal line 434. The other side of the drain-source path of address line pre-charge transistor 438*e* is electrically coupled to address line 472*e*. The gate and one side of the drain-source path of address line pre-charge transistor 438*f* are electrically coupled to T3 signal line 434. The other side of the drain-source path of address line pre-charge transistor 438*f* is electrically coupled to address line 472*f*. The gate and one side of the drain-source path of address line pre-charge transistor 438*g* are electrically coupled to T3 signal line 434. The other side of the drain-source path of address line pre-charge transistor 438*g* is electrically coupled to address line 472*g*. In one embodiment, address line pre-charge transistors 438*a*-438*g* are electrically coupled to T4 signal line 422, instead of T3 signal line 434. The T4 signal line 422 is electrically coupled to the gate and one side of the drain-source path of each of the address line pre-charge transistor 438*a*-438*g*.

The gate of each of the address evaluation transistors 440*a*-440*m* is electrically coupled to logic evaluation signal line 474. One side of the drain-source path of each of the address evaluation transistors 440*a*-440*m* is electrically coupled to ground. In addition, the drain-source path of address evaluation transistor 440*a* is electrically coupled to evaluation line 476*a*. The drain-source path of address evaluation transistor 440*b* is electrically coupled to evaluation line 476*b*. The drain-source path of address evaluation transistor 440*c* is electrically coupled to evaluation line 476*c*. The drain-source path of address evaluation transistor 440*d* is electrically coupled to evaluation line 476*d*. The drain-source path of address evaluation transistor 440*e* is electrically coupled to evaluation line 476*e*. The drain-source path of address evaluation transistor 440*f* is electrically coupled to evaluation line 476*f*. The drain-source path of address evaluation transistor 440*g* is electrically coupled to evaluation line 476*g*. The drain-source path of address evaluation transistor 440*h* is electrically coupled to evaluation line 476*h*. The drain-source path of address evaluation transistor 440*i* is electrically coupled to evaluation line 476*i*. The drain-source path of address evaluation transistor 440*j* is electrically coupled to evaluation line 476*j*. The drain-source path of address evaluation transistor 440*k* is electrically coupled to evaluation line 476*k*. The drain-source path of address evaluation transistor 440*l* is electrically coupled to evaluation line 476*l*. The drain-source path of address evaluation transistor 440*m* is electrically coupled to evaluation line 476*m*.

The gate and one side of the drain-source path of logic evaluation pre-charge transistor 444 are electrically coupled to T5 signal line 436 and the other side of the drain-source path is electrically coupled to logic evaluation signal line 474. The gate of evaluation prevention transistor 442*a* is electrically coupled to T3 signal line 434. The drain-source path of evaluation prevention transistor 442*a* is electrically coupled on one side to logic evaluation signal line 474 and on the other side to the reference at 478. The gate of evaluation prevention transistor 442*b* is electrically coupled to T4 signal line 422. The drain-source path of evaluation prevention transistor 442*b* is electrically coupled on one side to logic evaluation signal line 474 and on the other side to the reference at 478.

The drain-source paths of address transistor pairs 446, 448, . . . 470 are electrically coupled between address lines 472*a*-472*g* and evaluation lines 476*a*-476*m*. The gates of address transistor pairs 446, 448, . . . 470 are driven by shift register output signals SO1-SO13 through shift register output signal lines 410*a*-410*m*.

The gates of address one transistors 446*a* and 446*b* are electrically coupled to shift register output signal line 410*a*. The drain-source path of address one transistor 446*a* is electrically coupled on one side to address line 472*a* and on the other side to evaluation line 476*a*. The drain-source path of address one transistor 446*b* is electrically coupled one on side to address line 472*b* and on the other side to evaluation line 476*a*. A high level shift register output signal SO1 on shift register output signal line 410*a* turns on address one transistors 446*a* and 446*b* as address evaluation transistor 440*a* is turned on by a high voltage level evaluation signal LEVAL on logic evaluation signal line 474. The address one transistor 446*a* and address evaluation transistor 440*a* conduct to actively pull address line 472*a* to a low voltage level. The address one transistor 446*b* and address evaluation transistor 440*a* conduct to actively pull address line 472*b* to a low voltage level.

The gates of address two transistors 448*a* and 448*b* are electrically coupled to shift register output line 410*b*. The drain-source path of address two transistor 448*a* is electrically coupled on one side to address line 472*a* and on the other side to evaluation line 476*b*. The drain-source path of address two transistor 448*b* is electrically coupled on one side to address line 472*c* and on the other side to evaluation line 476*b*. A high level shift register output signal SO2 on shift register output signal line 410*b* turns on address two transistors 448*a* and 448*b* as address evaluation transistor 440*b* is turned on by a high voltage level evaluation signal LEVAL on logic evaluation signal line 474. The address two transistor 448*a* and address evaluation transistor 440*b* conduct to actively pull address line 472*a* to a low voltage level. The address two transistor 448*b* and address evaluation transistor 440*b* conduct to actively pull address line 472*c* to a low voltage level.

The gates of address three transistors 450*a* and 450*b* are electrically coupled to shift register output signal line 410*c*. The drain-source path of address three transistor 450*a* is electrically coupled on one side to address line 472*a* and on the other side to evaluation line 476*c*. The drain-source path of address three transistor 450*b* is electrically coupled on one side to address line 472*d* and on the other side to evaluation line 476*c*. A high level shift register output signal SO3 on shift register output signal line 410*c* turns on address three transistors 450*a* and 450*b* as address evaluation transistor 440*c* is turned on by a high voltage level evaluation signal LEVAL on logic evaluation signal line 474. The address three transistor 450*a* and address evaluation transistor 440*c* conduct to actively pull address line 472*a* to a low voltage level. The address three transistor 450*b* and address evaluation transistor 440*c* conduct to actively pull address line 472*d* to a low voltage level.

The gates of address four transistors 452*a* and 452*b* are electrically coupled to shift register output signal line 410*d*. The drain-source path of address four transistor 452*a* is electrically coupled on one side to address line 472*a* and on the other side to evaluation line 476*d*. The drain-source path of address four transistor 452*b* is electrically coupled on one side to address line 472*e* and on the other side to evaluation line 476*d*. A high level shift register output signal SO4 on shift register output signal line 410*d* turns on address four transistors 452*a* and 452*b* as address evaluation transistor 440*d* is turned on by a high voltage level evaluation signal LEVAL on logic evaluation signal line 474. The address four transistor 452*a* and address evaluation transistor 440*d* conduct to actively pull address line 472*a* to a low voltage level. The address four transistor 452*b* and address evaluation transistor 440*d* conduct to actively pull address line 472*e* to a low voltage level.

The gates of address five transistors 454*a* and 454*b* are electrically coupled to shift register output signal line 410*e*. The drain-source path of address five transistor 454*a* is electrically coupled on one side to address line 472*a* and on the other side to evaluation line 476*e*. The drain-source path of address five transistor 454*b* is electrically coupled on one side to address line 472*f* and on the other side to evaluation line 476*e*. A high level shift register output signal SO5 on shift register output signal line 410*e* turns on address five transistors 454*a* and 454*b* as address evaluation transistor 440*e* is turned on by a high voltage level evaluation signal LEVAL. The address five transistor 454*a* and address evaluation transistor 440*e* conduct to actively pull address line 472*a* to a low voltage level. The address five transistor 454*b* and address evaluation transistor 440*e* conduct to actively pull address line 472*f* to a low voltage level.

The gates of address six transistors 456*a* and 456*b* are electrically coupled to shift register output signal line 410*f*. The drain-source path of address six transistor 456*a* is electrically coupled on one side to address line 472*a* and on the other side to evaluation line 476*f*. The drain-source path of address six transistor 456*b* is electrically coupled on one side to address line 472*g* and on the other side to evaluation line 476*f*. A high level shift register output signal SO6 on shift register output signal line 410*f* turns on address six transistors 456*a* and 456*b* to conduct as address evaluation transistor 440*f* is turned on by a high voltage level evaluation signal LEVAL. The address six transistor 456*a* and address evaluation transistor 440*f* conduct to actively pull address line 472*a* to a low voltage level. The address six transistor 456*b* and address evaluation transistor 440*f* conduct to actively pull address line 472*g* to a low voltage level.

The gates of address seven transistors 458*a* and 458*b* are electrically coupled to shift register output signal line 410*g*. The drain-source path of address six transistor 458*a* is electrically coupled on one side to address line 472*b* and on the other side to evaluation line 476*g*. The drain source path of address six transistor 458*b* is electrically coupled on one side to address line 472*c* and on the other side to evaluation line 476*g*. A high level shift register output signal SO7 on shift register output signal line 410*g* turns on address six transistors 458*a* and 458*b* as address evaluation transistor 440*g* is turned on by a high voltage level evaluation signal LEVAL. The address seven transistor 458*a* and address evaluation transistor 440*g* conduct to actively pull address line 472*b* to a low voltage level. The address seven transistor 458*b* and address evaluation transistor 440*g* conduct to actively pull address line 472*c* to a low voltage level.

The gates of address eight transistors 460*a* and 460*b* are electrically coupled to shift register output signal line 410*h*. The drain-source path of address eight transistor 460*a* is electrically coupled on one side to address line 472*b* and on the other side to evaluation line 476*h*. The drain-source path of address eight transistor 460*b* is electrically coupled on one side to address line 472*d* and on the other side to evaluation line 476*h*. A high level shift register output signal SO8 on shift register output signal line 410*h* turns on address eight transistors 460*a* and 460*b* as address evaluation transistor 440*h* is turned on by a high voltage level evaluation signal LEVAL. The address eight transistor 460*a* and address evaluation transistor 440*h* conduct to actively pull address line 472*b* to a low voltage level. The address eight transistor 460*b* and address evaluation transistor 440*h* conduct to actively pull address line 472*d* to a low voltage level.

The gates of address nine transistors 462*a* and 462*b* are electrically coupled to shift register output signal line 410*i*. The drain-source path of address nine transistor 462*a* is electrically coupled on one side to address line 472*b* and on the other side to evaluation line 476*i*. The drain-source path of address nine transistor 462*b* is electrically coupled on one side to address line 472*e* and on the other side to evaluation line 476*i*. A high level shift register output signal SO9 on shift register output signal line 410*i* turns on address nine transistors 462*a* and 462*b* to conduct as address evaluation transistor 440*i* is turned on by a high voltage level evaluation signal LEVAL. The address nine transistor 462*a* and address evaluation transistor 440*i* conduct to actively pull address line 472*b* to a low voltage level. The address nine transistor 462*b* and address evaluation transistor 440*i* conduct to actively pull address line 472*e* to a low voltage level.

The gates of address ten transistors 464*a* and 464*b* are electrically coupled to shift register output signal line 410*j*. The drain-source path of address ten transistor 464*a* is electrically coupled on one side to address line 472*b* and on the other side to evaluation line 476*j*. The drain-source path of address ten transistor 464*b* is electrically coupled on one side to address line 472*f* and on the other side to evaluation line 476*j*. A high level shift register output signal SO10 on shift register output signal line 410*j* turns on address ten transistors 464*a* and 464*b* as address evaluation transistor 440*j* is turned on by a high voltage level evaluation signal LEVAL. The address ten transistor 464*a* and address evaluation transistor 440*j* conduct to actively pull address line 472*b* to a low voltage level. The address ten transistor 464*b* and address evaluation transistor 440*j* conduct to actively pull address line 472*f* to a low voltage level.

The gates of address eleven transistors 466*a* and 466*b* are electrically coupled to shift register output signal line 410*k*. The drain-source path of address eleven transistor 466*a* is electrically coupled on one side to address line 472*b* and on the other side to evaluation line 476*k*. The drain-source path of address eleven transistor 466*b* is electrically coupled on one side to address line 472*g* and on the other side to evaluation line 476*k*. A high level shift register output signal SO11 on shift register output signal line 410*k* turns on address eleven transistors 466*a* and 466*b* as address evaluation transistor 440*k* is turned on by a high voltage evaluation signal LEVAL. The address eleven transistor 466*a* and address evaluation transistor 440*k* conduct to actively pull address line 472*b* to a low voltage level. The address eleven transistor 466*b* and address evaluation transistor 440*k* conduct to actively pull address line 472*g* to a low voltage level.

The gates of address twelve transistors 468*a* and 468*b* are electrically coupled to shift register output signal line 410*l*. The drain-source path of address twelve transistor 468*a* is electrically coupled on one side to address line 472*c* and on the other side to evaluation line 476*l*. The drain-source path of address twelve transistor 468*b* is electrically coupled on one side to address line 472*d* and on the other side to evaluation line 476*l*. A high level shift register output signal SO12 on shift register output signal line 410*l* turns on address twelve transistors 468*a* and 468*b* as address evaluation transistor 440*l* is turned on by a high voltage level evaluation signal LEVAL. The address twelve transistor 468*a* and address evaluation transistor 440*l* conduct to actively pull address line 472*c* to a low voltage level. The address twelve transistor 468*b* and address evaluation transistor 440*l* conduct to actively pull address line 472*d* to a low voltage level.

The gates of address thirteen transistors 470*a* and 470*b* are electrically coupled to shift register output signal line 410*m*. The drain-source path of address thirteen transistor 470*a* is electrically coupled on one side to address line 472*c* and on the other side to evaluation line 476*m*. The drain-source path of address thirteen transistor 470*b* is electrically coupled on one side to address line 472*e* and on the other side to evaluation line 476*m*. A high level shift register output signal SO13 on shift register output signal line 410*m* turns on address thirteen transistors 470*a* and 470*b* as address evaluation transistor 440*m* is turned on by a high voltage level evaluation signal LEVAL. The address thirteen transistor 470*a* and address evaluation transistor 440*m* conduct to actively pull address line 472*c* to a low voltage level. The address thirteen transistor 470*b* and address evaluation transistor 440*m* conduct to actively pull address line 472*e* to a low voltage level.

The shift register 402 shifts a single high voltage level output signal from one shift register output signal line 410*a*-410*m* to the next shift register output signal line 410*a*-410*m*. Shift register 402 receives a control pulse in control signal CSYNC on control line 430 and a series of timing pulses from timing signals T1-T4 to shift the received control pulse into shift register 402. In response, shift register 402 provides a single high voltage level shift register output signal SO1 or SO13. All of the other shift register output signals SO1-SO13 are provided at low voltage levels. Shift register 402 receives another series of timing pulses from timing signals T1-T4 and shifts the single high voltage level output signal from one shift register output signal SO1-SO13 to the next shift register output signal SO1-SO13, with all other shift register output signals SO1-SO13 provided at low voltage levels. Shift register 402 receives a repeating series of timing pulses and in response to each series of timing pulses, shift register 402 shifts the single high voltage level output signal to provide a series of up to thirteen high voltage level shift register output signals SO1-SO13. Each high voltage level shift register output signal SO1-SO13 turns on two address transistor pairs 446, 448, . . . 470 to provide address signals ~A1, ~A2, . . . ~A7 to firing cells 120. The address signals ~A1, ~A2, . . . ~A7 are provided in thirteen address time slots that correspond to the thirteen shift register output signals SO1-SO13. In another embodiment, shift register 402 can include any suitable number of shift register output signals, such as fourteen, to provide address signals ~A1, ~A2, . . . ~A7 in any suitable number of address time slots, such as fourteen address time slots.

The shift register 402 receives direction signals from direction circuit 404 through direction signal lines 408. The direction signals set up the direction of shifting in shift register 402. The shift register 402 can be set to shift the high voltage level output signal in a forward direction, from shift register output signal SO1 to shift register output signal SO13, or in a reverse direction, from shift register output signal SO13 to shift register output signal SO1.

In the forward direction, shift register 402 receives the control pulse in control signal CSYNC and provides a high voltage level shift register output signal SO1. All other shift register output signals SO2-SO13 are provided at low voltage levels. Shift register 402 receives the next series of timing pulses and provides a high voltage level shift register output signal SO2, with all other shift register output signals SO1 and SO3-SO13 provided at low voltage levels. Shift register 402 receives the next series of timing pulses and provides a high voltage level shift register output signal SO3, with all other shift register output signals SO1, SO2, and SO4-SO13 provided at low voltage levels. Shift register 402 continues to shift the high level output signal in response to each series of timing pulses up to and including providing a high voltage level shift register output signal SO13, with all other shift register output signals SO1-SO12 provided at low voltage levels. After providing the high voltage level shift register output signal SO13, shift register 402 receives the next series of timing pulses and provides low voltage level signals for all shift register output signals SO1-SO13. Another control pulse in control signal CSYNC is provided to start or initiate shift register 402 shifting in the forward direction series of high voltage level output signals from shift register output signal SO1 to shift register output signal SO13.

In the reverse direction, shift register 402 receives a control pulse in control signal CSYNC and provides a high level shift register output signal SO13. All other shift register output signals SO1-SO12 are provided at low voltage levels. Shift register 402 receives the next series of timing pulses and provides a high voltage level shift register output signal SO12, with all other shift register output signals SO1-SO11 and SO13 provided at low voltage levels. Shift register 402 receives the next series of timing pulses and provides a high voltage level shift register output signal SO11, with all other shift register output signals SO1-SO10, SO12 and SO13 provided at low voltage levels. Shift register 402 continues to shift the high voltage level output signal in response to each series of timing pulses, up to and including providing a high voltage level shift register output signal SO1, with all other shift register output signals SO2-SO13 provided at low voltage levels. After providing the high voltage level shift register output signal SO1, shift register 402 receives the next series of timing pulses and provides low voltage level signals for all shift register output signals SO1-SO13. Another control pulse in control signal CSYNC is provided to start or initiate shift register 402 shifting in the reverse direction series of high voltage output signals from shift register output signal SO13 to shift register output signal SO1.

The direction circuit 404 provides two direction signals through direction signal lines 408. The direction signals set the forward/reverse shifting direction in shift register 402. Also, the direction signals can be used to clear the high voltage level output signal from shift register 402.

The direction circuit 404 receives a repeating series of timing pulses from timing signals T3-T6. In addition, direction circuit 404 receives control pulses in control signal CSYNC on control line 430. The direction circuit 404 provides forward direction signals in response to receiving a control pulse coincident with a timing pulse from timing signal T4. The forward direction signals set shift register 402 for shifting in the forward direction from shift register output signal SO1 to shift register output signal SO13. The direction circuit 404 provides reverse direction signals in response to receiving a control pulse coincident with a timing pulse from timing signal T6. The reverse direction signals set shift register 402 for shifting in the reverse direction, from shift register output signal SO13 to shift register output signal SO1. Direction circuit 404 provides direction signals that clear shift register 402 in response to direction circuit 404 receiving control pulses coincident with both a timing pulse from timing signal T4 and a timing pulse from timing signal T6.

The logic array 406 receives shift register output signals SO1-SO13 on shift register output signal lines 410*a*-410*m* and timing pulses from timing signals T3-T5 on timing signal lines 434, 422 and 436. In response to a single high voltage level output signal in the shift register output signals SO1-SO13 and the timing pulses from timing signals T3-T5, logic array 406 provides two low voltage level address signals out of the seven address signals ~A1, ~A2, . . . ~A7.

The logic array 406 receives a timing pulse from timing signal T3 that turns on evaluation prevention transistor 442*a* to pull the evaluation signal line 474 to a low voltage level and turn off address evaluation transistors 440. Also, the timing pulse from timing signal T3 charges address lines 472*a*-472*g* to high voltage levels through address line pre-charge transistors 438. In one embodiment, the timing pulse from timing signal T3 is replaced by the timing pulse from timing signal T4 to charge address lines 472*a*-472*g* to high voltage levels through address line pre-charge transistors 438.

The timing pulse from timing signal T4 turns on evaluation prevention transistor 442*b* to pull evaluation signal line 474 to a low voltage level and turn off address evaluation transistors 440. The shift register output signals SO1-SO13 settle to valid output signals during the timing pulse from timing signal T4. A single high voltage level output signal in the shift register output signals SO1-SO13 is provided to the gates of an address transistor pair 446, 448, . . . 470 in logic array 406. A timing pulse from timing signal T5 charges the evaluation signal line 474 to a high voltage level to turn on address evaluation transistors 440. As address evaluation transistors 440 are turned on, an address transistor pair 446, 448, . . . or 470 in logic array 406 that receive the high voltage level shift register output signal SO1-SO13 conduct to discharge the corresponding address lines 472. The corresponding address lines 472 are actively pulled low through conducting address transistor pairs 446, 448, . . . 470 and a conducting address evaluation transistor 440. The other address lines 472 remain charged to a high voltage level.

The logic array 406 provides two low voltage level address signals out of the seven address signals ~A1, ~A2, . . . ~A7 in each address time slot. If shift register output signal SO1 is at a high voltage level, address one transistors 446*a* and 446*b* conduct to pull address lines 472*a* and 472*b* to low voltage levels and provide active low address signals ~A1 and ~A2. If shift register output signal SO2 is at a high voltage level, address two transistors 448*a* and 448*b* conduct to pull address lines 472*a* and 472*c* to low voltage levels and provide active low address signals ~A1 and ~A3. If shift register output signal SO3 is at a high voltage level, address three transistors 450*a* and 450*b* conduct to pull address lines 472*a* and 472*d* to low voltage levels and provide active low address signals ~A1 and ~A4, and so on for each shift register output signal SO4-SO13. The address signals ~A1, ~A2, . . . ~A7 for each of the thirteen address time slots, which correlate to the shift register output signals SO1-SO13, are set out in the following table:

| Address Time Slot | Active address signals |
|---|---|
| 1 | ~A1 and ~A2 |
| 2 | ~A1 and ~A3 |
| 3 | ~A1 and ~A4 |
| 4 | ~A1 and ~A5 |
| 5 | ~A1 and ~A6 |
| 6 | ~A1 and ~A7 |
| 7 | ~A2 and ~A3 |
| 8 | ~A2 and ~A4 |
| 9 | ~A2 and ~A5 |
| 10 | ~A2 and ~A6 |
| 11 | ~A2 and ~A7 |
| 12 | ~A3 and ~A4 |
| 13 | ~A3 and ~A5 |

In another embodiment, logic array 406 can provide active address signals ~A1, ~A2, . . . ~A7 for each of thirteen address time slots as set out in the following table:

| Address Time Slot | Active address signals |
|---|---|
| 1 | ~A1 and ~A3 |
| 2 | ~A1 and ~A4 |
| 3 | ~A1 and ~A5 |
| 4 | ~A1 and ~A6 |
| 5 | ~A2 and ~A4 |
| 6 | ~A2 and ~A5 |
| 7 | ~A2 and ~A6 |
| 8 | ~A2 and ~A7 |
| 9 | ~A3 and ~A5 |
| 10 | ~A3 and ~A6 |
| 11 | ~A3 and ~A7 |
| 12 | ~A4 and ~A6 |
| 13 | ~A4 and ~A7 |

Also, in other embodiments, the logic array 406 can include address transistors that provide any suitable number of low voltage level address signals ~A1, ~A2, . . . ~A7 for each high voltage level output signal SO1-SO13 and in any suitable sequence of low voltage level address signals ~A1, ~A2, . . . ~A7. This can be done by, for example, appropriately locating each transistor pair 446, 448, . . . 470 to discharge any two desired address lines 672*a-g*.

In addition, in other embodiments, logic array 406 can include any suitable number of address lines to provide any suitable number of address signals in any suitable number of address timeslots.

In operation, a repeating series of six timing pulses is provided from timing signals T1-T6. Each of the timing signals T1-T6 provides one timing pulse in each series of six timing pulses. The timing pulse from timing signal T1 is followed by the timing pulse from timing signal T2, followed by the timing pulse from timing signal T3, followed by the timing pulse from timing signal T4, followed by the timing pulse from timing signal T5, which is followed by the timing pulse from timing signal T6. The series of six timing pulses is repeated in the repeating series of six timing pulses.

In one series of the six timing pulses, direction circuit 404 receives a timing pulse from timing signal T3 in fourth pre-charge signal PRE4. The timing pulse in fourth pre-charge signal PRE4 charges a first one of the direction lines 408 to a high voltage level. The direction circuit 404 receives a reduced voltage level timing pulse from timing signal T4 in fourth evaluation signal EVAL4. If direction circuit 404 receives a control pulse in control signal CSYNC coincident with (at the same time as) the fourth evaluation signal EVAL4, direction circuit 404 discharges the first direction line 408. If direction 404 receives a low voltage level control signal CSYNC coincident with the timing pulse in the fourth evaluation signal EVAL4, the first direction line 408 remains charged to a high voltage level.

Next, direction circuit 404 receives a timing pulse from timing signal T5 in third pre-charge signal PRE3. The timing pulse in third pre-charge signal PRE3 charges a second one of the direction lines 408. The direction circuit 404 receives a reduced voltage level timing pulse from timing signal T6 in third evaluation signal EVAL3. If the direction circuit 404 receives a control pulse in control signal CSYNC coincident with a timing pulse in third evaluation signal EVAL3, direction circuit 404 discharges the second direction line 408 to a low voltage level. If direction circuit 404 receives a low voltage level control signal CSYNC coincident with the timing pulse in third evaluation signal EVAL3, the second direction line 408 remains charged to a high voltage level.

If the first direction line 408 is discharged to a low voltage level and the second direction line 408 remains at a high voltage level, the signal levels on the first and second direction lines 408 set up shift register 402 to shift in the forward direction. If the first direction line 408 remains at a high voltage level and the second direction line 408 is discharged to a low voltage level, the signal levels on direction lines 408 set up shift register 402 to shift in the reverse direction. If both the first and second direction lines 408 are discharged to low voltage levels, shift register 402 is prevented from providing a high voltage level shift register output signal SO1-SO13. The direction signals on direction lines 408 are set during each series of six timing pulses.

To begin, the direction is set in one series of six timing pulses and shift register 402 is initiated in the next series of six timing pulses. To initiate shift register 402, shift register 402 receives a timing pulse from timing signal T1 in first pre-charge signal PRE1. The timing pulse in first pre-charge signal PRE1 pre-charges an internal node in each of the thirteen shift register cells, indicated at 403*a*-403*m*. The shift register 402 receives a reduced voltage level timing pulse from timing signal T2 in first evaluation signal EVAL1. If a control pulse in control signal CSYNC is received by shift register 402 coincident with the timing pulse in first evaluation signal EVAL1, shift register 402 discharges the internal node of one of the thirteen shift register cells to provide a low voltage level at the discharged internal node. If the control signal CSYNC remains at a low voltage level coincident with the timing pulse in first evaluation signal EVAL1, the internal node in each of the thirteen shift register cells remains at a high voltage level.

Shift register 402 receives a timing pulse from timing signal T3 in second pre-charge signal PRE2. The timing pulse in second pre-charge signal PRE2 pre-charges each of the thirteen shift register output lines 410*a*-410*m* to provide high voltage level shift register output signals SO1-SO13. Shift register 402 receives a reduced voltage level timing pulse from timing signal T4 in second evaluation signal EVAL2. If the internal node in a shift register cell 403 is at a low voltage level, such as after receiving the control pulse from control signal CSYNC coincident with the timing pulse in first evaluation signal EVAL1, shift register 402 maintains the shift register output signal SO1-SO13 at the high voltage level. If the internal node in a shift register cell 403 is at a high voltage level, such as in all other shift register cells 403, shift register 402 discharges the shift register output line 410*a*-410*m* to provide low voltage level shift register output signals SO1-SO13. The shift register 402 is initiated in one series of the six timing pulses. The shift register output signals SO1-SO13 become valid during the timing pulse from timing signal T4 in second evaluation signal EVAL2 and remain valid until the timing pulse from timing signal T3 in the next series of six timing pulses. In each subsequent series of the six timing pulses, shift register 402 shifts the high voltage level shift register output signal SO1-SO13 from one shift register cell 403 to the next shift register cell 403.

The logic array 406 receives the shift register output signals SO1-SO13. In one embodiment, logic array 406 receives the timing pulse from timing signal T3 to pre-charge address lines 472 and turn off address evaluation transistors 440. In one embodiment, logic array 406 receives the timing pulse from timing signal T3 to turn off address evaluation transistors 440 and a timing pulse from timing signal T4 to pre-charge address lines 472.

Logic array 406 receives the timing pulse from timing signal T4 to turn off address evaluation transistors 440 as shift register output signals SO1-SO13 settle to valid shift register output signals SO1-SO13. If shift register 402 is initiated, one shift register output signal SO1-SO13 remains at a high voltage level after the timing pulse from timing signal T4. Logic array 406 receives the timing pulse from timing signal T5 to charge evaluation signal line 474 and turn on address evaluation transistor 440. The address transistor pair 446, 448, . . . 470 that receives the high voltage level shift register output signal SO1-SO13 are turned on to pull two of the seven address lines 472*a*-472*g* to low voltage levels. The two low voltage level address signals in address signals ~A1, ~A2, . . . ~A7 are used to enable firing cells 120 and firing cell subgroups for activation. The address signals ~A1, ~A2, . . . ~A7 become valid during the timing pulse from timing signal T5 and remain valid until the timing pulse from timing signal T3 in the next series of six timing pulses.

If shift register 402 is not initiated, all shift register output lines 410 are discharged to provide low voltage level shift register output signals SO1-SO13. The low voltage level shift register output signals SO1-SO13 turns off address transistor pairs 446, 448, . . . 470 and address lines 472 remain charged to provide high voltage level address signals ~A1, ~A2, . . . ~A7. The high voltage level address signals ~A1, ~A2, . . . ~A7 prevent firing cells 120 and firing cell subgroups from being enabled for activation.

While FIG. 9 describes one embodiment of an address circuit, other embodiments employing different logic elements and components may be utilized. For example, a controller that receives the above described input signals, e.g. signal T1-T6 and that provides address signals ~A1, ~A2, . . . ~A7 may be utilized.

Figure 10A:
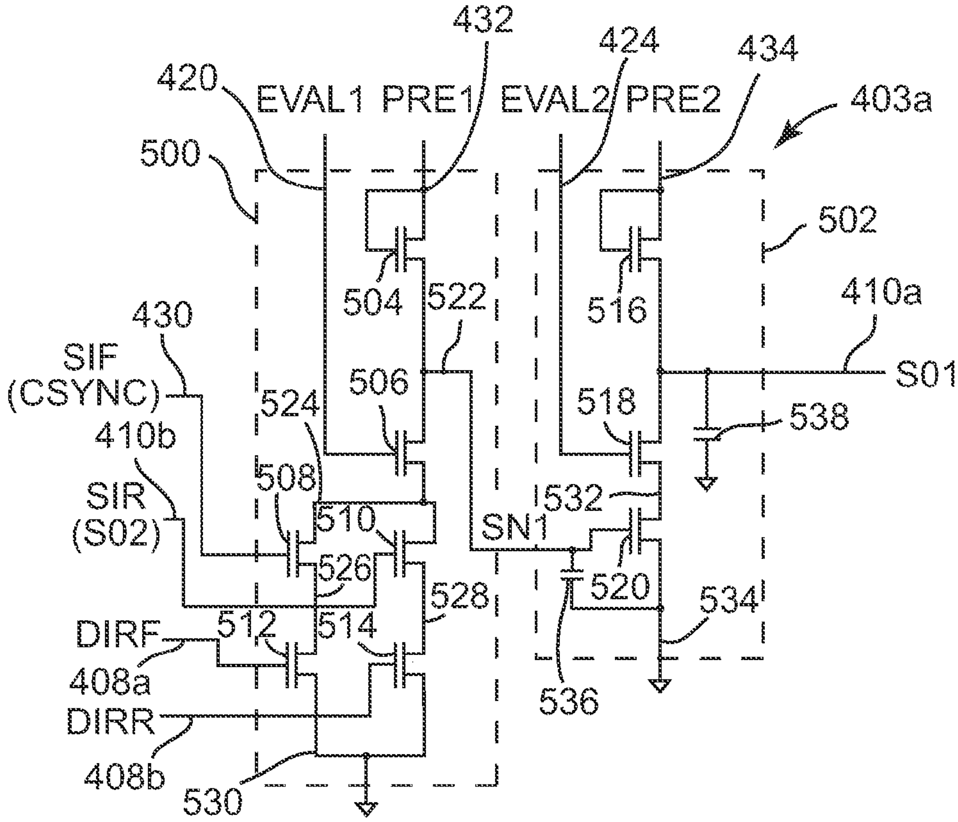
FIG. 10A is a diagram illustrating one shift register cell in a shift register.

FIG. 10A is a diagram illustrating one shift register cell 403*a* in shift register 402. Shift register 402 includes thirteen shift register cells 403*a*-403*m* that provide the thirteen shift register output signals SO1-SO13. Each shift register cell 403*a*-403*m* provides one of the shift register output signals SO1-SO13 and each shift register cell 403*a*-403*m* is similar to shift register cell 403*a*. The thirteen shift register cells 403 are electrically coupled in series to provide shifting in the forward and reverse directions. In other embodiments, shift register 402 can include any suitable number of shift register cells 403 to provide any suitable number of shift register output signals.

The shift register cell 403*a* includes a first stage that is an input stage, indicated with dashed lines at 500, and a second stage that is an output stage, indicated with dashed lines at 502. The first stage 500 includes a first pre-charge transistor 504, a first evaluation transistor 506, a forward input transistor 508, a reverse input transistor 510, a forward direction transistor 512 and a reverse direction transistor 514. The second stage 502 includes a second pre-charge transistor 516, a second evaluation transistor 518 and an internal node transistor 520.

In the first stage 500, the gate and one side of the drain-source path of first pre-charge transistor 504 is electrically coupled to timing signal line 432. The timing signal line 432 provides timing signal T1 to shift register 402 as first pre-charge signal PRE1. The other side of the drain-source path of first pre-charge transistor 504 is electrically coupled to one side of the drain-source path of first evaluation transistor 506 and the gate of internal node transistor 520 through internal node 522. The internal node 522 provides shift register internal node signal SN1 between stages 500 and 502 to the gate of internal node transistor 520.

The gate of first evaluation transistor 506 is electrically coupled to first evaluation signal line 420. The first evaluation signal line 420 provides the reduced voltage level T2 timing signal to shift register 402 as first evaluation signal EVAL1. The other side of the drain-source path of first evaluation transistor 506 is electrically coupled to one side of the drain-source path of forward input transistor 508 and one side of the drain-source path of reverse input transistor 510 through internal path 524.

The other side of the drain-source path of forward input transistor 508 is electrically coupled to one side of the drain-source path of forward direction transistor 512 at 526, and the other side of the drain-source path of reverse input transistor 510 is electrically coupled to one side of the drain-source path of reverse direction transistor 514 at 528. The drain-source paths of forward direction transistor 512 and reverse direction transistor 514 are electrically coupled to a reference, such as ground, at 530.

The gate of the forward direction transistor 512 is electrically coupled to direction line 408*a* that receives the forward direction signal DIRF from direction circuit 404. The gate of the reverse direction transistor 514 is electrically coupled to direction line 408*b* that receives the reverse direction signal DIRR from direction circuit 404.

In the second stage 502, the gate and one side of the drain-source path of second pre-charge transistor 516 are electrically coupled to timing signal line 434. The timing signal line 434 provides timing signal T3 to shift register 402 as second pre-charge signal PRE2. The other side of the drain-source path of second pre-charge transistor 516 is electrically coupled to one side of the drain-source path of second evaluation transistor 518 and to shift register output line 410*a*. The other side of the drain-source path of second evaluation transistor 518 is electrically coupled to one side of the drain-source path of internal node transistor 520 at 532. The gate of second evaluation transistor 518 is electrically coupled to second evaluation signal line 424 to provide the reduced voltage level T4 timing signal to shift register 402 as second evaluation signal EVAL2. The gate of internal node transistor 520 is electrically coupled to internal node 522 and the other side of the drain-source path of internal node transistor 520 is electrically coupled to a reference, such as ground, at 534. The gate of the internal node transistor 520 includes a capacitance at 536 for storing the shift register cell internal node signal SN1. The shift register output signal line 410*a* includes a capacitance at 538 for storing the shift register output signal SO1.

Each shift register cell 403*a*-403*m* in the series of thirteen shift register cells 403 is similar to shift register cell 403*a*. The gate of the forward direction transistor 508 in each shift register cell 403*a*-403*m* is electrically coupled to the control line 430 or one of the shift register output lines 410*a*-410*l* to shift in the forward direction. The gate of the reverse direction transistor 510 in each shift register cell 403*a*-403*m* is electrically coupled to the control line 430 or one of the shift register output lines 410*b*-410*m* to shift in the reverse direction. The shift register output signal lines 410 are electrically coupled to one forward transistor 508 and one reverse transistor 510, except for shift register output signal lines 410*a* and 410*m*. Shift register output signal line 410*a* is electrically coupled to a forward direction transistor 508 in shift register cell 403*b*, but not a reverse direction transistor 510. Shift register output signal line 410*m* is electrically coupled to a reverse direction transistor 510 in shift register cell 403*l*, but not a forward direction transistor 508.

The shift register cell 403*a* is the first shift register 403 in the series of thirteen shift registers 403 as shift register 402 shifts in the forward direction. The gate of forward input transistor 508 in shift register cell 403*a* is electrically coupled to control signal line 430 to receive control signal CSYNC. The second shift register cell 403*b* includes the gate of the forward input transistor electrically coupled to shift register output line 410*a* to receive shift register output signal SO1. The third shift register cell 403*c* includes the gate of the forward input transistor electrically coupled to shift register output line 410*b* to receive shift register output signal SO2. The fourth shift register cell 403*d* includes the gate of the forward input transistor electrically coupled to shift register output line 410*c* to receive shift register output signal SO3. The fifth shift register cell 403*e* includes the gate of the forward input transistor electrically coupled to shift register output line 410*d* to receive shift register output signal SO4. The sixth shift register cell 403*f* includes the gate of the forward input transistor electrically coupled to shift register output line 410*e* to receive shift register output signal SO5. The seventh shift register cell 403*g* includes the gate of the forward input transistor electrically coupled to shift register output line 410*f* to receive shift register output signal SO6. The eighth shift register cell 403*h* includes the gate of the forward input transistor electrically coupled to shift register output line 410*g* to receive shift register output signal SO7. The ninth shift register cell 403*i* includes the gate of the forward input transistor electrically coupled to shift register output line 410*h* to receive shift register output signal SO8. The tenth shift register cell 403*j* includes the gate of the forward input transistor electrically coupled to shift register output line 410*i* to receive shift register output signal SO9. The eleventh shift register cell 403*k* includes the gate of the forward input transistor electrically coupled to shift register output line 410*j* to receive shift register output signal SO10. The twelfth shift register cell 4031 includes the gate of the forward input transistor electrically coupled to shift register output line 410*k* to receive shift register output signal SO11. The thirteenth shift register cell 403*m* includes the gate of the forward input transistor electrically coupled to shift register output line 410*l* to receive shift register output signal SO12.

The shift register cell 403*a* is the last shift register cell 403 in the series of thirteen shift register cells 403 as shift register 402 shifts in the reverse direction. The gate of reverse input transistor 510 in shift register cell 403*a* is electrically coupled to the preceding shift register output line 410*b* to receive shift register output signal SO2. The shift register cell 403*b* includes the gate of the reverse input transistor electrically coupled to shift register output line 410*c* to receive shift register output signal SO3. The shift register cell 403*c* includes the gate of the reverse input transistor electrically coupled to shift register output line 410*d* to receive shift register output signal SO4. The shift register cell 403*d* includes the gate of the reverse input transistor electrically coupled to shift register output line 410*e* to receive shift register output signal SO5. The shift register cell 403*e* includes the gate of the reverse input transistor electrically coupled to shift register output line 410*f* to receive shift register output signal SO6. The shift register cell 403*f* includes the gate of the reverse input transistor electrically coupled to shift register output line 410*g* to receive shift register output signal SO7. The shift register cell 403*g* includes the gate of the reverse input transistor electrically coupled to shift register output line 410*h* to receive shift register output signal SO8. The shift register cell 403*h* includes the gate of the reverse input transistor electrically coupled to shift register output line 410*i* to receive shift register output signal SO9. The shift register cell 403*i* includes the gate of the reverse input transistor electrically coupled to shift register output line 410*j* to receive shift register output signal SO10. The shift register cell 403*j* includes the gate of the reverse input transistor electrically coupled to shift register output line 410*k* to receive shift register output signal SO11. The shift register cell 403*k* includes the gate of the reverse input transistor electrically coupled to shift register output line 410*l* to receive shift register output signal SO12. The shift register cell 403*l* includes the gate of the reverse input transistor electrically coupled to shift register output line 410*m* to receive shift register output signal SO13. The shift register cell 403*m* includes the gate of the reverse input transistor electrically coupled to control signal line 430 to receive control signal CSYNC. Shift register output lines 410*a*-410*m* are also electrically coupled to logic array 406.

Shift register 402 receives a control pulse in control signal CSYNC and provides a single high voltage level output signal. As described above and described in detail below, the shifting direction of shift register 402 is set in response to direction signals DIRF and DIRR, which are generated during timing pulses in timing signals T3-T6 based on the control signal CSYNC on control signal line 430. If shift register 402 is shifting in the forward direction, shift register 402 sets shift register output line 410*a* and shift register output signal SO1 to a high voltage level in response to the control pulse and timing pulses on timing signals T1-T4. If shift register 402 is shifting in the reverse direction, shift register 402 sets shift register output line 410*m* and shift register output signal SO13 to a high voltage level in response to the control pulse and timing pulses in timing signal T1-T4. The high voltage level output signal SO1 or SO13 is shifted through shift register 402 from one shift register cell 403 to the next shift register cell 403 in response to timing pulses in timing signals T1-T4.

The shift register 402 shifts in the control pulse and shifts the single high level output signal from one shift register cell 403 to the next shift register cell 403 using two pre-charge operations and two evaluate operations. The first stage 500 of each shift register cell 403 receives forward direction signal DIRF and reverse direction signal DIRR. Also, the first stage 500 of each shift register 403 receives a forward shift register input signal SIF and a reverse shift register input signal SIR. All shift register cells 403 in shift register 402 are set to shift in the same direction and at the same time as timing pulses are received in timing signals T1-T4.

The first stage 500 of each shift register cell 403 shifts in either the forward shift register input signal SIF or the reverse shift register input signal SIR. The high or low voltage level of the selected shift register input signal SIF or SIR is provided as the shift register output signal SO1-SO13. The first stage 500 of each shift register cell 403 pre-charges internal node 522 during a timing pulse from timing signal T1 and evaluates the selected shift register input signal SIF or SIR during a timing pulse from timing signal T2. The second stage 502 in each shift register cell 403 pre-charges shift register output lines 410*a*-410*m* during a timing pulse from timing signal T3 and evaluates the internal node signal SN (e.g., SN1) during a timing pulse from timing signal T4.

The direction signals DIRF and DIRR set the forward/reverse direction of shifting in shift register cell 403*a* and all other shift register cells 403 in shift register 402. Shift register 402 shifts in the forward direction if forward direction signal DIRF is at a high voltage level and reverse direction signal DIRR is at a low voltage level. Shift register 402 shifts in the reverse direction if reverse direction signal DIRR is at a high voltage level and forward direction signal DIRF is at a low voltage level. If both direction signals DIRF and DIRR are at low voltage levels, shift register 402 does not shift in either direction and all shift register output signals SO1-SO13 are cleared to inactive low voltage levels.

In operation of shifting shift register cell 403*a* in the forward direction, forward direction signal DIRF is set to a high voltage level and reverse direction signal DIRR is set to a low voltage level. The high voltage level forward direction signal DIRF turns on forward direction transistor 512 and the low voltage level reverse direction signal DIRR turns off reverse direction transistor 514. A timing pulse from timing signal T1 is provided to shift register 402 in first pre-charge signal PRE1 to charge internal node 522 to a high voltage level through first pre-charge transistor 504. Next, a timing pulse from timing signal T2 is provided to resistor divide network 412 and a reduced voltage level T2 timing pulse is provided to shift register 402 in first evaluation signal EVAL1. The timing pulse in first evaluation signal EVAL1 turns on first evaluation transistor 506. If the forward shift register input signal SIF is at a high voltage level, forward input transistor 508 is turned on and with forward direction transistor 512 already turned on, internal node 522 is discharged to provide a low voltage level internal node signal SN1. The internal node 522 is discharged through first evaluation transistor 506, forward input transistor 508 and forward direction transistor 512. If the forward shift register input signal SIF is at a low voltage level, forward input transistor 508 is turned off and internal node 522 remains charged to provide a high voltage level internal node signal SN1. Reverse shift register input signal SIR controls reverse input transistor 510. However, reverse direction transistor 514 is turned off such that internal node 522 cannot be discharged through reverse input transistor 510.

The internal node signal SN1 on internal node 522 controls internal node transistor 520. A low voltage level internal node signal SN1 turns off internal node transistor 520 and a high voltage level internal node signal SN1 turns on internal node transistor 520.

A timing pulse from timing signal T3 is provided to shift register 402 as second pre-charge signal PRE2. The timing pulse in second pre-charge signal PRE2 charges shift register output line 410*a* to a high voltage level through second pre-charge transistor 516. Next, a timing pulse from timing signal T4 is provided to a resistor divide network 414 and a reduced voltage level T4 timing pulse is provided to shift register 402 as second evaluation signal EVAL2. The timing pulse in second evaluation signal EVAL2 turns on second evaluation transistor 518. If internal node transistor 520 is off, shift register output line 410*a* remains charged to a high voltage level. If internal node transistor 520 is on, shift register output line 410*a* is discharged to a low voltage level. The shift register output signal SO1 is the high/low inverse of the internal node signal SN1, which was the high/low inverse of the forward shift register input signal SIF. The level of the forward shift register input signal SIF was shifted to the shift register output signal SO1.

In shift register cell 403*a*, the forward shift register input signal SIF is control signal CSYNC on control line 430. To discharge internal node 522 to a low voltage level, a control pulse in control signal CSYNC is provided at the same time as a timing pulse in first evaluation signal EVAL1. The control pulse in control signal CSYNC that is coincident with the timing pulse from timing signal T2 initiates shift register 402 for shifting in the forward direction.

In operation of shifting shift register cell 403*a* in the reverse direction, forward direction signal DIRF is set to a low voltage level and reverse direction signal DIRR is set to a high voltage level. The low voltage level forward direction signal DIRF turns off forward direction transistor 512 and the high voltage level reverse direction signal DIRR turns on reverse direction transistor 514. A timing pulse from timing signal T1 is provided in first pre-charge signal PRE1 to charge internal node 522 to a high voltage level through first pre-charge transistor 504. Next, a timing pulse from timing signal T2 is provided to resistor divide network 412 and a reduced voltage level T2 timing pulse is provided in first evaluation signal EVAL1. The timing pulse in first evaluation signal EVAL1 turns on first evaluation transistor 506. If the reverse shift register input signal SIR is at a high voltage level, reverse input transistor 510 is turned on, and with reverse direction transistor 514 already turned on, internal node 522 is discharged to provide a low voltage level internal node signal SN1. The internal node 522 is discharged through first evaluation transistor 506, reverse input transistor 510 and reverse direction transistor 514. If the reverse shift register input signal SIR is at a low voltage level, reverse input transistor 510 is turned off and internal node 522 remains charged to provide a high voltage level internal node signal SN1. Forward shift register input signal SIF controls forward input transistor 508. However, forward direction transistor 512 is turned off such that internal node 522 cannot be discharged through forward input transistor 508.

A timing pulse from timing signal T3 is provided in second pre-charge signal PRE2. The timing pulse in second pre-charge signal PRE2 charges shift register output line 410*a* to a high voltage level through second pre-charge resistor 516. Next a timing pulse from timing signal T4 is provided to resistor divide network 414 and a reduced voltage level T4 timing pulse is provided in second evaluation signal EVAL2. The timing pulse in second evaluation signal EVAL2 turns on second evaluation transistor 518. If internal node transistor 520 is off, shift register output line 410*a* remains charged to a high voltage level. If internal node transistor 520 is on, shift register output line 410*a* is discharged to a low voltage level. The shift register output signal SO1 is the high/low inverse of the internal node signal SN1, which was the high/low inverse of the reverse shift register input signal SIR. The level of the reverse shift register input signal SIR was shifted to the shift register output signal SO1.

In shift register cell 403*a*, the reverse shift register input signal SIR is shift register output signal SO2 on shift register output line 410*b*. In shift register cell 403*m*, the reverse shift register input signal SIR is control signal CSYNC on control line 430. To discharge internal node 522 in shift register cell 403*m* to a low voltage level, a control pulse in control signal CSYNC is provided at the same time as a timing pulse in the first evaluation signal EVAL1. The control pulse in control signal CSYNC that is coincident with the timing pulse from timing signal T2 initiates shift register 402 for shifting in the reverse direction from shift register cell 403*m* toward shift register cell 403*a*.

In operation of clearing shift register cell 403*a* and all shift register cells 403 in shift register 402, direction signals DIRF and DIRR are set to low voltage levels. A low voltage forward direction signal DIRF turns off forward direction transistor 512 and a low voltage level reverse direction signal DIRR turns off reverse direction transistor 514. A timing pulse from timing signal T1 is provided in first pre-charge signal PRE1 to charge internal node 522 and provide a high voltage level internal node signal SN1. A timing pulse from timing signal T2 is provided as a reduced voltage level T2 timing pulse in first evaluation signal EVAL1 to turn on first evaluation transistor 506. Both forward direction transistor 512 and reverse direction transistor 514 are turned off such that internal node 522 is not discharged through either forward input transistor 508 or reverse input transistor 510.

The high voltage level internal node signal SN1 turns on internal node transistor 520. A timing pulse from timing signal T3 is provided in second pre-charge signal PRE2 to charge shift register output signal line 410*a* and all shift register output signal lines 410. Next, a timing pulse from timing signal T4 is provided as a reduced voltage level T4 timing pulse in second evaluation signal EVAL2 to turn on second evaluation transistor 518. The shift register output line 410*a* is discharged through second evaluation transistor 518 and internal node transistor 520 to provide a low voltage level shift register output signal SO1. Also, all other shift register output lines 410 are discharged to provide inactive low voltage level shift register output signals SO2-SO13.

Figure 10B:
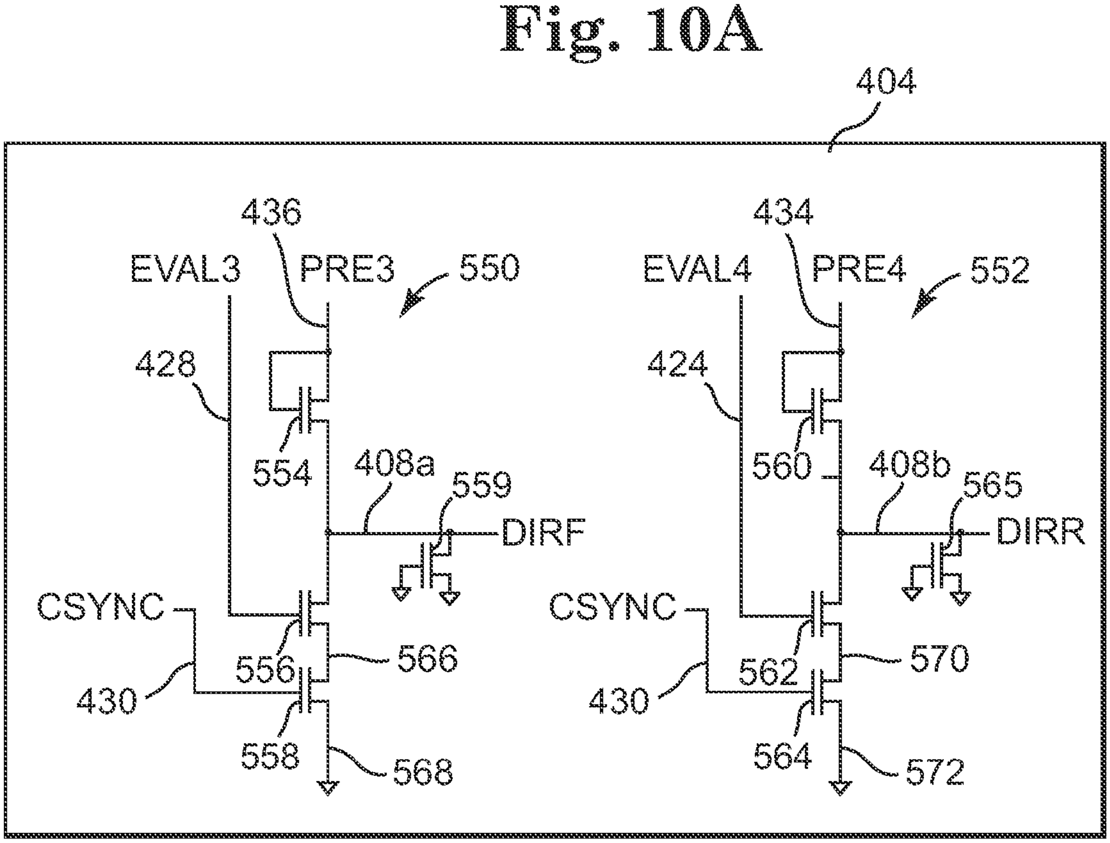
FIG. 10B is a diagram illustrating a direction circuit.

FIG. 10B is a diagram illustrating direction circuit 404. The direction circuit 404 includes a forward direction signal circuit 550 and a reverse direction signal circuit 552. The forward direction signal circuit 550 includes a third pre-charge transistor 554, a third evaluation transistor 556 and a first control transistor 558. The reverse direction signal circuit 552 includes a fourth pre-charge transistor 560, a fourth evaluation transistor 562 and a second control transistor 564.

The gate and one side of the drain-source path of third pre-charge transistor 554 are electrically coupled to timing signal line 436. The timing signal line 436 provides timing signal T5 to direction circuit 404 as third pre-charge signal PRE3. The other side of the drain-source path of third pre-charge transistor 554 is electrically coupled to one side of the drain-source path of third evaluation transistor 556 through direction signal line 408*a*. The direction signal line 408*a* provides the forward direction signal DIRF to the gate of the forward direction transistor in each shift register cell 403 in shift register 402, such as the gate of forward direction transistor 512 in shift register cell 403*a*. The gate of third evaluation transistor 556 is electrically coupled to the third evaluation signal line 428 that provides the reduced voltage level T6 timing signal to direction circuit 404. The other side of the drain-source path of third evaluation transistor 556 is electrically coupled to the drain-source path of control transistor 558 at 566. The drain-source path of control transistor 558 is also electrically coupled to a reference, such as ground, at 568. The gate of control transistor 558 is electrically coupled to control line 430 to receive control signal CSYNC.

The gate and one side of the drain-source path of fourth pre-charge transistor 560 are electrically coupled to timing signal line 434. The timing signal line 434 provides timing signal T3 to direction circuit 404 as fourth pre-charge signal PRE4. The other side of the drain-source path of fourth pre-charge transistor 560 is electrically coupled to one side of the drain-source path of fourth evaluation transistor 562 through direction signal line 408*b*. The direction signal line 408*b* provides the reverse direction signal DIRR to the gate of the reverse direction transistor in each shift register cell 403 in shift register 402, such as the gate of reverse direction transistor 514 in shift register cell 403*a*. The gate of fourth evaluation transistor 562 is electrically coupled to the fourth evaluation signal line 424 that provides the reduced voltage level T4 timing signal to direction circuit 404. The other side of the drain-source path of fourth evaluation transistor 562 is electrically coupled to the drain-source path of control transistor 564 at 570. The drain-source path of control transistor 564 is also electrically coupled to a reference, such as ground, at 572. The gate of control transistor 564 is electrically coupled to control line 430 to receive control signal CSYNC.

The direction signals DIRF and DIRR set the direction of shifting in shift register 402. If forward direction signal DIRF is set to a high voltage level and reverse direction signal DIRR is set to a low voltage level, forward direction transistors, such as forward direction transistor 512, are turned on and reverse direction transistors, such as reverse direction transistor 514, are turned off. Shift register 402 shifts in the forward direction. If forward direction signal DIRF is set to a low voltage level and reverse direction signal DIRR is set to a high voltage level, forward direction transistors, such as forward direction transistor 512, are turned off and reverse direction transistors, such as reverse direction transistor 514 are turned on. Shift register 402 shifts in the reverse direction. The direction signals DIRF and DIRR are set during each series of timing pulses from timing signal T3-T6 as shift register 402 actively shifts in either the forward or reverse direction. To terminate shifting or prevent shifting of shift register 402, direction signals DIRF and DIRR are set to low voltage levels. This clears the single high voltage level signal from the shift register output signals SO1-SO13, such that all shift register output signals SO1-SO13 are at low voltage levels. The low voltage level shift register output signals SO1-SO13 turn off all address transistor pairs 446, 448, . . . 470 and address signals ~A1, ~A2, . . . ~A7 remain at high voltage levels that do not enable firing cells 120.

In operation, timing signal line 434 provides a timing pulse from timing signal T3 to direction circuit 404 in fourth pre-charge signal PRE4. The timing pulse in fourth pre-charge signal PRE4 charges the reverse direction signal line 408*b* to a high voltage level. A timing pulse from timing signal T4 is provided to the resistor divide network 414 that provides a reduced voltage level T4 timing pulse to direction circuit 404 in fourth evaluation signal EVAL4. The timing pulse in fourth evaluation signal EVAL4 turns on fourth evaluation transistor 562. If a control pulse from control signal CSYNC is provided to the gate of control transistor 564 at the same time as the timing pulse in fourth evaluation signal EVAL4 is provided to fourth evaluation transistor 562, the reverse direction signal line 408*b* discharges to a low voltage level. If the control signal CSYNC remains at a low voltage level as the timing pulse in the fourth evaluation signal EVAL4 is provided to fourth evaluation transistor 562, the reverse direction signal line 408*b* remains charged to a high voltage level.

Timing signal line 436 provides a timing pulse from timing signal T5 to direction circuit 404 in third pre-charge signal PRE3. The timing pulse in third pre-charge signal PRE3 charges the forward direction signal line 408*a* to a high voltage level. A timing pulse from timing signal T6 is provided to resistor divide network 416 that provides a reduced voltage level T6 timing pulse to direction circuit 404 in third evaluation circuit EVAL3. The timing pulse in third evaluation signal EVAL3 turns on third evaluation transistor 556. If a control pulse from control signal CSYNC is provided to the gate of control transistor 558 at the same time as the timing pulse in third evaluation signal EVAL3 is provided to third evaluation transistor 556, the forward direction signal line 408*a* discharges to a low voltage level. If the control signal CSYNC remains at a low voltage level as the timing pulse in the third evaluation signal EVAL3 is provided to third evaluation transistor 556, the forward direction signal line 408*a* remains charged to a high voltage level.

Figure 11:
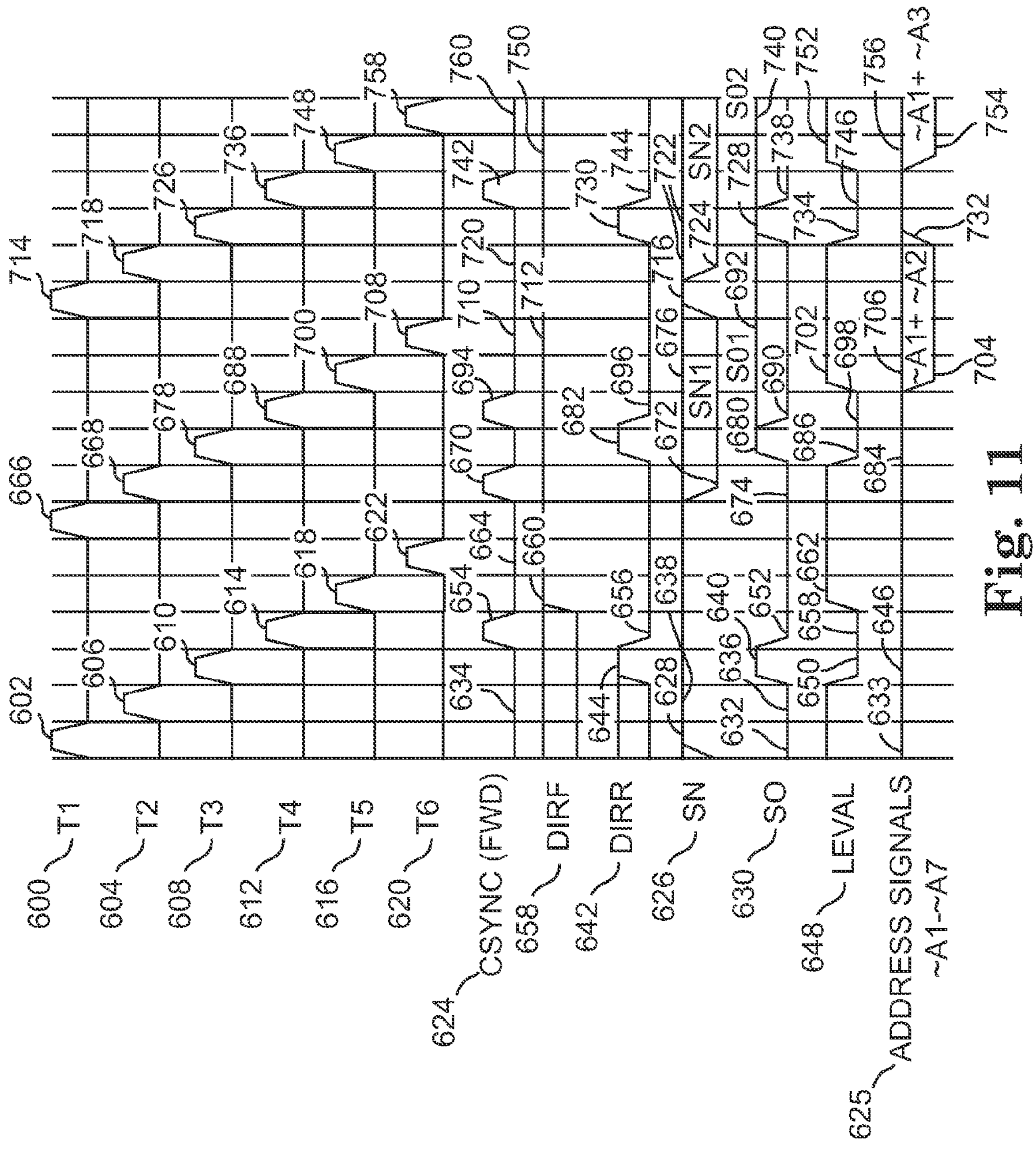
FIG. 11 is a timing diagram illustrating operation of an address generator in the forward direction.

FIG. 11 is a timing diagram illustrating operation of address generator 400 in the forward direction. The timing signals T1-T6 provide a series of six repeating pulses. Each of the timing signals T1-T6 provides one pulse in the series of six pulses.

In one series of six pulses, timing signal T1 at 600 includes timing pulse 602, timing signal T2 at 604 includes timing pulse 606, timing signal T3 at 608 includes timing pulse 610, timing signal T4 at 612 includes timing pulse 614, timing signal T5 at 616 includes timing pulse 618 and timing signal T6 at 620 includes timing pulse 622. The control signal CSYNC at 624 includes control pulses that set the direction of shifting in shift register 402 and initiate shift register 402 for generating address signals ~A1, ~A2, . . . ~A7, indicated at 625.

The timing pulse 602 of timing signal T1 at 600 is provided to shift register 402 in first pre-charge signal PRE1. During timing pulse 602, internal node 522, in each of the shift register cells 403*a*-403*m*, charges to provide high voltage level internal node signals SN1-SN13. All shift register internal node signals SN, indicated at 626, are set to high voltage levels at 628. The high voltage level internal node signals SN 626 turn on the internal node transistor 520 in each of the shift register cells 403*a*-403*m*. In this example, the series of six timing pulses has been provided prior to timing pulse 602 and shift register 402 has not been initiated, such that all shift register output signals SO, indicated at 630, are discharged to low voltage levels, indicated at 632 and all address signals ~A1, ~A2, . . . ~A7 at 625 remain at high voltage levels, indicated at 633.

The timing pulse 606 of timing signal T2 at 604 is provided to shift register 402 in first evaluation signal EVAL1. Timing pulse 606 turns on the first evaluation transistor 506 in each of the shift register cells 403*a*-403*m*. While control signal CSYNC 624 remains at a low voltage level at 634 and all shift register output signals SO 630 remain at low voltage levels at 636, forward input transistor 508 and reverse input transistor 510 in each of the shift register cells 403*a*-403*m* are off. The non-conducting forward input transistors 508 and non-conducting reverse input transistors 510 prevent the internal node 522 in each of the shift register cells 403*a*-403*m* from discharging to a low voltage level. All shift register internal node signals SN 626 remain at high voltage levels at 638.

The timing pulse 610 of timing signal T3 at 608 is provided to shift register 402 in second pre-charge signal PRE2, to direction circuit 404 in fourth pre-charge signal PRE4 and to address line pre-charge transistors 438 and evaluation prevention transistor 422*a* in logic array 406. During timing pulse 610 in second pre-charge signal PRE2, all shift register output signals SO 630 charge to high voltage levels at 640. Also, during timing pulse 610 in fourth pre-charge signal PRE4, reverse direction signal DIRR 642 charges to a high voltage level at 644. In addition, timing pulse 610 charges all address signals 625 to high voltage levels at 646 and turns on evaluation prevention transistor 422*a* to pull logic evaluation signal LEVAL 648 to a low voltage level at 650.

Timing pulse 614 of timing signal T4 at 612 is provided to shift register 402 in second evaluation signal EVAL2, to direction circuit 404 in fourth evaluation signal EVAL4 and to evaluation prevention transistor 422*b* in logic array 406. The timing pulse 614 in second evaluation signal EVAL2 turns on second evaluation transistor 518 in each of the shift register cells 403*a*-403*m*. With the internal node signals SN 626 at high voltage levels having turned on internal node transistor 520 in each of the shift register cells 403*a*-403*m*, all shift register output signals SO 630 discharge to low voltage levels at 652. Also, timing pulse 614 in fourth evaluation signal EVAL4 turns on fourth evaluation transistor 562. A control pulse at 654 of control signal CSYNC 624 turns on control transistor 564. With fourth evaluation transistor 562 and control transistor 564 turned on, direction signal DIRR 642 is discharged to a low voltage level at 656. In addition, timing pulse 614 turns on evaluation prevention transistor 442*b* to hold logic evaluation signal LEVAL 648 at a low voltage level at 658. The low voltage level logic evaluation signal LEVAL 648 turns off address evaluation transistors 440.

Timing pulse 618 of timing signal T5 at 616 is provided to direction circuit 404 in third pre-charge signal PRE3 and to logic evaluation pre-charge transistor 444 in logic array 406. During timing pulse 618 in third pre-charge signal PRE3, forward direction signal DIRF 658 charges to a high voltage level at 660. The high voltage level forward direction signal DIRF 658 turns on forward direction transistor 512 in each of the shift register cells 403*a*-403*m* to set up shift register 402 for shifting in the forward direction. Also, during timing pulse 618, logic evaluation signal LEVAL 648 charges to a high voltage level at 662, which turns on all logic evaluation transistors 440. With all shift register output signals SO 630 at low voltage levels, all address transistor pairs 446, 448, . . . 470 are turned off and all address signals ~A1, ~A2, . . . ~A7 at 625 remain at high voltage levels.

Timing pulse 622 from timing signal T6 at 620 is provided to direction circuit 404 as third evaluation signal EVAL3. The timing pulse 622 turns on third evaluation transistor 556. Since control signal CSYNC 624 remains at a low voltage level at 664, control transistor 558 turns off and forward direction signal DIRF 658 remains at a high voltage level. The high voltage level forward direction signal DIRF 658 and low voltage level reverse direction signal DIRR 642 set up each of the shift register cells 403*a*-403*m* for shifting in the forward direction.

In the next series of six timing pulses, timing pulse 666 charges all internal node signals SN 626 to high voltage levels. Timing pulse 668 turns on the first evaluation transistor 506 in each of the shift register cells 403*a*-403*m*. Control signal CSYNC 624 provides a control pulse at 670 to forward input transistor 508 in shift register cell 403*a*. With forward direction transistor 512 already turned on, internal node signal SN1 in shift register cell 403*a* discharges to a low voltage level, indicated at 672. The shift register output signals SO 630 are at low voltage levels at 674, which turns off the forward input transistor in shift register cells 403*b*-403*m*. With the forward input transistors off, each of the other internal node signals SN2-SN13 in shift register cells 403*b*-403*m* remain at high voltage levels, indicated at 676.

During timing pulse 678, all shift register output signals SO 630 are charged to high voltage levels at 680 and reverse direction signal DIRR 642 is charged to a high voltage level at 682. In addition, during timing pulse 678 all address signals ~A1, ~A2, . . . ~A7 625 are charged to high voltage levels at 684 and logic evaluation signal LEVAL 648 is discharged to a low voltage level at 686. The low voltage level logic evaluation signal LEVAL 648 turns off address evaluation transistors 440, which prevents address transistor pairs 446, 448, . . . 470 from pulling address signals ~A1, ~A2, . . . ~A7 625 to low voltage levels.

During timing pulse 688, shift register output signals SO2-SO13 discharge to low voltage levels at 690. Shift register output signal SO1 remains at a high voltage level, indicated at 692, due to internal node signal SN1 at 672 turning off internal node transistor 520 of shift register cell 403*a*. Also, timing pulse 688 turns on second evaluation transistor 562 and control pulse 694 turns on control transistor 564 to discharge reverse direction signal DIRR 642 to a low voltage level at 696. In addition, timing pulse 688 turns on evaluation prevention transistor 442*b* to pull logic evaluation signal LEVAL 648 to a low voltage level at 698 and keep evaluation transistors 440 turned off.

During timing pulse 700 forward direction signal DIRF 658 is maintained at a high voltage level and logic evaluation signal LEVAL 648 to is charged to a high voltage level at 702. The high voltage level logic evaluation signal LEVAL 648 at 702 turns on evaluation transistors 440. The high level shift register output signal SO1 at 692 turns on address transistor pairs 446*a* and 446*b* and address signals ~A1 and ~A2 at 625 are actively pulled to low voltage levels at 704. The other shift register output signals SO2-SO13 are pulled to low voltage levels at 690, such that address transistors 448, 450, . . . 470 are turned off and address signals ~A3-~A7 remain at high voltage levels, indicated at 706. The address signals ~A1, ~A2, . . . ~A7 at 625 become valid during timing pulse 700 in timing signal T5 at 616. Timing pulse 708 turns on third evaluation transistor 556. However, control signal CSYNC 624 is at a low voltage level at 710 and forward direction signal DIRF 658 remains at a high voltage level at 712.

In the next series of six timing pulses, timing pulse 714 charges all internal node signals SN 626 to high voltage levels at 716. Timing pulse 718 turns on first evaluation transistor 506 in each of the shift register cells 403*a*-403*m* to allow discharge of node 522, if the forward input signal SIF at each of the shift register cells 403*a*-403*m* is in a high voltage level. The forward input signal SIF at shift register cell 403*a* is the control signal CSYNC 624, which is at a low voltage level at 720. The forward input signal SIF at each of the other shift register cells 403*b*-403*m* is the shift register output signal SO 630 of the preceding shift register cell 403. The shift register output signal SO1 is in a high voltage level at 692 and is the forward input signal SIF of second shift register cell 403*b*. The shift register output signals SO2-SO13 are all at low voltage levels at 690.

Shift register cells 403*a* and 403*c*-403*m* receive low voltage level forward input signals SIF that turn off forward input transistor 508 in each of the shift register cells 403*a* and 403*c*-403*m*, such that internal node signals SN1 and SN3-SN13 remain high at 722. Shift register cell 403*b* receives the high voltage level shift register output signal SO1 as a forward input signal SIF that turns on the forward input transistor to discharge internal node signal SN2 at 724.

During timing pulse 726 all shift register output signals SO 630 are charged to high voltage levels at 728 and reverse direction signal DIRR 642 to a high voltage level at 730. Also, timing pulse 726 charges all address signals ~A1, ~A2, . . . ~A7 625 toward a high voltage level at 732 and turns on evaluation prevention transistor 442*a* to pull LEVAL 648 to a low voltage level at 734.

The address signals ~A1, ~A2, . . . ~A7 625 were valid from the time address signals ~A1 and ~A2 were pulled low at 704, until all address signals ~A1, ~A2, . . . ~A7 625 are pulled high at 732. The address signals ~A1, ~A2, . . . ~A7 625 are valid during the timing pulse 708 from timing signal T6 at 620 of the preceding series of six timing pulses and the timing pulses 714 and 718 from timing signals T1 at 600 and T2 at 604 of the present series of six timing pulses.

Timing pulse 736 turns on second evaluation transistor 518 in each of the shift register cells 403*a*-403*m* to evaluate internal node signals SN 626. Internal node signals SN1 and SN3-SN13 are at high voltage levels at 722 and discharge shift register output signals SO1 and SO3-SO13 to low voltage levels at 738. Internal node signal SN2 is at a low voltage level at 724 that turns off the internal node transistor of shift register cell 403*b* and maintains shift register output signal SO2 at a high voltage level at 740.

When fourth evaluation transistor 562 is turned on, by timing pulse 736, and control pulse 742 in CSYNC 624 turns on control transistor 564, reverse direction signal DIRR 642 discharges to a low voltage level at 744. The direction signals DIRR 642 and DIRF 658 are set during each series of six timing pulses. In addition, timing pulse 736 turns on evaluation prevention transistor 442*b* to maintain LEVAL 648 at a low voltage level at 746.

During timing pulse 748 forward direction signal DIRF 658 is maintained at a high voltage level at 750 and LEVAL 648 charges to a high voltage level at 752. The high voltage level logic evaluation signal LEVAL 678 at 752 turns on evaluation transistors 440. The high voltage level shift register output signal SO2 at 740 turns on address transistors 448*a* and 448*b* to pull address signals ~A1 and ~A3 to low voltage levels at 754. The other address signals ~A2 and ~A4-~A7 are maintained at high voltage levels at 756.

Timing pulse 758 turns on third evaluation transistor 556. Control signal CSYNC 624 remains at a low voltage level at 760 to turn off control transistor 558 and maintain forward direction signal DIRF 642 at a high voltage level.

The next series of six timing pulses shifts the high voltage level shift register output signal SO2 to the next shift register cell 403*c* that provides a high voltage level shift register output signal SO3. Shifting continues with each series of six timing pulses until each shift register output signal SO1-SO13 has been high once. After shift register output signal SO13 has been high, the series of high voltage level shift register output signals SO 630 stops. The shift register 402 can be initiated again by providing a control pulse in control signal CSYNC, such as control pulse 670, coincident with a timing pulse from timing signal T2 at 604.

In forward direction operation, a control pulse in control signal CSYNC 624 is provided coincident with a timing pulse from timing signal T4 at 612 to set the direction of shifting to the forward direction. Also, a control pulse from control signal CSYNC 624 is provided coincident with a timing pulse from timing signal T2 at 604 to start or initiate the shift register 402 shifting a high voltage signal through the shift register output signals SO1-SO13.

Figure 12:
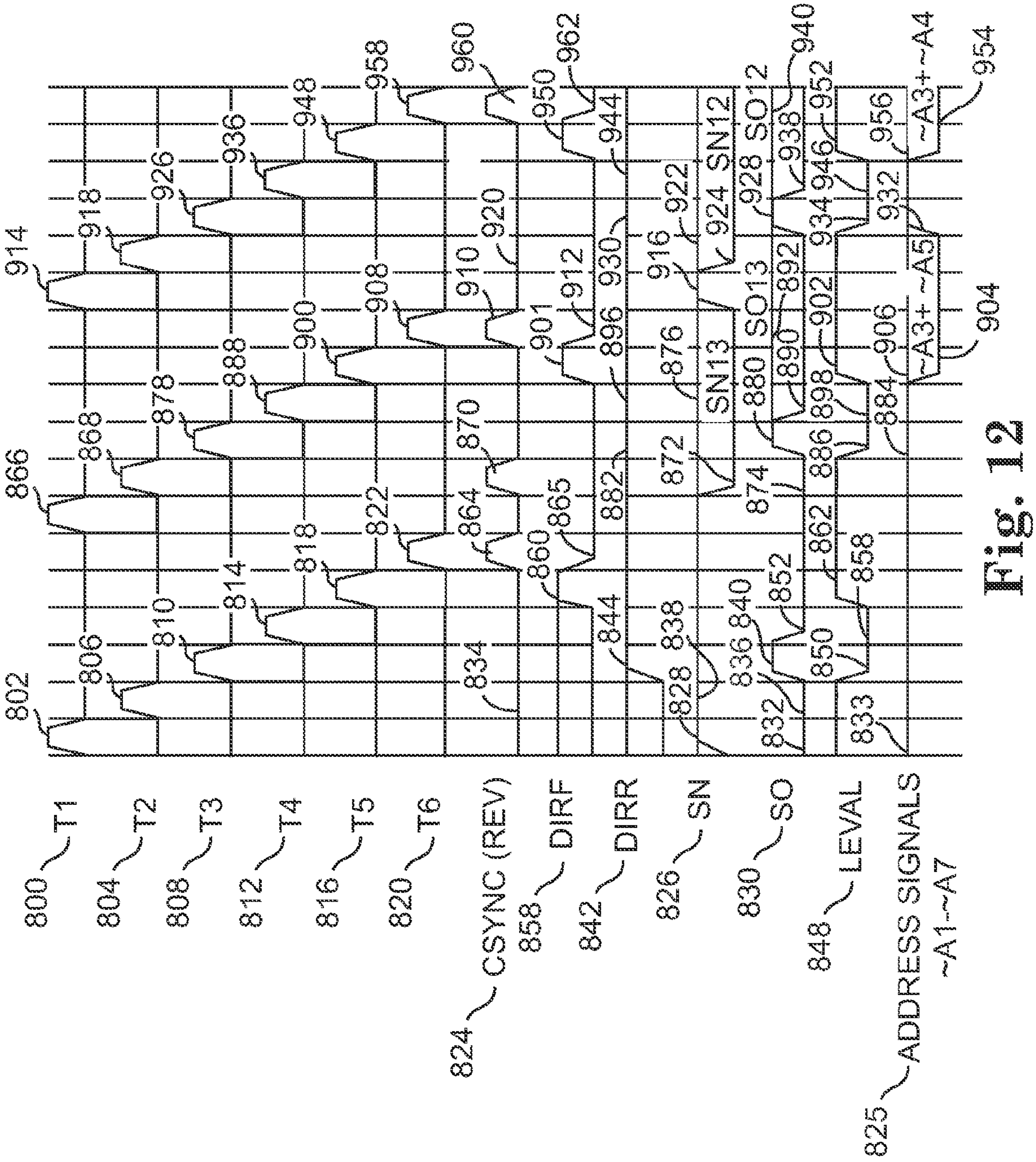
FIG. 12 is a timing diagram illustrating operation of an address generator in the reverse direction.

FIG. 12 is a timing diagram illustrating operation of address generator 400 in the reverse direction. The timing signals T1-T6 provide the repeating series of six pulses. Each of the timing signals T1-T6 provides one pulse in a series of six pulses. In one series of six pulses, timing signal T1 at 800 includes timing pulse 802, timing signal T2 at 804 includes timing pulse 806, timing signal T3 at 808 includes timing pulse 810, timing signal T4 at 812 includes timing pulse 814, timing signal T5 at 816 includes timing pulse 818 and timing signal T6 at 820 includes timing pulse 822. The control signal CSYNC at 824 includes control pulses that set the direction of shifting in shift register 402 and initiate shift register 402 for generating address signals ~A1, ~A2, . . . ~A7, indicated at 825.

The timing pulse 802 is provided to shift register 402 in first pre-charge signal PRE1. During timing pulse 802, internal node 522 in each of the shift register cells 403*a*-403*m* charges to provide corresponding high voltage level internal node signals SN1-SN13. Shift register internal node signals SN 826 are set to high voltage levels at 828. The high voltage level internal node signals SN 826 turn on the internal node transistors 520 in shift register cells 403. In this example, a series of six timing pulses has been provided prior to timing pulse 802 and without initiating shift register 402, such that all shift register output signals SO 830 are discharged to low voltage levels, indicated at 832 and all address signals ~A1, ~A2, . . . ~A7 at 825 remain at high voltage levels, indicated at 833.

The timing pulse 806 is provided to shift register 402 in first evaluation signal EVAL1. Timing pulse 806 turns on the first evaluation transistor 506 in each of the shift register cells 403*a*-403*m*. The control signal CSYNC 824 remains at a low voltage level at 834 and all shift register output signals SO 830 remain at low voltage levels at 836 to turn off the forward input transistor 508 and reverse input transistor 510 in each of the shift register cells 403*a*-403*m*. The non-conducting forward and reverse input transistors 508 and 510 prevent the internal node 522 in each of the shift register cells 403*a*-403*m* from discharging to a low voltage level. All shift register internal node signals SN 826 remain at high voltage levels at 838.

The timing pulse 810 is provided to shift register 402 in second pre-charge signal PRE2, to direction circuit 404 in fourth pre-charge signal PRE4 and to address line pre-charge transistors 438 and evaluation prevention transistor 422*a* in logic array 406. During timing pulse 810, all shift register output signals SO 830 are charged to high voltage levels at 840. Also, during timing pulse 810, reverse direction signal DIRR 842 charges to a high voltage level at 844. In addition, timing pulse 810 maintains all address signals 825 at high voltage levels and turns on evaluation prevention transistor 422*a* to pull logic evaluation signal LEVAL 848 to a low voltage level at 850.

Timing pulse 814 is provided to shift register 402 in second evaluation signal EVAL2, to direction circuit 404 in fourth evaluation signal EVAL4 and to evaluation prevention transistor 422*b* in logic array 406. Timing pulse 814 turns on the second evaluation transistor 518 in each of the shift register cells 403*a*-403*m*. With internal node signals SN 826 at high voltage levels that turn on internal node transistor 520 in each of the shift register cells 403*a*-403*m*, all shift register output signals SO 830 discharge to low voltage levels at 852. Also, timing pulse 814 turns on fourth evaluation transistor 562 and control signal CSYNC 824 provides a low voltage to turn off control transistor 564. With control transistor 564 turned off, reverse direction signal DIRR 842 remains charged to a high voltage level. In addition, timing pulse 814 turns on evaluation prevention transistor 442*b* to hold logic evaluation signal LEVAL 848 at a low voltage level at 858. The low voltage level logic evaluation signal LEVAL 848 turns off address evaluation transistors 440.

Timing pulse 818 is provided to direction circuit 404 in third pre-charge signal PRE3 and to logic evaluation pre-charge transistor 444 in logic array 406. During timing pulse 818, forward direction signal DIRF 858 charges to a high voltage level at 860. Also, during timing pulse 818 logic evaluation signal LEVAL 848 charges to a high voltage level at 862 to turn on all logic evaluation transistors 440. With all shift register output signals SO 830 at low voltage levels, all address transistor pairs 446, 448, . . . 470 are turned off and all address signals ~A1, ~A2, . . . ~A7 at 825 remain at high voltage levels.

Timing pulse 822 is provided to direction circuit 404 as third evaluation signal EVAL3. The timing pulse 822 turns on third evaluation transistor 556. The control signal CSYNC 824 provides a control pulse 864 to turn on control transistor 558 and forward direction signal DIRF 858 is discharged to a low voltage level at 865. The low voltage level forward direction signal DIRF 858 and high voltage level reverse direction signal DIRR 842 set each of the shift register cells 403*a*-403*m* for shifting in the reverse direction.

In the next series of six timing pulses, during timing pulse 866, all internal node signals SN 826 are charged to high voltage levels. Timing pulse 868 turns on the first evaluation transistor 506 in each of the shift register cells 403*a*-403*m*. A control pulse 870, which may be in control signal CSYNC, is provided to turn on the reverse input transistor in shift register cell 403*m* and with the reverse direction transistor turned on, internal node signal SN13 discharges to a low voltage level, indicated at 872. The shift register output signals SO 830 are at low voltage levels at 874, which turns off the reverse input transistor in shift register cells 403*a*-403*l*. With the reverse input transistors off, each of the other internal node signals SN1-SN12 remain at high voltage levels, indicated at 876.

During timing pulse 878, all shift register output signals SO 830 are charged to high voltage levels at 880 and reverse direction signal DIRR 842 is maintained at a high voltage level at 882. In addition, timing pulse 878 maintains all address signals ~A1, ~A2, . . . ~A7 825 at high voltage levels at 884 and pulls logic evaluation signal LEVAL 848 to a low voltage level at 886. The low voltage level logic evaluation signal LEVAL 848 turns off evaluation transistors 440, which prevents address transistor pairs 446, 448, . . . 470 from pulling address signals ~A1, ~A2, . . . ~A7 825 to low voltage levels.

During timing pulse 888, shift register output signals SO1-SO12 are discharged to low voltage levels at 890. Shift register output signal SO13 remains at a high voltage level, indicated at 892, based on the low voltage level internal node signal SN13 at 872 that turns off internal node transistor 520 of shift register cell 403*m*. Also, timing pulse 888 turns on second evaluation transistor and control signal CSYNC 824 turns off control transistor 564 to maintain reverse direction signal DIRR 842 at a high voltage level at 896. In addition, timing pulse 888 turns on evaluation prevention transistor 442*b* to hold logic evaluation signal LEVAL 848 at a low voltage level at 898 and keep evaluation transistors 440 turned off. Shift register output signals SO 830 settle during timing pulse 888, such that one shift register output signal SO13 is at a high voltage level and all other shift register output signals SO1-SO12 are at low voltage levels.

During timing pulse 900, forward direction signal DIRF 858 charges to a high voltage level at 901 and logic evaluation signal LEVAL 848 charges to a high voltage level at 902. The high voltage level logic evaluation signal LEVAL 848 at 902 turns on evaluation transistors 440. The high voltage level shift register output signal SO13 at 892 turns on address transistors 470*a* and 470*b* and address signals ~A3 and ~A5 are actively pulled to low voltage levels, indicated at 904. The other shift register output signals SO1-SO12 are pulled to low voltage levels at 890, such that address transistor pairs 446, 448, . . . 468 are turned off and address signals ~A1, ~A2, ~A4, ~A6 and ~A7 remain at high voltage levels, indicated at 906. The address signals ~A1, ~A2, . . . ~A7 825 become valid during timing pulse 900. Timing pulse 908 turns on third evaluation transistor 556 and a control pulse 910 in control signal CSYNC 824 turns on control transistor 558 to discharge the forward direction signal DIRF 858 to a low voltage at 912.

In the next series of six timing pulses, during timing pulse 914 all internal node signals SN 826 are charged to high voltage levels at 916. Timing pulse 918 turns on first evaluation transistor 506 in each of the shift register cells 403*a*-403*m* to discharge node 522 if the reverse input signal SIR at each of the shift register cells 403*a*-403*m* is at a high voltage level. The reverse input signal SIR at shift register cell 403*m* is the control signal CSYNC 824, which is at a low voltage level at 920. The reverse input signal SIR at each of the other shift register cells 403*a*-403*l* is the shift register output signal SO 830 of the following shift register cell 403. The shift register output signal SO13 is at a high voltage level at 892 and is the reverse input signal SIR of shift register cell 403*l*. The shift register output signals SO1-SO12 are all at low voltage levels at 890. Shift register cells 403*a*-403*k* and 403*m* have low voltage level reverse input signals SIR that turn off reverse input transistor 510, such that internal node signals SN1-SN11 and SN13 remain at high voltage levels at 922. Shift register cell 403*l* receives the high voltage level shift register output signal SO13 as the reverse input signal SIR that turns on the reverse input transistor to discharge internal node signal SN12 at 924.

During timing pulse 926, all shift register output signals SO 830 are charged to high voltage levels at 928 and reverse direction signal DIRR 842 is maintained at a high voltage level at 930. Also, during timing pulse 926 all address signals ~A1, ~A2, . . . ~A7 825 are charged to a high voltage level at 932 and evaluation prevention transistor 442*a* is turned on to pull LEVAL 848 to a low voltage level at 934. The address signals ~A1, ~A2, . . . ~A7 825 were valid from the time address signals ~A3 and ~A5 were pulled low at 904 until all address signals ~A1, ~A2, . . . ~A7 825 are pulled high at 932. The address signals ~A1, ~A2, . . . ~A7 825 are valid during the timing pulses 908, 914 and 918.

Timing pulse 936 turns on second evaluation transistor 518 in each of the shift register cells 403*a*-403*m* to evaluate the internal node signals SN 826. Internal node signals SN1-SN11 and SN13 are at high voltage levels at 922 to discharge shift register output signals SO1-SO11 and SO13 to low voltage levels at 938. Internal node signal SN12 is at a low voltage level at 924 that turns off the internal node transistor of shift register cell 403*l* and maintains shift register output signal SO12 at a high voltage level at 940.

Also, timing pulse 936 turns on fourth evaluation transistor 562 and control signal CSYNC 824 is at a low voltage level to turn off control transistor 564 to maintain reverse direction signal DIRR 842 at a high voltage level at 944. In addition, timing pulse 936 turns on evaluation prevention transistor 442*b* to maintain LEVAL 848 at a low voltage level at 946.

During timing pulse 948, forward direction signal DIRF 858 is charged to a high voltage level at 950 and LEVAL 848 is charged to a high voltage level at 952. The high voltage level logic evaluation signal LEVAL 848 at 952 turns on evaluation transistors 440. The high voltage level shift register output signal SO12 at 940 turns on address transistors 468*a* and 468*b* to pull address signals ~A3 and ~A4 to low voltage levels at 954. The other address signals ~A1, ~A2 and ~A5-~A7 are maintained at high voltage levels at 956.

Timing pulse 958 turns on third evaluation transistor 556. A control pulse 960 in control signal CSYNC 824 turns on control transistor 558 and forward direction signal DIRF 842 discharges to a low voltage level at 962.

The next series of six timing pulses shifts the high voltage level shift register output signal SO12 to the next shift register cell 403*k* that provides a high voltage level shift register output signal SO11. Shifting continues with each series of six timing pulses until each shift register output signal SO1-SO13 has been high once. After shift register output signal SO1 is high, the series of high voltage level shift register output signals SO 830 stops. The shift register 402 can be initiated again by providing a control pulse, such as control pulse 870, coincident with a timing pulse from timing signal T2 804.

In reverse direction operation, a control pulse from CSYNC 824 is provided coincident with a timing pulse from timing signal T6 at 820 to set the direction of shifting to the reverse direction. Also, a control pulse from CSYNC 824 is provided coincident with a timing pulse from timing signal T2 804 to start or initiate the shift register 402 shifting a high voltage level signal through the shift register output signals SO1-SO13.

Figure 13:
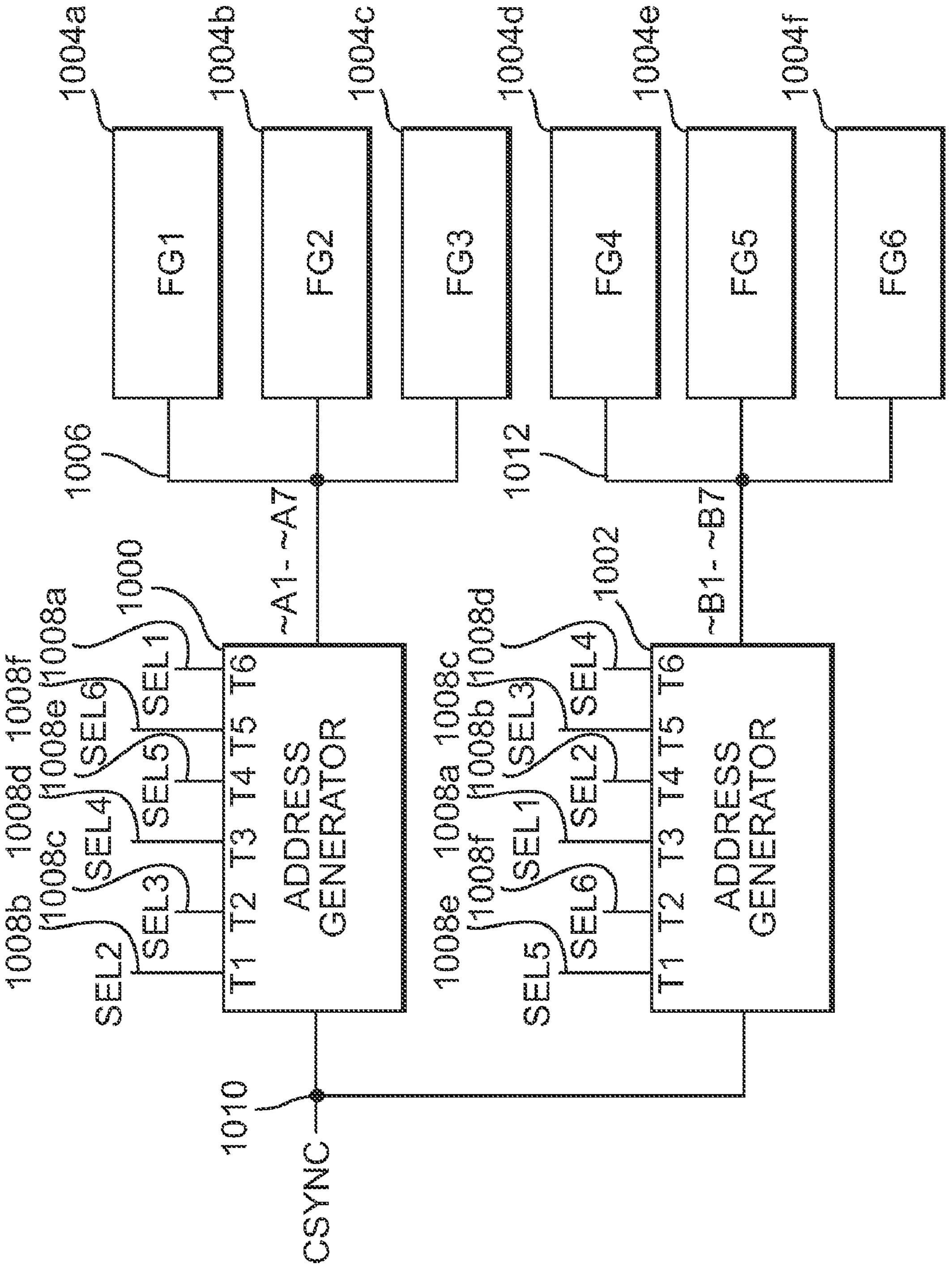
FIG. 13 is a diagram illustrating one embodiment of two address generators and six fire groups in a die.

FIG. 13 is a block diagram illustrating one embodiment of two address generators 1000 and 1002 and six fire groups 1004*a*-1004*f*. Each of the address generators 1000 and 1002 is similar to address generator 400 of FIG. 9 and fire groups 1004*a*-1004*f* are similar to fire groups 202*a*-202*f* illustrated in FIG. 7. The address generator 1000 is electrically coupled to fire groups 1004*a*-1004*c* through first address lines 1006. The address lines 1006 provide address signals ~A1, ~A2, . . . ~A7 from address generator 1000 to each of the fire groups 1004*a*-1004*c*. Also, address generator 1000 is electrically coupled to control line 1010. Control line 1010 receives conducts control signal CSYNC to address generator 1000. In one embodiment, the CSYNC signal is provided by an external controller to a printhead die on which two address generators 1000 and 1002 and six fire groups 1004*a*-1004*f* are fabricated. In addition, address generator 1000 is electrically coupled to select lines 1008*a*-1008*f*. The select lines 1008*a*-1008*f* are similar to select lines 212*a*-212*f* illustrated in FIG. 7. The select lines 1008*a*-1008*f* conduct select signals SEL1, SEL2, SEL6 to address generator 1000, as well as to the corresponding fire groups 1004*a*-1004*f* (not shown).

The select line 1008*a* conducts select signal SEL1 to address generator 1000, in one embodiment is timing signal T3 timing signal T6. The select line 1008*b* conducts select signal SEL2 to address generator 1000, in one embodiment is timing signal T3 timing signal T1. The select line 1008*c* conducts select signal SEL3 to address generator 1000 in one embodiment is timing signal T3 timing signal T2. The select line 1008*d* conducts select signal SEL4 to address generator 1000, in one embodiment is timing signal T3 timing signal T3. The select line 1008*e* conducts select signal SEL5 to address generator 1000, in one embodiment is timing signal T3 timing signal T4, and the select line 1008*f* conducts select signal SEL6 to address generator 1000, in one embodiment is timing signal T3 timing signal T5.

The address generator 1002 is electrically coupled to fire groups 1004*d*-1004*f* through second address lines 1012. The address lines 1012 provide address signals ~B1, ~B2, . . . ~B7 from address generator 1002 to each of the fire groups 1004*d*-1004*f*. Also, address generator 1002 is electrically coupled to control line 1010 that conducts control signal CSYNC to address generator 1002. In addition, address generator 1002 is electrically coupled to select lines 1008*a*-1008*f*. The select lines 1008*a*-1008*f* conduct select signals SEL1, SEL2, . . . SEL6 to address generator 1002, as well as to the corresponding fire groups 1004*a*-1004*f* (not shown).

The select line 1008*a* conducts select signal SEL1 to address generator 1002, which in one embodiment is timing signal T3. The select line 1008*b* conducts select signal SEL2 to address generator 1002, which in one embodiment is timing signal T4. The select line 1008*c* conducts select signal SEL3 to address generator 1002, which in one embodiment is timing signal T5. The select line 1008*d* conducts select signal SEL4 to address generator 1002, which in one embodiment is timing signal T6. The select line 1008*e* conducts select signal SEL5 to address generator 1002, which in one embodiment is timing signal T1, and the select line 1008*f* conducts select signal SEL6 to address generator 1002, which in one embodiment is timing signal T2.

The select signals SEL1, SEL2, . . . SEL 6 include a series of six pulses that repeats in a repeating series of six pulses. Each of the select signals SEL1, SEL2, . . . SEL6 includes one pulse in the series of six pulses. In one embodiment, a pulse in select signal SEL1 is followed by a pulse in select signal SEL2, that is followed by a pulse in select signal SEL3, that is followed by a pulse in select signal SEL4, that is followed by a pulse in select signal SEL5, that is followed by a pulse in select signal SEL6. After the pulse in select signal SEL6, the series repeats beginning with a pulse in select signal SEL1. The control signal CSYNC includes pulses coincident with pulses in select signals SEL1, SEL2, . . . SEL6 to initiate address generators 1000 and 1002 and to set up the direction of shifting or address generation in address generators 1000 and 1002, for example as discussed with respect to FIGS. 11 and 12. To initiate address generation from address generator 1000, control signal CSYNC includes a control pulse coincident with a timing pulse in timing signal T2 that corresponds to the timing pulse in select signal SEL3.

The address generator 1000 generates address signals ~A1, ~A2, . . . ~A7 in response to select signals SEL1, SEL2, . . . SEL6 and control signal CSYNC. The address signals ~A1, ~A2, . . . ~A7 are provided through first address lines 1006 to fire groups 1004*a*-1004*c*.

In address generator 1000, address signals ~A1, ~A2, . . . ~A7 are valid during timing pulses in timing signals T6, T1 and T2 that correspond to timing pulses in select signals SEL1, SEL2 and SEL3. The control signal CSYNC includes a control pulse coincident with a timing pulse in timing signal T4 that corresponds to the timing pulse in select signal SEL5 to set up address generator 1000 for shifting in the forward direction. The control signal CSYNC includes a control pulse coincident with a timing pulse in timing signal T6 that corresponds to the timing pulse in select signal SEL1 to set up address generator 1000 for shifting in the reverse direction.

The fire groups 1004*a*-1004*c* receive valid address signals ~A1, ~A2, . . . ~A7 during the pulses in select signals SEL1, SEL2 and SEL3. When fire group one (FG1) at 1004*a* receives the address signals ~A1, ~A2, . . . ~A7 and the pulse in select signal SEL1, firing cells 120 in selected row subgroups SG1 are enabled for activation by fire signal FIRE1. When fire group two (FG2) at 1004*b* receives the address signals ~A1, ~A2, . . . ~A7 and the pulse in select signal SEL2, firing cells 120 in selected row subgroups SG2 are enabled for activation by fire signal FIRE2. When fire group three (FG3) at 1004*c* receives the address signals ~A1, ~A2, . . . ~A7 and the pulse in select signal SEL3, firing cells 120 in selected row subgroups SG3 are enabled for activation by fire signal FIRE3.

The address generator 1002 generates address signals ~B1, ~B2, . . . ~B7 in response to the select signals SEL1, SEL2, . . . SEL6 and control signal CSYNC. The address signals ~B1, ~B2, . . . ~B7 are provided through second address lines 1012 to fire groups 1004*d*-1004*f*. In address generator 1002, the address signals ~B1, ~B2, . . . ~B7 are valid during timing pulses in timing signals T6, T1 and T2 that correspond to timing pulses in select signals SEL4, SEL5 and SEL6. The control signal CSYNC includes a control pulse coincident with a timing pulse in timing signal T4 that corresponds to the timing pulse in select signal SEL2 to set up address generator 1002 for shifting in the forward direction. The control signal CSYNC includes a control pulse coincident with a timing pulse in timing signal T6 that corresponds to the timing pulse in select signal SEL4 to set up address generator 1002 for shifting in the reverse direction. To initiate address generation from address generator 1002, control signal CSYNC includes a control pulse coincident with a timing pulse in timing signal T2 that corresponds to the timing pulse in select signal SEL6.

The fire groups 1004*d*-1004*f* receive valid address signals ~B1, ~B2, . . . ~B7 during the pulses in select signals SEL4, SEL5 and SEL6. When fire group four (FG4) at 1004*d* receives the address signals ~B1, ~B2, . . . ~B7 and the pulse in select signal SEL4, firing cells 120 in selected row subgroups SG4 are enabled for activation by fire signal FIRE4. When fire group five (FG5) at 1004*e* receives the address signals ~B1, ~B2, . . . ~B7 and the pulse in select signal SEL5, firing cells 120 in selected row subgroups SG5 are enabled for activation by fire signal FIRE5. When fire group six (FG6) at 1004*f* receives the address signals ~B1, ~B2, . . . ~B7 and the pulse in select signal SEL6, firing cells 120 in selected row subgroups SG6 are enabled for activation by fire signal FIRE6.

In one example operation, during one series of six pulses, control signal CSYNC includes control pulses coincident with the timing pulses in select signals SEL2 and SEL5 to set up address generators 1000 and 1002 for shifting in the forward direction. The control pulse coincident with the timing pulse in select signal SEL2 sets up address generator 1002 for shifting in the forward direction. The control pulse coincident with the timing pulse in select signal SEL5 sets up address generator 1000 for shifting in the forward direction.

In the next series of six pulses, control signal CSYNC includes control pulses coincident with timing pulses in select signals SEL2, SEL3, SEL5 and SEL6. The control pulses coincident with timing pulses in select signals SEL2 and SEL5 set the direction of shifting to the forward direction in address generators 1000 and 1002. The control pulses coincident with timing pulses in select signals SEL3 and SEL6 initiate the address generators 1000 and 1002 for generating address signals ~A1, ~A2, . . . ~A7 and ~B1, ~B2, . . . ~B7. The control pulse coincident with the timing pulse in select signal SEL3 initiates the address generator 1000 and the control pulse coincident with the timing pulse in select signal SEL6 initiates the address generator 1002.

During the third series of timing pulses, address generator 1000 generates address signals ~A1, ~A2, . . . ~A7 that are valid during timing pulses in select signals SEL1, SEL2 and SEL3. The valid address signals ~A1, ~A2, . . . ~A7 are used for enabling firing cells 120 in row subgroups SG1, SG2 and SG3 in fire groups FG1, FG2 and FG3 at 1004*a*-1004*c* for activation. During the third series of timing pulses, address generator 1002 generates address signals ~B1, ~B2, . . . ~B7 that are valid during timing pulses in select signals SEL4, SEL5 and SEL6. The valid address signals ~B1, ~B2, . . . ~B7 are used for enabling firing cells 120 in row subgroups SG4, SG5 and SG6 in fire groups FG4, FG5 and FG6 at 1004*d*-1004*f* for activation.

During the third series of timing pulses in select signals SEL1, SEL2, . . . SEL6, address signals ~A1, ~A2, . . . ~A7 include low voltage level signals that correspond to one of thirteen addresses and address signals ~B1, ~B2, . . . ~B7 include low voltage level signals that correspond to the same one of thirteen addresses. During each subsequent series of timing pulses from select signals SEL1, SEL2, . . . SEL6, address signals ~A1, ~A2, . . . ~A7 and address signals ~B1, ~B2, . . . ~B7 include low voltage level signals that correspond to the same one of thirteen addresses. Each series of timing pulses is an address time slot, such that one of the thirteen addresses is provided during each series of timing pulses.

In forward direction operation, address one is provided first by address generators 1000 and 1002, followed by address two and so on through address thirteen. After address thirteen, address generators 1000 and 1002 provide all high voltage level address signals ~A1, ~A2, . . . ~A7 and ~B1, ~B2, . . . ~B7. Also, during each series of timing pulses from select signals SEL1, SEL2, . . . SEL6, control pulses are provided coincident with timing pulses in select signals SEL2 and SEL5 to continue shifting in the forward direction.

In another example operation, during one series of six pulses, control signal CSYNC includes control pulses coincident with timing pulses in select signals SEL1 and SEL4 to set up address generators 1000 and 1002 for shifting in the reverse direction. The control pulse coincident with the timing pulse in select signal SEL1 sets up address generator 1000 for shifting in the reverse direction. The control pulse coincident with the timing pulse in select signal SEL4 sets up address generator 1002 for shifting in the reverse direction.

In the next series of six pulses, control signal CSYNC includes control pulses coincident with the timing pulses in select signals SEL1, SEL3, SEL4 and SEL6. The control pulses coincident with timing pulses in select signals SEL1 and SEL4 set the direction of shifting to the reverse direction in address generators 1000 and 1002. The control pulses coincident with timing pulses in select signals SEL3 and SEL6 initiate the address generators 1000 and 1002 for generating address signals ~A1, ~A2, . . . ~A7 and ~B1, ~B2, . . . ~B7. The control pulses coincident with the timing pulse in select signal SEL3 initiates address generator 1000 and the control pulse coincident with the timing pulse in select signal SEL6 initiates address generator 1002.

During the third series of timing pulses, address generator 1000 generates address signals ~A1, ~A2, . . . ~A7 that are valid during timing pulses in select signals SEL1, SEL2 and SEL3. The valid address signals ~A1, ~A2, . . . ~A7 are used for enabling firing cells 120 in row subgroups SG1, SG2 and SG3 in fire groups FG1, FG2 and FG3 at 1004*a*-1004*c* for activation. Address generator 1002 generates address signals ~B1, ~B2, . . . ~B7 that are valid during timing pulses in select signals SEL4, SEL5 and SEL6 during the third series of timing pulses. The valid address signals ~B1, ~B2, . . . ~B7 are used for enabling firing cells 120 in row subgroups SG4, SG5 and SG6 in fire groups FG4, FG5 and FG6 at 1004*d*-1004*f* for activation.

During the third series of timing pulses in select signals SEL1, SEL2, . . . SEL6 in reverse direction operation, address signals ~A1, ~A2, . . . ~A7 include low voltage level signals that correspond to one of thirteen addresses and address signals ~B1, ~B2, . . . ~B7 include low voltage level signals that correspond to the same one of thirteen addresses. During each subsequent series of timing pulses from select signals SEL1, SEL2, . . . SEL6, address signals ~A1, ~A2, . . . ~A7 and ~B1, ~B2, . . . ~B7 include low voltage level signals that correspond to the same one of thirteen addresses. Each series of timing pulses is an address time slot, such that one of the thirteen addresses is provided during each series of timing pulses.

In reverse direction operation, address thirteen is provided first by address generator 1000 and 1002, followed by address twelve and so on through address one. After address one, address generators 1000 and 1002 provide all high voltage level address signals ~A1, ~A2, . . . ~A7 and ~B1, ~B2, . . . ~B7. Also, during each series of timing pulses from select signals SEL1, SEL2 . . . SEL6 control pulses are provided coincident with timing pulses in select signals SEL1 and SEL4 to continue shifting in the reverse direction.

To terminate or prevent address generation, control signal CSYNC includes control pulses coincident with timing pulses in select signals SEL1, SEL2, SEL4 and SEL5. This clears the shift registers, such as shift register 402, in address generators 1000 and 1002. A constant high voltage level, or a series of high voltage pulses, in control signal CSYNC also terminates or prevents address generation and a constant low voltage level in control signal CSYNC will not initiate address generators 1000 and 1002.

Figure 14:
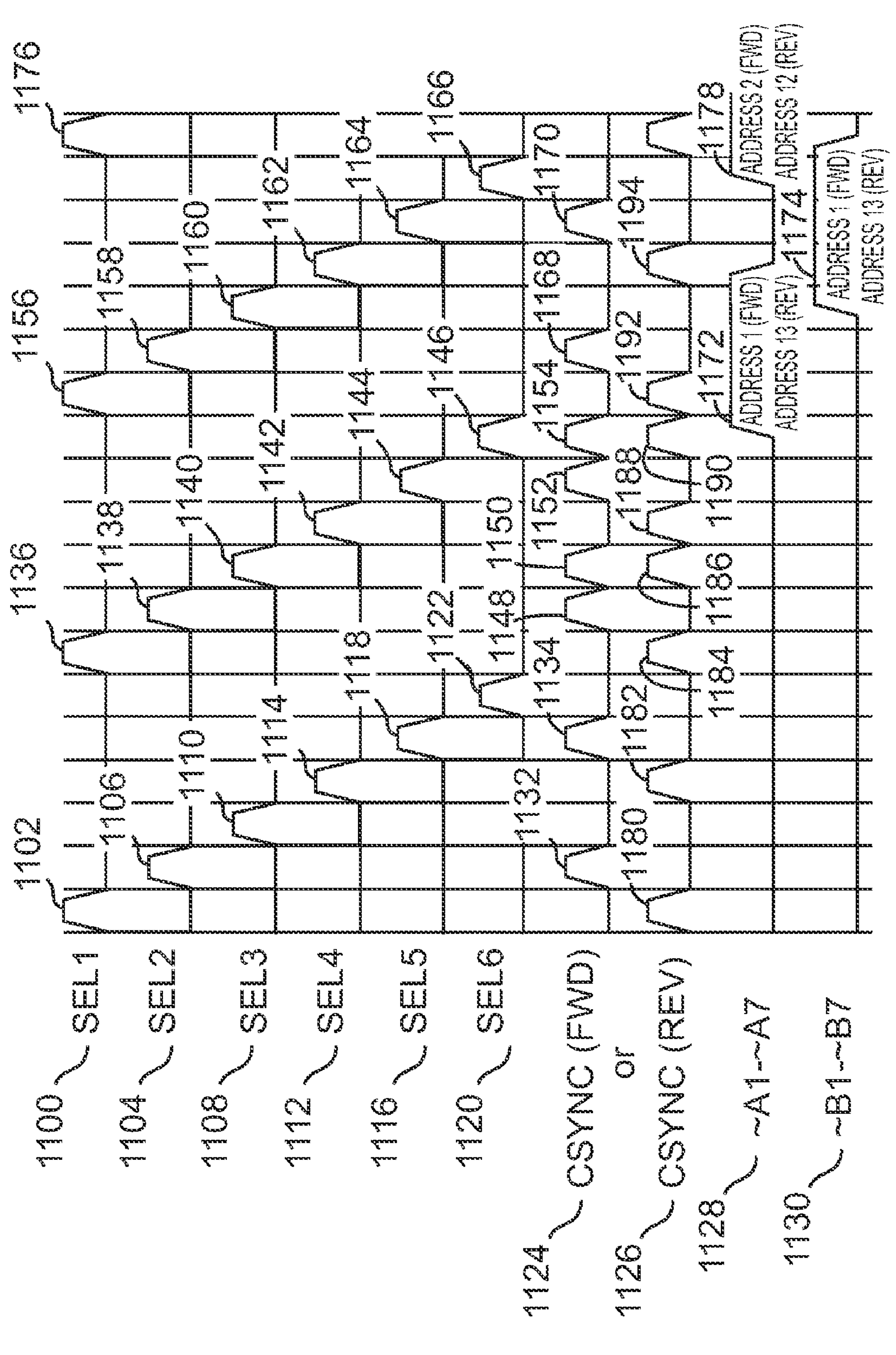
FIG. 14 is a timing diagram illustrating forward and reverse operation of address generators in a die.

FIG. 14 is a timing diagram illustrating forward and reverse operation of address generators 1000 and 1002. The control signal used for shifting in the forward direction is CSYNC (FWD) at 1124 and the control signal used for shifting in the reverse direction is CSYNC(REV) at 1126. The address signals ~A1, ~A2, . . . ~A7 at 1128 are provided by address generator 1000 and include both forward and reverse operation address references. The address signals ~B1, ~B2, . . . ~B7 at 1130 are provided by address generator 1002 and include both forward and reverse operation address references.

The select signals SEL1, SEL2, . . . SEL6 provide a repeating series of six pulses. Each of the select signals SEL1, SEL2, SEL6 includes one pulse in the series of six pulses. In one series of the repeating series of six pulses, select signal SEL1 at 1100 includes timing pulse 1102, select signal SEL2 at 1104 includes timing pulse 1106, select signal SEL3 at 1108 includes timing pulse 1110, select signal SEL4 at 1112 includes timing pulse 1114, select signal SEL5 at 1116 includes timing pulse 1118 and select signal SEL6 at 1120 includes timing pulse 1122.

In forward direction operation, control signal CSYNC (FWD) 1124 includes control pulse 1132 coincident with timing pulse 1106 in select signal SEL2 at 1104. The control pulse 1132 sets up address generator 1002 for shifting in the forward direction. Also, control signal CSYNC(FWD) 1124 includes control pulse 1134 coincident with timing pulse 1118 in select signal SEL5 at 1116. The control pulse 1134 sets up address generator 1000 for shifting in the forward direction.

In the next repeating series of six pulses, the select signal SEL1 at 1100 includes timing pulse 1136, select signal SEL2 at 1104 includes timing pulse 1138, select signal SEL3 at 1108 includes timing pulse 1140, select signal SEL4 at 1112 includes timing pulse 1142, select signal SEL5 at 1116 includes timing pulse 1144 and select signal SEL6 at 1120 includes timing pulse 1146.

Control signal CSYNC(FWD) 1124 includes control pulse 1148 coincident with timing pulse 1138 to continue setting address generator 1002 for shifting in the forward direction and control pulse 1152 coincident with timing pulse 1144 to continue setting address generator 1000 for shifting in the forward direction. Also, control signal CSYNC(FWD) 1124 includes control pulse 1150 coincident with timing pulse 1140 in select signal SEL3 at 1108. The control pulse 1150 initiates address generator 1000 for generating address signals ~A1, ~A2, . . . ~A7 at 1128. In addition, control signal CSYNC(FWD) 1124 includes control pulse 1154 coincident with timing pulse 1146 in select signal SEL6 at 1120. The control pulse 1154 initiates address generator 1002 for generating address signals ~B1, ~B2, . . . ~B7 at 1130.

In the next or third series of six pulses, select signal SEL1 at 1100 includes timing pulse 1156, select signal SEL2 at 1104 includes timing pulse 1158, select signal SEL3 at 1108 includes timing pulse 1160, select signal SEL4 at 1112 includes timing pulse 1162, select signal SEL5 at 1116 includes timing pulse 1164 and select signal SEL6 at 1120 includes timing pulse 1166. The control signal CSYNC (FWD) 1124 includes control pulse 1168 coincident with timing pulse 1158 to continue setting address generator 1002 for shifting in the forward direction and control pulse 1170 coincident with timing pulse 1164 to continue setting address generator 1000 for shifting in the forward direction.

The address generator 1000 provides address signals ~A1, ~A2, . . . ~A7 at 1128. After being initiated in forward direction operation, address generator 1000 and address signals ~A1, ~A2, . . . ~A7 at 1128 provide address one at 1172. Address one at 1172 becomes valid during timing pulse 1146 in select signal SEL6 at 1120 and remains valid until timing pulse 1162 in select signal SEL4 at 1112. Address one at 1172 is valid during timing pulses 1156, 1158 and 1160 in select signals SEL1, SEL2 and SEL3 at 1100, 1104 and 1108.

The address generator 1002 provides address signals ~B1, ~B2, . . . ~B7 at 1130. After being initiated in forward direction operation, address generator 1002 and address signals ~B1, ~B2, . . . ~B7 at 1130 provide address one at 1174. Address one at 1174 becomes valid during timing pulse 1160 in select signal SEL3 at 1108 and remains valid until timing pulse 1176 in select signal SEL1 at 1100. Address one at 1174 is valid during timing pulses 1162, 1164 and 1166 in select signals SEL4, SEL5 and SEL6 at 1112, 1116 and 1120.

The address signals ~A1, ~A2, . . . ~A7 at 1128 and ~B1, ~B2, . . . ~B7 at 1130 provide the same address, address one at 1172 and 1174. Address one is provided during the series of six timing pulses beginning with timing pulse 1156 and ending with timing pulse 1166, which is the address time slot for address one. During the next series of six pulses, beginning with timing pulse 1176, address signals ~A1, ~A2, . . . ~A7 at 1128 provide address two at 1178 and address signals ~B1, ~B2, . . . ~B7 at 1130 provide address two also. In this way, address generators 1000 and 1002 provide addresses from address one through address thirteen in the forward direction. After address thirteen, address generators 1000 and 1002 are reinitiated to cycle through the valid addresses again in the same way.

In reverse direction operation, control signal CSYNC (REV) 1126 includes control pulse 1180 coincident with timing pulse 1102 in select signal SEL1 at 1100. The control pulse 1180 sets up address generator 1000 for shifting in the reverse direction. Also, control signal CSYNC(REV) 1126 includes control pulse 1182 coincident with timing pulse 1114 in select signal SEL4 at 1112. The control pulse 1182 sets up address generator 1002 for shifting in the reverse direction.

Control signal CSYNC(REV) 1126 includes control pulse 1184 coincident with timing pulse 1136 to continue setting address generator 1000 for shifting in the reverse direction and control pulse 1188 coincident with timing pulse 1142 to continue setting address generator 1002 for shifting in the reverse direction. Also, control signal CSYNC(REV) 1126 includes control pulse 1186 coincident with timing pulse 1140 in select signal SEL3 at 1108. The control pulse 1186 initiates address generator 1000 for generating address signals ~A1, ~A2, . . . ~A7 at 1128. In addition, control signal CSYNC(REV) 1126 includes control pulse 1190 coincident with timing pulse 1146 in select signal SEL6 at 1120. The control pulse 1190 initiates address generator 1002 for generating address signals ~B1, ~B2, . . . ~B7 at 1130.

The control signal CSYNC(REV) 1126 includes control pulse 1192 coincident with timing pulse 1156 to continue setting address generator 1000 for shifting in the reverse direction and control pulse 1194 coincident with timing pulse 1162 to continue setting address generator 1002 for shifting in the reverse direction.

The address generator 1000 provides address signals ~Al ~A7 at 1128. After being initiated in reverse direction operation, address generator 1000 and address signals ~A1, ~A2, . . . ~A7 at 1128 provide address thirteen at 1172. Address thirteen at 1172 becomes valid during timing pulse 1146 and remains valid until timing pulse 1162. Address thirteen at 1172 is valid during timing pulses 1156, 1158 and 1160 in select signals SEL1, SEL2 and SEL3 at 1100, 1104 and 1108.

The address generator 1002 provides address signals ~B1, ~B2, . . . ~B7 at 1130. After being initiated in reverse direction operation, address generator 1002 and address signals ~B1, ~B2, . . . ~B7 at 1130 provide address thirteen at 1174. Address thirteen at 1174 becomes valid during timing pulse 1160 and remains valid until timing pulse 1176. Address thirteen at 1174 is valid during timing pulses 1162, 1164 and 1166 in select signals SEL4, SEL5 and SEL6 at 1112, 1116 and 1120.

The address signals ~A1, ~A2, . . . ~A7 at 1128 and ~B1, ~B2, . . . ~B7 at 1130 provide the same address, address thirteen at 1172 and 1174. Address thirteen is provided during the series of six timing pulses beginning with timing pulse 1156 and ending with timing pulse 1166, which is the address time slot for address thirteen. During the next series of six pulses, beginning with timing pulse 1176, address signals ~A1, ~A2, . . . ~A7 at 1128 provide address twelve at 1178 and address signals ~B1, ~B2, . . . ~B7 at 1130 provide address twelve also. Address generators 1000 and 1002 provide addresses from address thirteen through address one in the reverse direction. After address one, address generators 1000 and 1002 are reinitiated to provide valid addresses again.

Figure 15A:
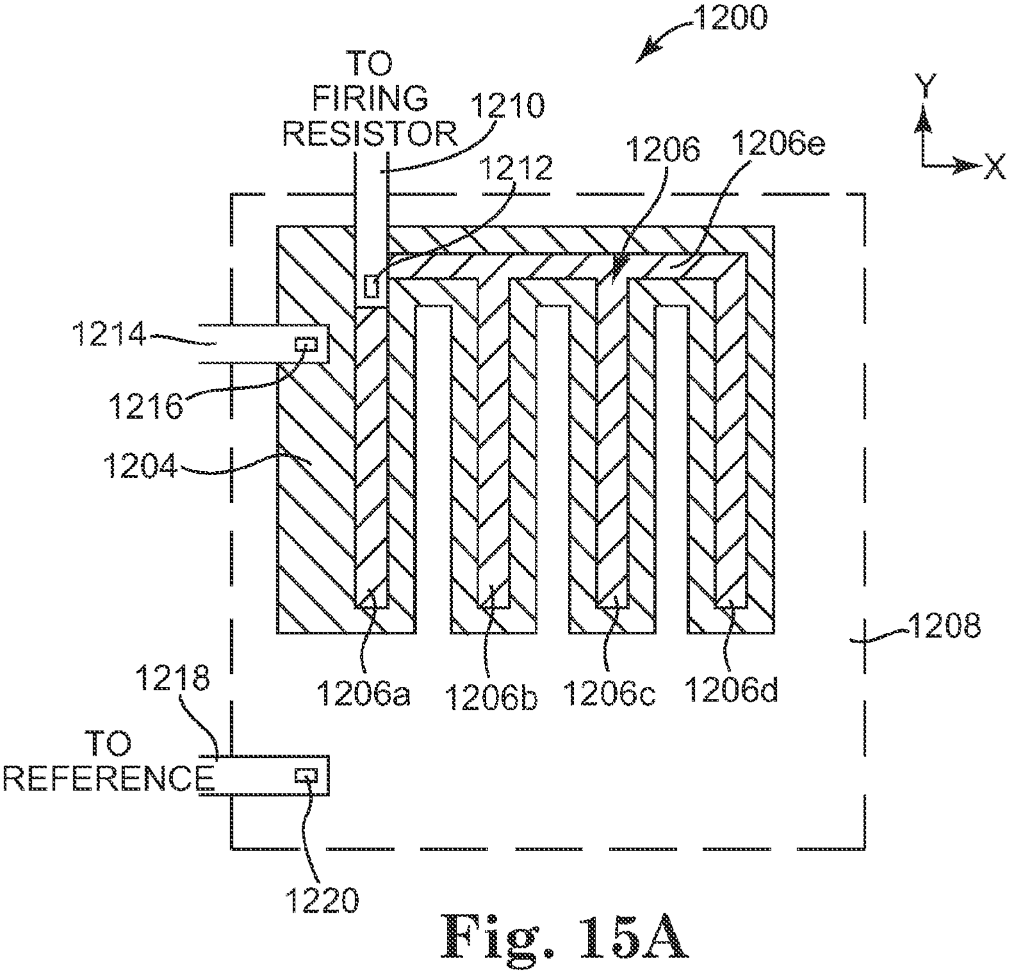
FIG. 15A is a layout diagram illustrating one embodiment of a drive switch in a die.
Figure 15B:
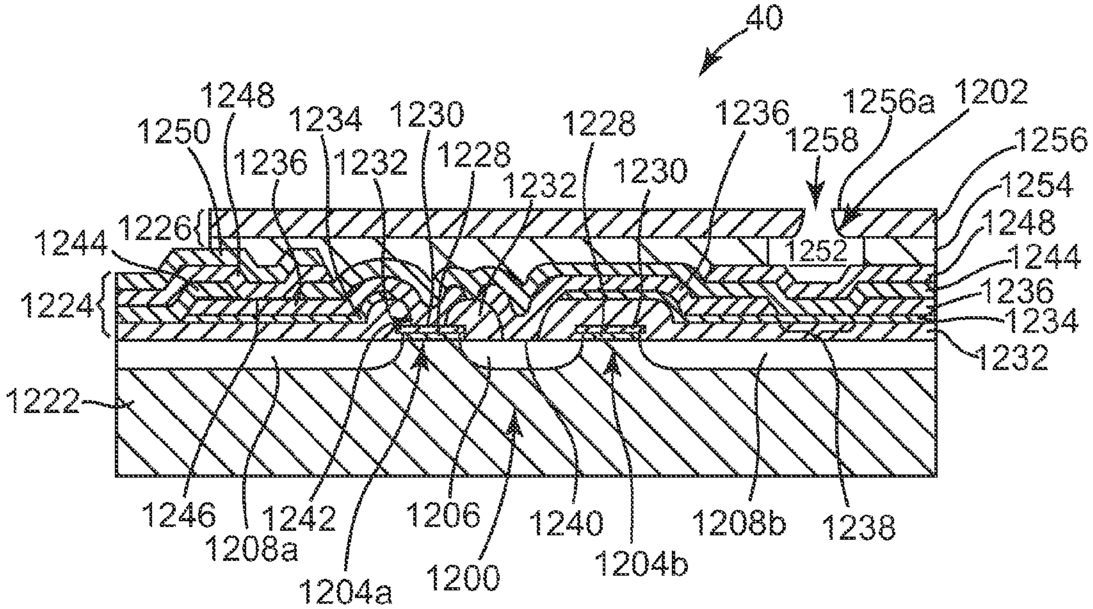
FIG. 15B is a diagram illustrating a cross-section of a portion of a drive switch and a drop generator in a die.

FIGS. 15A and 15B are diagrams illustrating one embodiment of a drive switch 1200 and a drop generator 1202 in a portion of a die 40. The drop generator 1202 is one embodiment of a drop generator 60, which includes firing resistor 52, vaporization chamber 56 and nozzle 34, FIGS. 2 and 3. Drive switch 1200 is one embodiment of drive switch 72 in firing cell 70, FIG. 4, and drive switch 172 in firing cell 120, FIG. 6.

FIG. 15A is a layout diagram illustrating one embodiment of drive switch 1200 in die 40. The drive switch 1200 includes a gate 1204, an active drain region 1206 and a portion of active source region 1208. In one embodiment, source region 1208 extends to neighboring drive switches in die 40.

The drain region 1206 includes four drain sections 1206*a*-1206*d* along the y-direction and one drain section 1206*e* along the x-direction. The drain region 1206 is electrically coupled to a drain conductor 1210 through via 1212. The drain conductor 1210 is electrically coupled to a firing resistor similar to firing resistor 52. In one embodiment, drain conductor 1210 extends along drain sections 1206*a*-1206*e* and multiple via, similar to via 1212, electrically couple drain conductor 1210 to drain region 1206.

The gate 1204 is formed into a loop structure around drain region 1206. A gate mask is used to form gate 1204 around drain region 1206. In one embodiment, the loop structure of gate 1204 forms a closed gate structure around drain region 1206.

The gate 1204 is electrically coupled to a gate conductor 1214 through via 1216. The gate conductor 1214 can be electrically coupled to a memory circuit 74, FIG. 4, and pre-charge and select transistors 128 and 130, FIG. 6. In one embodiment, gate conductor 1214 extends along gate 1204 and multiple via, similar to via 1216, electrically couple gate conductor 1214 to gate 1204.

The area outside of gate 1204 is source region 1208. The source region 1208 is electrically coupled to a source conductor 1218 through via 1220. The source conductor 1218 is electrically coupled to a reference, such as ground. In one embodiment, source conductor 1218 is electrically coupled to source region 1208 through multiple via, similar to via 1220.

In this embodiment of drive switch 1200, gate 1204 is formed as a serpentine loop structure that increases the length of gate 1204 and creates a lower on resistance, as compared to a non-serpentine structure. The gate 1204 isolates drain region 1206 within the inner portion of gate 1204 and away from other devices, such as transistors, on die 40.

In one embodiment, no field oxide dielectric layer is formed to isolate neighboring transistors from one another. Also, no island mask is used to form openings in a field oxide dielectric layer for forming the transistors.

FIG. 15B is a diagram illustrating a cross-section of a portion of drive switch 1200 and drop generator 1202 in die 40. The die 40 includes a substrate 1222, a thin film structure 1224 and an orifice layer 1226. Substrate 1222 includes drain region 1206 and source regions 1208*a* and 1208*b*. The substrate 1222 is preferably doped with a p-dopant for an N-channel metal oxide semiconductor (NMOS) process. The drain region 1206 and source regions 1208*a* and 1208*b* are preferably doped with an n+ dopant to create n+ active regions in p− substrate 1222.

Drive switch 1200 includes gate sections 1204*a* and 1204*b*, drain region 1206 and source regions 1208*a* and 1208*b*. The gate sections 1204*a* and 1204*b* are part of gate 1204 that surrounds drain region 1206. The area outside of gate 1204 is source region 1208.

To form drive switch 1200, a serpentine gate mask is used to form gate 1204 around drain region 1206. A gate oxide layer 1228 is disposed on substrate 1222 and a gate conductor 1230 is disposed on gate oxide layer 1228. A field oxide dielectric layer is not formed on substrate 1222 to isolate devices, such as transistors. Also, an island mask is not used to form openings in a field oxide dielectric layer for forming the transistors.

Die 40 includes dielectric layer 1232 deposited on substrate 1222 and gate conductor 1230. A resistive conductive layer 1234 is disposed on dielectric layer 1232 and a first conductive layer 1236 is disposed on resistive conductive layer 1234. The first conductive layer 1234 is made out of a conductive material such as aluminum, although other suitable conductors such as copper and gold can also be used. A portion of first conductive layer 1236 is removed to form firing resistor 1238 in resistive conductive layer 1234. Also, a first contact via 1240 is made in dielectric layer 1232 to electrically couple first conductive layer 1236 to drain region 1206 of drive switch 1200, which electrically couples drain region 1206 to firing resistor 1238. In addition, a second contact via 1242 is made in dielectric layer 1232 to electrically couple first conductive layer 1236 to gate 1204 of drive switch 1200. In one embodiment, dielectric layer 1232 is at least 2000 Angstroms thick and preferably between 6000 and 12000 Angstroms. Also, in one embodiment, dielectric layer 1232 is phosphosilicate glass. The dielectric layer 1232 provides thermal and electrical isolation between firing resistor 1238 and substrate 1222.

A passivation layer 1244 is disposed over firing resistor 1238, resistive conductor layer 1234 and other thin film layers disposed on substrate 1222. The passivation layer 1244 protects firing resistor 1238 from the reactive qualities of fluid, such as ink. A contact via 1246 is made in passivation layer 1244 and a second conductive layer 1248 is disposed to make contact to first conductive layer 1236 through contact via 1246. A third conductive layer 1250 is disposed on second conductive layer 1248 and second and third conductive layers 1248 and 1250 are electrically coupled to gate 1204. Also, second conductive layer 1248 acts as a cavitation layer on firing resistor 1238. The cavitation layer portion of second conductive layer 1248 protects passivation layer 1244 and firing resistor 1238 from bubble collapse in nozzle chamber or vaporization chamber 1252. In one embodiment, gate 1204 is coupled to additional circuitry by gate conductor 1230, resistive conductor layer 1234 and first conductive layer 1236, without being connected to second conductive layer 1248 and third conductive layer 1250.

The orifice layer 1226 includes a fluid barrier 1254 and an orifice plate 1256. The orifice plate 1256 has a front face 1256*a* and a nozzle opening 1258 formed in front face 1256*a*. The fluid barrier 1254 has vaporization chamber 1252 formed therein to receive fluid and communicate with nozzle opening 1258. The drop generator 1202 includes vaporization chamber 1252, nozzle opening 1258 and firing resistor 1238 that is electrically coupled to drive switch 1200 through resistive conductive layer 1234 and conductive layer 1236.

In operation, vaporization chamber 1252 receives fluid, such as ink. Drive switch 1200 is switched on to conduct and firing resistor 1238 receives a timed energy pulse on a fire line of die 40. The firing resistor 1238 heats up to eject fluid through nozzle opening 1258 and vaporization chamber 1252 refills with fluid.

In one embodiment of die 40, each transistor is formed using a closed gate structure to isolate an active region of the transistor within the inner portion of the closed gate structure. The other active region lies outside the closed gate structure. In one embodiment, multiple transistors are organized in closed gate structures.

Figure 16:
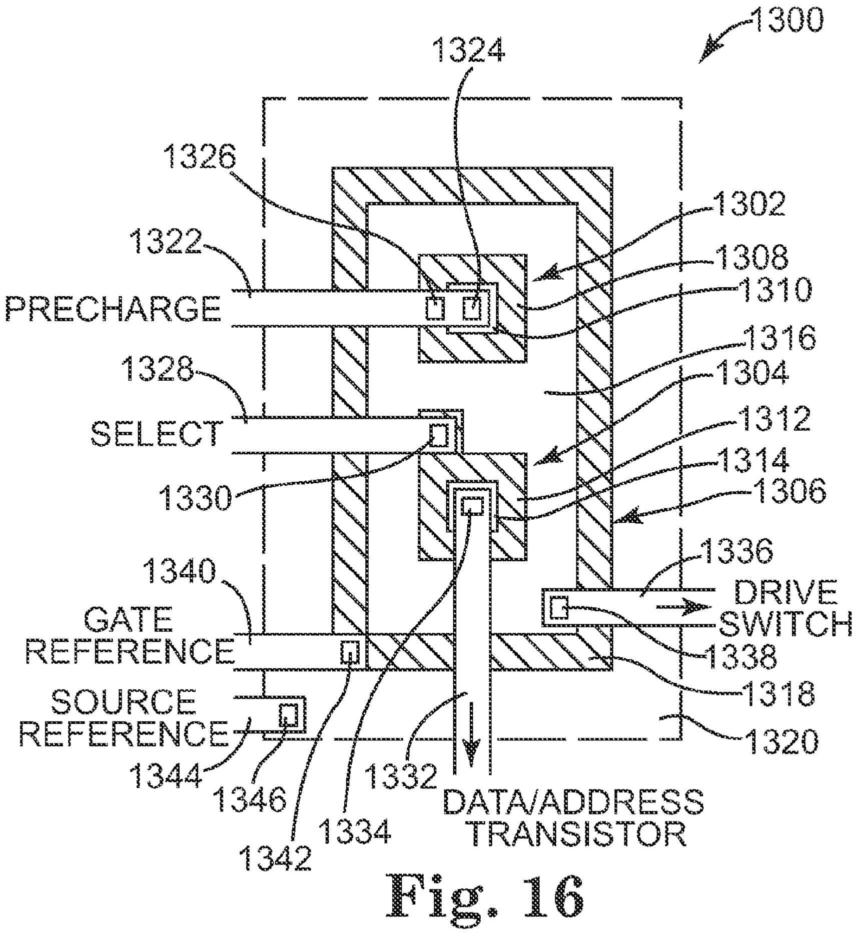
FIG. 16 is a layout diagram illustrating one embodiment of a pre-charge and select logic cell in a portion of a die.

FIG. 16 is a layout diagram illustrating one embodiment of a pre-charge and select logic cell 1300 in a portion of a die 40. The pre-charge and select logic cell 1300 includes gates in loop structures. In one embodiment, the loop structures form multiple closed gate structures.

In one embodiment, pre-charge and select logic cell 1300 is one embodiment of pre-charge and select logic cell 127, which includes pre-charge transistor 128, select transistor 130 and guard transistor 131, FIG. 6. The pre-charge and select logic cell 1300 includes pre-charge transistor 1302, select transistor 1304 and guard transistor 1306. In one embodiment, logic cell 1300 can be one embodiment of other circuitry in a die. In other embodiments, logic cell 1300 can be used in other integrated circuit devices, such as other MEMS devices, that use similar transistor schematic configurations.

The pre-charge transistor 1302 includes a pre-charge gate 1308 and a drain region 1310 and select transistor 1304 includes a select gate 1312 and a source region 1314. Also, guard transistor 1306 includes a guard gate 1318 and a source region 1320. In one embodiment, source region 1320 extends to neighboring closed gate structures in die 40.

The area outside pre-charge gate 1308 and select gate 1312 and inside guard gate 1318 is source/drain region 1316. The source/drain region 1316 is the source region of pre-charge transistor 1302 and the drain regions of select transistor 1304 and guard transistor 1306, which are electrically coupled together to form pre-charge and select logic cell 1300. The pre-charge gate 1308 isolates drain region 1310 from source/drain region 1316 and select gate 1312 isolates source region 1314 from source/drain region 1316. The select transistor 1304 is configured with source region 1314 within select gate 1312, instead of a drain region, and source/drain region 1316 outside gate 1312 to accommodate the multiple transistor structure of pre-charge and select logic cell 1300.

The source/drain region 1316 disposed between precharge gate 1308, select gate 1312 and guard gate 1318, is an area efficient way of interconnecting pre-charge transistor 1302, select transistor 1304 and guard transistor 1306. These interconnections take advantage of the n+ active source/drain region 1316 as an additional layer of interconnect, precluding the use of metal or polysilicon conductor interconnections. If needed, the structure can be expanded to include three or more interior transistors enclosed by a single transistor. If the circuit has n source/drain regions of transistors connected together, n−1 transistors can be enclosed by the one remaining transistor. The gate of the enclosing transistor can be coupled to ground or a control line in the circuit.

The selection of which transistor encloses the other transistors relates to placing transistor capacitance where it is needed in the circuit topology. On dynamic storage nodes, such as nodes that store charge for activating a drive switch, nodes that store internal node signals SN and nodes that store shift register output signals SO, additional capacitance contributes to reducing noise and reducing charge sharing problems between nodes. On other nodes, reducing capacitance contributes to higher switching speeds and reducing charge sharing problems. The large n+ active region, such as drain/source region 1316, is placed in the circuit layout where additional capacitance is beneficial, such as at the dynamic storage nodes. If the additional capacitance associated with the large n+ active region can not be placed in a circuit layout where it is beneficial, the capacitance can be placed where it is actively driven by an externally provided signal with suitable drive capability. Guard transistors, such as guard transistor 1306, can be added to the circuit to add capacitance on a dynamic storage node.

The pre-charge gate 1308 of pre-charge transistor 1302 is electrically coupled to pre-charge conductor 1322 through via 1326 and drain region 1310 is electrically coupled to pre-charge conductor 1322 through via 1324. The pre-charge conductor 1322 receives timing pulses in pre-charge signal PRECHARGE to charge the gate of a drive switch, such as drive switch 1200, to a high level voltage. The select gate 1312 of select transistor 1304 is electrically coupled to select conductor 1328 through via 1330. The select conductor 1328 receives timing pulses in select signal SELECT to turn on select transistor 1304. The source region 1314 of select transistor 1304 is electrically coupled to data/address conductor 1332 through via 1334. The data/address conductor 1332 is electrically coupled to transistors, such as data transistor 136 and address transistors 138 and 140 in firing cell 120, FIG. 6. In other embodiments, data/address conductor 1332 can be electrically coupled to ground.

The source/drain region 1316 is electrically coupled to output conductor 1336 through via 1338. The output conductor 1336 is electrically coupled to the gate of a drive switch, such as drive switch 172, which is a dynamic storage node in firing cell 120 of FIG. 6, or gate 1204 of drive switch 1200 to turn on or off drive switch 1200. The output conductor 1336 includes the capacitance associated with drain/source region 1336. The guard gate 1318 of guard transistor 1306 is electrically coupled to a gate reference conductor 1340 through via 1342 and source region 1320 is electrically coupled to a source reference conductor 1344 through via 1346. The gate reference conductor 1340 is coupled to a gate reference, such as ground, and source reference conductor 1344 is coupled to a source reference, such as ground. In one embodiment, the gate reference conductor 1340 can be electrically coupled to a control signal that is part of a circuit.

In one embodiment, gate 1318 of guard transistor 1306 isolates pre-charge transistor 1302 and select transistor 1304 from neighboring closed gate structures. In one embodiment, each closed gate structure includes a source region, such as source region 1320 that is electrically coupled to the same source reference, such as ground.

The layout of pre-charge and select logic cell 1300 includes the additional capacitance of drain/source region 1316 at output conductor 1336 and places a much smaller capacitance at data/address conductor 1332. In one embodiment, pre-charge conductor 1322 corresponds to first pre-charge line 432 (shown in FIG. 10A) and select conductor 1328 corresponds to first evaluation line 420, the layout of logic cell 1300 includes the additional capacitance of drain/source region 1316 on output conductor 1336 that corresponds to internal node line 522, which is the dynamic storage node that stores internal node signal SN1. Since, internal node line 522 is coupled to two drain/source regions, an additional guard transistor can be added to isolate the combined drain/source region and add the gate/drain capacitance of the guard transistor, such as guard transistor 1306, to internal node line 522 that corresponds to output conductor 1336.

Data/address conductor 1332 corresponds to internal path 524 (shown in FIG. 10A) and includes a smaller capacitance than output conductor 1336 that corresponds to internal node line 522. As first evaluation transistor 506 turns on, charge is removed from output conductor 1336 that corresponds to internal node line 522 and added to data/address conductor 1332 that corresponds to internal path 524. This reduces the voltage on output conductor 1336 and internal node line 522. However, since output conductor 1336 has a much larger capacitance, moving some of the stored charge to data/address conductor 1332 does not change the logic level of internal node signal SN1 on internal node line 522.

In operation of pre-charge and select logic cell 1300 as one embodiment of pre-charge and select logic cell 127, pre-charge transistor 1302 receives a timing pulse in precharge signal PRECHARGE that charges the gate 1204 of drive switch 1200. Next, select transistor 1304 receives a timing pulse in select signal SELECT to turn on select transistor 1304. If one of the data/address transistors coupled to data/address conductor 1332 is turned on, gate 1204 discharges and drive switch 1200 is turned off. If all of the data/address transistors coupled to data/address conductor 1332 are turned off, gate 1204 remains charged and drive switch 1200 is turned on. After the timing pulse in select signal SELECT, the charged/discharged state is stored at gate 1204.

Figure 17:
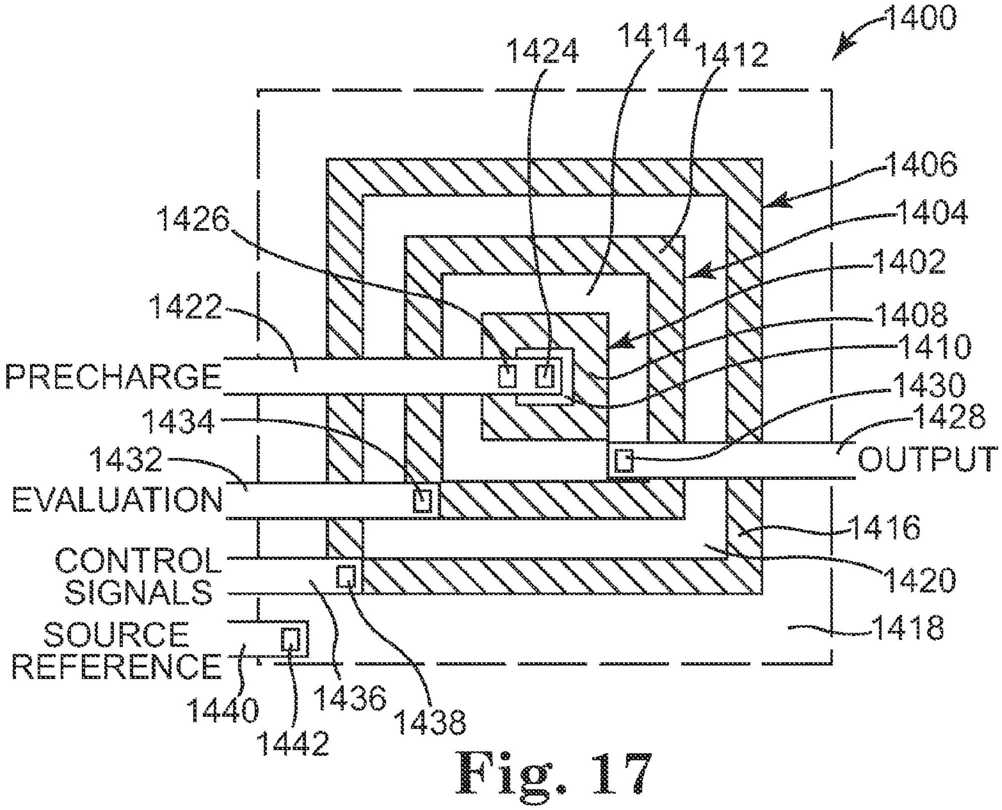
FIG. 17 is a layout diagram illustrating one embodiment of a pre-charge and evaluation cell in a portion of a die.

FIG. 17 is a layout diagram illustrating one embodiment of a pre-charge and evaluation cell 1400 in a portion of a die 40. The pre-charge and evaluation cell 1400 includes gates in loop structures. In one embodiment, the loop structures form multiple closed gate structures.

The pre-charge and evaluation cell 1400 is one embodiment of a pre-charge and evaluation circuit, such as the forward and reverse direction signal circuits 550 and 552, FIG. 10B. The forward direction signal circuit 550 includes third pre-charge transistor 554, third evaluation transistor 556 and control transistor 558. The reverse direction signal circuit 552 includes fourth pre-charge transistor 560, fourth evaluation transistor 562 and control transistor 564. The pre-charge and evaluation cell 1400 includes a pre-charge transistor 1402, an evaluation transistor 1404 and a control transistor 1406. In other embodiments, cell 1400 can be used in other integrated circuit devices, such as other MEMS devices, that use similar transistor schematic configurations.

The pre-charge transistor 1402 includes a pre-charge gate 1408 and a drain region 1410. Evaluation transistor 1404 includes an evaluation gate 1412 and the area outside pre-charge gate 1408 and within evaluation gate 1412 is source/ drain region 1414. The source/drain region 1414 is the source region of pre-charge transistor 1402 and the drain region of evaluation transistor 1404, which are electrically coupled together to form a part of pre-charge and evaluation cell 1400.

The control transistor 1406 includes a control gate 1416 and a source region 1418. The area outside evaluation gate 1412 and within control gate 1416 is source/drain region 1420. The source/drain region 1420 is the source region of evaluation transistor 1404 and the drain region of control transistor 1406, which are electrically coupled together to form a part of pre-charge and evaluation cell 1400.

The pre-charge gate 1408 isolates drain region 1410 from source/drain region 1414 and evaluation gate 1412 isolates source/drain region 1414 from source/drain region 1420. The control gate 1416 isolates pre-charge transistor 1402 and evaluation transistor 1404 from neighboring devices in die 40. In one embodiment, source region 1418 extends to neighboring closed gate structures in die 40.

The pre-charge gate 1408 of pre-charge transistor 1402 is electrically coupled to pre-charge conductor 1422 through via 1426 and drain region 1410 is electrically coupled to pre-charge conductor 1422 through via 1424. The source/drain region 1414 is electrically coupled to output signal conductor 1428 through via 1430. The pre-charge conductor 1422 receives timing pulses in pre-charge signal PRECHARGE to charge output signal conductor 1428 and output signal OUTPUT to a high voltage level.

The evaluation gate 1412 of evaluation transistor 1404 is electrically coupled to evaluation conductor 1432 through via 1434. The evaluation conductor 1432 receives timing pulses in evaluation signal EVALUATION to turn on evaluation transistor 1404. The control gate 1416 of control transistor 1406 is electrically coupled to control conductor 1436 through via 1438 and source region 1418 is electrically coupled to a source reference conductor 1440 through via 1442. The control conductor 1436 receives signals, such as control signal CSYNC, to turn on and off control transistor 1406. The source reference conductor 1440 is coupled to a source reference, such as ground.

In one embodiment, control gate 1416 isolates pre-charge transistor 1402 and evaluation transistor 1404 from neighboring closed gate structures. In one embodiment, each closed gate structure includes a source region, such as source region 1418 that is electrically coupled to the same source reference, such as ground.

In operation, pre-charge transistor 1402 receives a timing pulse in precharge signal PRECHARGE that charges output conductor 1428 to a high voltage level. Next, evaluation transistor 1404 receives a timing pulse in evaluation signal EVALUATION to turn on evaluation transistor 1404. The control gate 1416 receives a control signal and if control transistor 1406 is turned on, output conductor 1428 discharges to a low voltage level. If control transistor 1406 is turned off, output conductor 1428 remains charged to a high voltage level. After the timing pulse in evaluation signal EVALUATION, the charged/discharged state is stored on output conductor 1428.

The layout of pre-charge and evaluation cell 1400 is an area efficient layout of a circuit topology including three transistors, such as a pre-charge transistor, an evaluation transistor and a control transistor. However, the capacitance from control gate 1416 to source/drain region 1420 is large and as a result, control conductor 1436 may be inadvertently charged to a high voltage level that turns on control transistor 1406 as a timing pulse in evaluation signal EVALUATION turns on evaluation transistor 1404. This inadvertently discharges output conductor 1428 to a low voltage level. To prevent inadvertent discharging of output conductor 1428, control conductor 1436 can be coupled to an actively driven node, such as an input pin of die 40, to actively overdrive inadvertent charging of control conductor 1436. Connecting control conductor 1436 to a dynamic storage node, such as internal node line 522 (shown in FIG. 10A), can result in inadvertent charging of control conductor 1436 and discharging of output conductor 1428.

Also, output node 1428 includes a relatively low capacitance that can result in a charge sharing problem. As evaluation transistor 1404 is turned on, the charge on output conductor 1428 is shared with the node between evaluation transistor 1404 and control transistor 1406, which reduces the high voltage level on output conductor 1428 and can result in an error condition.

In one embodiment, pre-charge and evaluation cell 1400 can be used as a direction signal circuit, such as one of the forward and reverse direction signal circuits 550 and 552 (shown in FIG. 10B). The control conductor 1436 is coupled to control line 430, which provides control signal CSYNC to control conductor 1436. Control signal CSYNC is an actively driven signal that can overdrive an attempted inadvertent charging of control conductor 1436. In addition, with pre-charge and evaluation cell 1400 used as a direction signal circuit, the small capacitance on output conductor 1436 is connected to the gates of one or more direction transistors, e.g. all transistors in the shift register cells (shown in FIG. 10A). The gates of one or more direction transistors provide more than adequate capacitance to the node.

In one embodiment, pre-charge and evaluation cell 1400 is used in firing cell 120 of FIG. 6. Pre-charge transistor 1402 corresponds to pre-charge transistor 128, evaluation transistor 1404 corresponds to select transistor 130 and control transistor 1406 corresponds to data transistor 136. Each of the inputs, including pre-charge conductor 1422, evaluation conductor 1432, and control conductor 1436, receive an actively driven signal. Control conductor 1436 receives an actively driven data signal that prevents inadvertent charging of control conductor 1436. Also, gate capacitance 126 of drive switch 172 provides more than adequate capacitance to output conductor 1428.

With pre-charge and evaluation cell 1400 used in firing cell 120 of FIG. 6, the gate capacitance 126 of drive switch 172 is charged through pre-charge transistor 1402. Charging the gate capacitance 126 through pre-charge transistor 1402 can result in long charge times that affect the operating speed of die 40. An alternate layout of firing cell 120 uses pre-charge and select logic cell 1300 of FIG. 16, with pre-charge transistor 1302 made larger than pre-charge transistor 1402.

Figure 18:
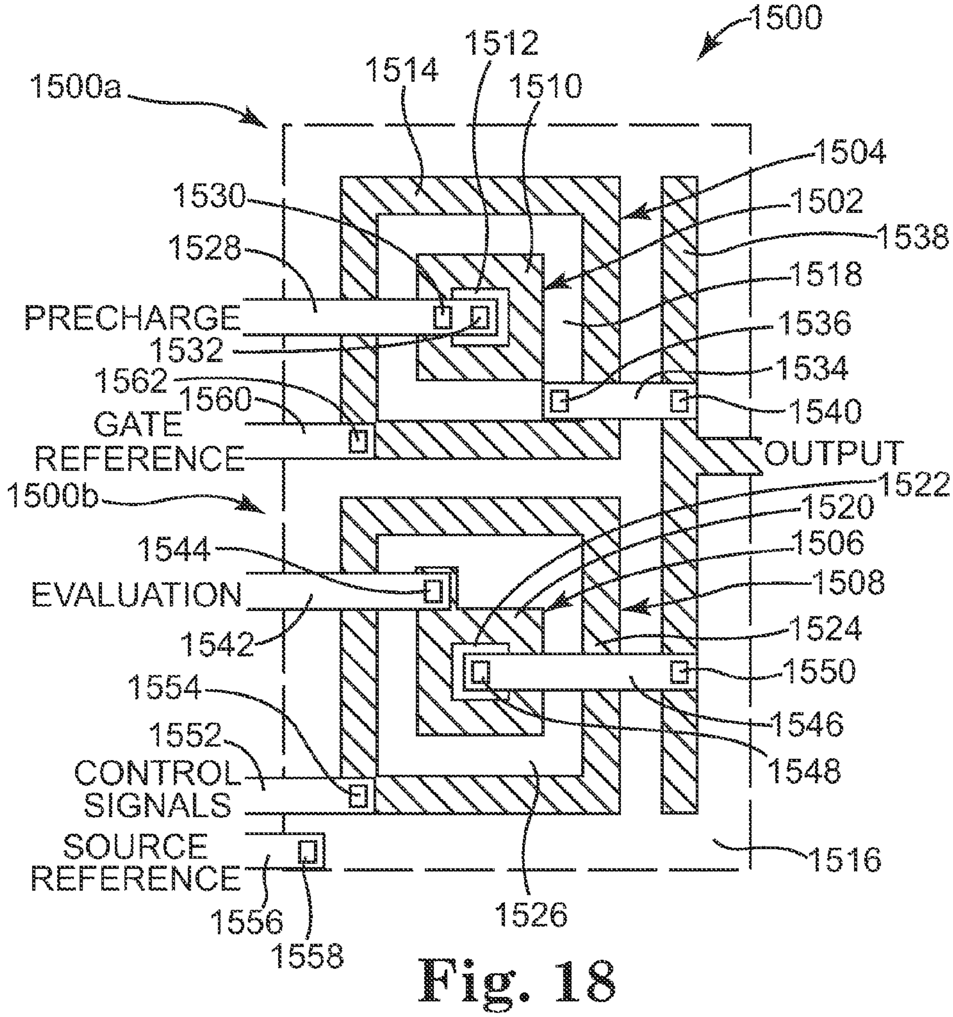
FIG. 18 is a layout diagram illustrating one embodiment of a pre-charge and evaluation cell in a portion of a die.

FIG. 18 is a layout diagram illustrating one embodiment of a pre-charge and evaluation cell 1500 in a portion of a die 40. The pre-charge and evaluation cell 1500 includes gates in loop structures. In one embodiment, the loop structures form multiple closed gate structures.

The pre-charge and evaluation cell 1500 includes closed gate structures 1500*a* and 1500*b*. The gate structure 1500*a* includes a pre-charge transistor 1502 and a guard transistor 1504. The gate structure 1500*b* includes evaluation transistor 1506 and control transistor 1508.

In this embodiment, pre-charge transistor 1502 is separated from evaluation transistor 1506 and control transistor 1508. As a result, control transistor 1508 can be smaller than control transistor 1406 and the capacitance associated with control transistor 1508 can be smaller than the capacitance associated with control transistor 1406. The smaller capacitance reduces capacitive coupling problems.

With pre-charge transistor 1502 not enclosed by evaluation transistor 1506 and control transistor 1508, a guard transistor 1504 is added to provide a source region that can be coupled to a reference, such as ground. The guard transistor 1504 isolates pre-charge transistor from ground.

In one embodiment, pre-charge and evaluation cell 1500 is a pre-charge and evaluation circuit, such as forward and reverse direction signal circuits 550 and 552 that include guard transistors 559 and 565, FIG. 10B. The forward direction signal circuit 550 includes third pre-charge transistor 554, third evaluation transistor 556, control transistor 558 and guard transistor 559. The reverse direction signal circuit 552 includes fourth pre-charge transistor 560, fourth evaluation transistor 562, control transistor 564 and guard transistor 565. Also, in one embodiment, pre-charge and evaluation cell 1500 can be the second stage 502 of shift register cell 403*a*, FIG. 10A, if second stage 502 includes a guard transistor. In other embodiments, cell 1500 can be used in other integrated circuit devices, such as other MEMS devices, that use similar transistor schematic configurations.

The pre-charge transistor 1502 includes a pre-charge gate 1510 and a drain region 1512. The guard transistor 1504 includes a guard gate 1514 and source region 1516. The area outside pre-charge gate 1510 and within guard gate 1514 is source/drain region 1518. The source/drain region 1518 is the source region of pre-charge transistor 1502 and the drain region of guard transistor 1504, which are electrically coupled together to form a part of pre-charge and evaluation cell 1500.

The evaluation transistor 1506 includes evaluation gate 1520 and a drain region 1522. The control transistor 1508 includes control gate 1524 and source region 1516. The control transistor 1508 and guard transistor 1504 share the same source region 1516. The area outside evaluation gate 1520 and within control gate 1524 is source/drain region 1526. The source/drain region 1526 is the source region of evaluation transistor 1506 and the drain region of control transistor 1508, which are electrically coupled together to form a part of pre-charge and evaluation cell 1500.

The pre-charge gate 1510 isolates drain region 1512 from source/drain region 1518 and guard gate 1514 isolates source/drain region 1518 from source region 1516 and neighboring devices in die 40. The evaluation gate 1520 isolates drain region 1522 from source/drain region 1526 and control gate 1524 isolates source/drain region 1526 from source region 1516 and neighboring devices in die 40. In one embodiment, source region 1516 extends to neighboring closed gate structures in die 40.

The pre-charge gate 1510 of pre-charge transistor 1502 is electrically coupled to pre-charge conductor 1528 through via 1530 and drain region 1512 is electrically coupled to pre-charge conductor 1528 through via 1532. The source/drain region 1518 is electrically coupled to first output conductor 1534 through via 1536 and first output conductor 1534 is electrically coupled to polysilicon output conductor 1538 through via 1540. The guard gate 1514 of guard transistor 1504 is electrically coupled to guard conductor 1560 through via 1562. The guard conductor 1560 is coupled to a gate reference, such as ground. The pre-charge conductor 1528 receives timing pulses in pre-charge signal PRECHARGE to charge output conductor 1538 to a high voltage level.

The evaluation gate 1520 of evaluation transistor 1506 is electrically coupled to evaluation conductor 1542 through via 1544 and drain region 1522 is electrically coupled to second output conductor 1546 through via 1548. The second output conductor 1546 is electrically coupled to output conductor 1538 through via 1550. The output conductor 1538 is coupled to other devices in die 40. The evaluation conductor 1542 receives timing pulses in evaluation signal EVALUATION to turn on evaluation transistor 1506.

The output conductor 1538 is made of polysilicon, which if no field oxide dielectric is formed to isolate neighboring transistors from one another, is a high capacitance interconnect material. Also, output conductor 1538 is extended beyond vias 1540 and 1550 to add capacitance to output conductor 1538. In addition, the gate to drain capacitance of guard transistor 1504 is added to the capacitance on output conductor 1538. Having the two regions, source/drain region 1518 and drain region 1522 connected to polysilicon output conductor 1538 adds capacitance to the output node. If output conductor 1538 is connected to a dynamic storage node, additional capacitance is a benefit.

The control gate 1524 of control transistor 1508 is electrically coupled to control conductor 1552 through via 1554 and source region 1516 is electrically coupled to a source reference conductor 1556 through via 1558. The control conductor 1552 receives signals, such as control signal CSYNC or shift register internal node signal SN1 (shown in FIG. 10A), to turn on and off control transistor 1508. The source reference conductor 1556 is coupled to a source reference, such as ground. In one embodiment, each closed gate structure includes a source region, such as source region 1516 that is electrically coupled to the same source reference, such as ground.

In operation, pre-charge transistor 1502 receives a timing pulse in pre-charge signal PRECHARGE that charges output conductor 1538 to a high voltage level. Next, evaluation transistor 1506 receives a timing pulse in evaluation signal EVALUATION to turn on evaluation transistor 1506. The control gate 1524 receives a control signal and if control transistor 1508 is turned on as evaluation transistor 1506 is turned on, output conductor 1538 discharges to a low voltage level. If control transistor 1406 is turned off as evaluation transistor 1506 is turned on, output conductor 1538 remains charged to a high voltage level. After the timing pulse in evaluation signal EVALUATION, the charged/discharged state is stored on output conductor 1538.

The capacitance from control gate 1524 to source/drain region 1526 is reduced as compared to the capacitance from control gate 1416 to source/drain region 1420. As a result, control conductor 1552 is not pulled to a high voltage level that inadvertently turns on control transistor 1508 as a timing pulse in evaluation signal EVALUATION turns on evaluation transistor 1506. Also, control transistor 1508 can be smaller than control transistor 1406 and evaluate transistor 1506 can be smaller than evaluate transistor 1404. As a result, the charge shared between output conductor 1538 and control transistor 1508 is less and output conductor 1538 maintains a suitable high voltage level. In addition, the capacitance of guard transistor 1504 is added to the capacitance of output conductor 1538, which adds stability to the voltage level on output conductor 1538.

To reduce the capacitance at some nodes, the connection to the transistor can be switched, such that the region inside the gate can be connected to provide a smaller capacitance and the region outside the gate can be connected to a node that can tolerate a larger capacitance, such as a node that receives an actively driven input signal.

Figure 19:
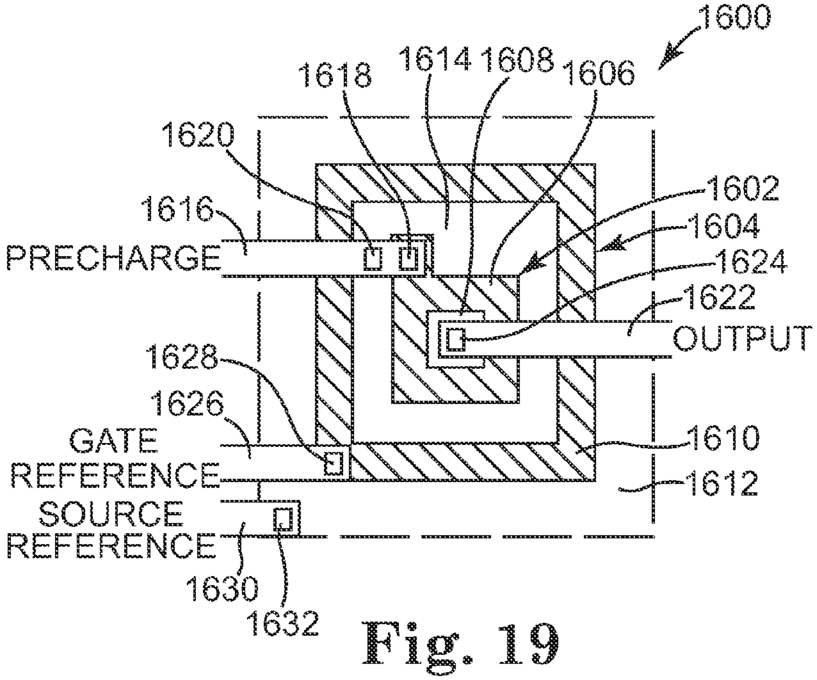
FIG. 19 is a layout diagram illustrating one embodiment of a pre-charge cell in a portion of a die.

FIG. 19 is a layout diagram illustrating one embodiment of a pre-charge cell 1600 in a portion of a die 40. The pre-charge cell 1600 includes gates in loop structures. In one embodiment, the loop structures form multiple closed gate structures.

The pre-charge cell 1600 includes a pre-charge transistor 1602 and a guard transistor 1604. The connections to pre-charge transistor 1602 are configured to reduce the capacitance provided at the output of pre-charge transistor 1602. In one embodiment, pre-charge cell 1600 can be used in place of gate structure 1500*a* that includes pre-charge transistor 1502 and guard transistor 1504. The technique of configuring transistor connections to advantageously position capacitance can be used in places other than a pre-charge transistor.

In one embodiment, pre-charge cell 1600 can be expanded to have multiple pre-charge transistors disposed inside the gate of one guard transistor, which results in a more area efficient layout. In one embodiment, one signal can pre-charge multiple lines, such as timing signal T3 (shown in FIG. 9) charging address lines 472. In other embodiments, cell 1600 can be used in other integrated circuit devices, such as other MEMS devices, that use similar transistor schematic configurations.

The pre-charge transistor 1602 includes a pre-charge gate 1606 and a source region 1608. The guard transistor 1604 includes guard gate 1610 and source region 1612. The area outside pre-charge gate 1606 and within guard gate 1610 is drain region 1614. The drain region 1614 is the drain region of pre-charge transistor 1602 and the drain region of guard transistor 1604, which are electrically coupled together to form a part of pre-charge cell 1600.

The pre-charge gate 1606 isolates source region 1608 from drain region 1614 and guard gate 1610 isolates drain region 1614 from source region 1612 and neighboring devices in die 40. In one embodiment, source region 1612 extends to neighboring closed gate structures in die 40.

The pre-charge gate 1606 of pre-charge transistor 1602 is electrically coupled to pre-charge conductor 1616 through via 1618 and drain region 1614 is electrically coupled to pre-charge conductor 1616 through via 1620. The source region 1608 is electrically coupled to output conductor 1622 through via 1624. The output conductor 1622 is provided for coupling to other devices in die 40. The pre-charge conductor 1616 receives timing pulses in pre-charge signal PRECHARGE to charge output conductor 1622 to a high voltage level.

The guard gate 1610 of guard transistor 1604 is electrically coupled to guard conductor 1626 through via 1628. The guard conductor 1626 is coupled to a gate reference, such as ground. The source region 1612 is electrically coupled to a source reference conductor 1630 through via 1632. The source reference conductor 1630 is coupled to a source reference, such as ground. In one embodiment, each closed gate structure includes a source region, such as source region 1612 that is electrically coupled to the same source reference, such as ground.

The pre-charge transistor 1602 is connected to reduce capacitance on output conductor 1622. The capacitance from source region 1608 at output conductor 1622 is less than the capacitance of drain region 1614. The larger capacitance from pre-charge gate 1606 and drain region 1614 is charged directly by pre-charge signal PRECHARGE.

It should be noted that while FIGS. 15-19 depict an embodiment where the gate and drain of transistors are coupled together, other configurations where the gate and drain are coupled to different drive signals may be utilized.

The transistor layouts described herein can be used in other integrated circuit devices, such as other MEMS devices. Such MEMS devices include, for example, a micro-mirror array or a diffraction grating. In such structures, the drive switch, e.g. drive switch 72 or 172, could be coupled to a mechanical structure, a micro mirror, a piezoelectric element, a diffraction grating, a deformable element that is coupled to a micro mirror or the like.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:

a substrate having a first active region, a second active region, a third active region and a fourth active region;

a first gate configured in a first loop structure around the first active region;

a second gate configured in a second loop structure around the second active region;

a third gate configured in a third loop structure around the third active region, wherein the second active region is electrically coupled to the third active region; and a fourth gate configured in a fourth loop structure around the fourth active region, wherein the first gate is disposed around the second gate and the third gate is disposed around the fourth gate.

2. The device of claim 1, wherein the substrate has a fifth active region that is around the first gate and the third gate.

3. A device comprising:

a substrate having a first active region, a second active region, and a third active region;

a first transistor having a first gate configured in a first loop structure around the first active region;

a second transistor having a second gate configured in a second loop structure around the second active region;

a third transistor having a third gate configured in a third loop structure around the third active region; and a fourth transistor having a fourth gate configured in a fourth loop structure, wherein the second active region is electrically coupled to the third active region, the first gate is disposed around the second gate, and the third gate is disposed around the fourth gate.

4. The device of claim 3, wherein the substrate has a fourth active region and the fourth gate is configured in the fourth loop structure around the fourth active region.

5. A device comprising:

a substrate having a first active region, a second active region, and a third active region;

a first transistor having a first gate configured in a first loop structure around the first active region;

a second transistor having a second gate configured in a second loop structure around the second active region;

a third transistor having a third gate configured in a third loop structure around the third active region; and a fourth transistor having a fourth gate configured in a fourth loop structure, wherein the first transistor is disposed within the second gate and the third transistor is disposed within the fourth gate, and the second active region is electrically coupled to the third active region.

6. The device of claim 5, wherein the substrate has a fourth active region and the second transistor and the fourth transistor share the fourth active region.

7. The device of claim 5, wherein the substrate has a fourth active region and the fourth gate is configured in the fourth loop structure around the fourth active region.

* * * * *